(12) United States Patent
Elhajj et al.

(10) Patent No.: US 10,976,147 B2
(45) Date of Patent: Apr. 13, 2021

(54) THICKNESS MEASUREMENT DEVICE AND METHODS OF USE

(71) Applicant: American University of Beirut, Beirut (LB)

(72) Inventors: Imad H. Elhajj, Maten (LB); Daniel Asmar, Beirut (LB); Mahdi Saleh, Beirut (LB); Ghassan Oueidat, Beirut (LB)

(73) Assignee: American University of Beirut, Beirut (LB)

( * ) Notice: Subject to any disclaimer, the term of this patent is extended or adjusted under 35 U.S.C. 154(b) by 165 days.

(21) Appl. No.: 16/243,584

(22) Filed: Jan. 9, 2019

(65) Prior Publication Data

US 2019/0242689 A1    Aug. 8, 2019

Related U.S. Application Data

(60) Provisional application No. 62/625,736, filed on Feb. 2, 2018.

(51) Int. Cl.
| | |
|---|---|
| *G01B 7/06* | (2006.01) |
| *G01R 27/26* | (2006.01) |
| *G01D 5/24* | (2006.01) |
| *G06F 3/044* | (2006.01) |

(52) U.S. Cl.
CPC .............. *G01B 7/08* (2013.01); *G01B 7/085* (2013.01); *G01R 27/2605* (2013.01); *G01D 5/2405* (2013.01); *G06F 3/0445* (2019.05)

(58) Field of Classification Search
CPC ... G01B 7/00; G01B 7/02; G01B 7/06; G01B 7/08; G01B 7/082; G01B 7/085; G01R 27/00; G01R 27/02; G01R 27/26; G01R 27/2605; G01R 27/2617; G06F 3/00; G06F 3/044; G06F 3/0445; G01D 5/00; G01D 5/12; G01D 5/14; G01D 5/24; G01D 5/2405
USPC ....... 324/600, 649, 658, 663, 664, 665, 671, 324/519; 702/1, 33, 45, 47, 50, 52; 345/156, 173, 174
See application file for complete search history.

(56) References Cited

U.S. PATENT DOCUMENTS

| | | | |
|---|---|---|---|
| 3,279,249 A | 10/1966 | Tocanne | 73/152.31 |
| 4,209,740 A | 6/1980 | Marthe et al. | 324/663 |
| 5,613,399 A | 3/1997 | Hannan et al. | 73/304 |
| 6,101,873 A | 8/2000 | Kawakatsu et al. | 73/304 |
| 6,269,694 B2 | 8/2001 | Morimoto | 73/305 |
| 8,973,436 B2 | 3/2015 | Jacobson et al. | 73/304 C |
| 9,689,843 B2 * | 6/2017 | Kinoshita | G01N 29/222 |
| 2005/0127908 A1 | 6/2005 | Schlicker et al. | 324/240 |

(Continued)

FOREIGN PATENT DOCUMENTS

EP    0149279    8/1989    ............ G01F 23/24

OTHER PUBLICATIONS

PCT International Search Report and Written Opinion issued in corresponding foreign application PCT/US2019/015994, pp. 1-8 (dated May 30, 2019).

(Continued)

*Primary Examiner* — Hoai-An D. Nguyen
(74) *Attorney, Agent, or Firm* — J. Peter Paredes; Amin Talati Wasserman LLP

(57) ABSTRACT

Provided herein are systems, methods and apparatuses for a thickness measurement device based on a capacitive array.

6 Claims, 34 Drawing Sheets

(56) References Cited

U.S. PATENT DOCUMENTS

| | | | |
|---|---|---|---|
| 2011/0284087 A1 | 11/2011 | Vodyanoy et al. | 137/1 |
| 2017/0191237 A1 | 7/2017 | Fishmann Torres | E02B 15/04 |
| 2019/0195819 A1* | 6/2019 | Libsch | G01N 33/5438 |

OTHER PUBLICATIONS

"Ultratech | Ultra-Ever Dry | Ultratech International". Spillcontainment. com. N.p., 2017. Web. Mar. 29, 2017.

Abdul-Wahab, SA "In Situ Device for Detection of Oil Spill in Seawater," Electroanalysis, vol. 18, No. 21, p. 2148-2152, Sep. 2006.

Aerial Observation of Marine Oil Spills, ITOPF, London, U.K., 2011.

Aguilera, F. et al., "Review on the effects of exposure to spilled oils on human health," J. Appl. Toxicol., vol. 30, No. 4, pp. 291-301, 2010.

Almhdi, KM "Oil Classification with Fluorescence Spectroscopy," M.E. thesis, University of Oldenburg, Germany, 2005.

Almhdi, KM et al., Classification with Artificial Neural Networks and Support Vector Machines: Application to Oil Fluorescence Spectra, EARSel eProceedings, pp. 115-129 (Feb. 2007).

Al-Naamany, AM, et al., "Design and implementation of a new nonradioactive-based machine for detecting oil-water interfaces in oil tanks," IEEE Trans. Instrum. Meas., vol. 56, No. 5, pp. 1532-1536, Oct. 2007.

Arjay Engineering Ltd. Technical Staff, Model 2214-HCF Dual Channel Hydrocarbon Float Level Transmitter, 2008.

Bera, SC, et al., "A low-cost noncontact capacitance-type level transducer for a conducting liquid," IEEE Trans. Instrum. Meas., vol. 55, No. 3, pp. 778-786, 2006.

Beyer, J. et al., "Environmental effects of the Deepwater Horizon oil spill: A review," Mar. Pollut. Bull., vol. 110, No. 1, pp. 28-51, 2016.

Blakeley, CP et al., "Oil in or on Water" Instrument Engineers' Handbook: Process Measurement and Analysis, Fourth Edition, vol. 1, pp. 1486-1492 (2003).

Brown, CE "Airborne Laser Sensors for Oil Spill Remote Sensing," Canadian Chemical News, vol. 49, No. 8, pp. 22-23, 1997.

Bukhari, SFA, et al., "A hybrid control strategy for oil separators based on electrical capacitance tomography images," Meas. Control, vol. 40, No. 7, pp. 211-217, 2007.

Bukhari, SFA, et al., "Multi-interface level sensors and new development in monitoring and control of oil separators," Sensors, vol. 6, No. 4, pp. 380-389, 2006.

Byfield, V. et al. "Thickness Estimates and Classification of Surface Oil Using Passive Sensing at Visible and Near-Infrared Wavelengths," in Pro. of the Geoscience and Remote Sensing Symposium, 1999, pp. 1475-1477.

Calla, OPN, et al. "Estimation of emissivity and scattering coefficient of low saline water contaminated by diesel in Cj band (5.3 GHz) and Ku band (13.4 GHz)," Indian J. Radio Sp. Phys., vol. 40, No. 5, pp. 267-274, 2011.

Calla, OPN, et al., "Oil spill detection using multi frequency microwave sensor onboard satellite; SSM/I and AMSRE," in Proc. IGARSS, Jul. 2013, pp. 3710-3713.

Carey, AA, "The dielectric constant of lubrication oils," Computational Systems Incorprated, Tech. Rep., 1998.

Chaplin, M. "Water Structure and Science," Isbu.ac.uk, Feb. 19, 2008.

Denkilkian, H et al., "Wireless Sensor for Continuous Real-Time Oil Spill Thickness and Location Measurement," IEEE Transactions on Instrumentation and Measurement, vol. 58, No. 12, pp. 4001-4011, Dec. 2009.

Desmi, "Skimmers/TERMITE", [Online]. Available: http://www.desmi.com/skimmers/termite.aspx. [Accessed: Jan. 2018].

Electronics Katranji Trading (EKT), "412 Arduino NANO 3.0 328 CH340," [Online]. Available: http://www.ekt2.com/products/productdetails/412_ARDUINO_NANO_3.0_328_CH340. [Accessed: Feb. 2017].

Electronics Katranji Trading (EKT), "412 CH GPS SKM53 Module," [Online]. Available: http://www.ekt2.com/products/productdetails/412_CH_GPS_SKM53_MODULE. [Accessed: Feb. 2017].

Electronics Katranji Trading (EKT), "8 D37 FEM PCB," [Online]. Available: http://ekt2.com/products/productdetails/8_D37_FEM_PCB. [Accessed: Feb. 2017].

Electronics Katranji Trading (EKT), "8 D37 MALE PCB," [Online]. Available: http://ekt2.com/products/productdetails/8_D37_MALE_PCB. [Accessed: Feb. 2017].

Federici, C., et al., "Oil Properties and Their Impact on Spill Response Options Literature Review," CNA Anal. Solut., No. 1, pp. 1-92, 2014.

Fingas M. F. et al., "Review of Oil Spill Remote Sensing," Presented at Spillcon, Darwin, Australia, Aug. 16, 2000.

Freescale Semiconductor, "Proximity Capacitive Touch Sensor Controller MPR121," Technical Data Sheet, 2013.

Gershenzon, ON, et al. "Integral Solution for Oil Spill Detection using SAR Data," in Pro. of the 3rd Int. Conf. on Recent Advances in Space Technologies, Jun. 14-16, 2007.

Girard-Ardhuin, F. et al., "Oil slick detection by SAR imagery: Potential and Limitation," in Pro. of OCEANS, 2003, pp. 164-169.

Gong, CA, et al., "Low-cost comb-electrode capacitive sensing device for liquid-level measurement," IEEE Sensors Journal, vol. 16, No. 9, pp. 2896-2897, May 2016.

Gonzalez-Tinoco, JE, et al., "Specialized optical fibre sensor array for structural damage detection," 2016 10th Int. Symp. Commun. Syst. Networks Digit. Signal Process. CSNDSP 2016, pp. 8-11, 2016.

Greenpeace International, "Oil spills—Philippines, Indian Ocean and Lebanon," greenpeace.org, Aug. 18, 2006.

Cai, G., et al., "Oil spill detection from thermal anomaly using ASTER data in Yinggehai of Hainan, China," in Pro. of the Geoscience and Remote Sensing Symposium, Jul. 23-28, 2007, pp. 898-900.

Canbolat, H. "A novel level measurement technique using three capacitive sensors for liquids," IEEE Trans. Instrum. Meas., vol. 58, No. 10, pp. 3762-3768, 2009.

Hartigan, et al., "Algorithm AS 136: A K-Means Clustering Algorithm." Journal of the Royal Statistical Society. Series C (Applied Statistics) 28, No. 1 (1979): 100-08. doi:10.2307/2346830.

Hjertaker, BT, et al., "Recent developments in hydrocarbon separator interface imaging," Proc. SPIE, vol. 4188, pp. 81-92, Feb. 2001.

http://www.ekt2.com/products/productdetails/412_ARDUINO_WIRELESS_TRANSCEIVER_2.4Ghz. [Accessed: Feb. 2017].

Huang, Y., et al., "Optimization of the coplanar interdigital capacitive sensor," AIP Conference Proceedings, vol. 1806, No. 1, p. 110017, 2017.

Itopf, "Aerial Observation of Marine Oil Spills," No. 1, p. 12, 2011.

Jaworski, AJ et al., "Measurements of oil-water separation dynamics in primary separation systems using distributed capacitance," Flow Measurement and Instrumentation, 16(2-3): pp. 113-127, 2005.

John, S. "The decisive moment," Int. J. Appl. Psychoanalytic Stud., vol. 9, No. 4, pp. 372-375, 2012.

Karathanassi, V. "Spectral unmixing evaluation for oil spill characterization," Int. J. Remote Sens. Appl., vol. 4, pp. 1-6, Mar. 2014.

Kumar, B., et al., "A Review on Capacitive-Type Sensor for Measurement of Height of Liquid Level," Meas. Control, vol. 47, No. 7, pp. 219-224, 2014.

Luo, CE, "A low power self-capacitive touch sensing analog front end with sparse multi-touch detection," in 2014 IEEE International Conference on Acoustics, Speech and Signal Processing (ICASSP), May 2014, pp. 3007-3011.

Massaro, A., et al., "Optical performance evaluation of oil spill detection methods: Thickness and extent," IEEE Trans. Instrum. Meas., vol. 61, No. 12, pp. 3332-3339, Dec. 2012.

Meng, GT et al., "A multi-electrode capacitance probe for phase detection in oil-water separation processes: design, modelling and validation," Measurement Science and Technology, 17(4): pp. 881-894, 2006.

(56) References Cited

OTHER PUBLICATIONS

Meribout, M. et al., "Interface layers detection in oil field tanks: A critical review," Expert Systems for Human, Materials and Automation. London, U.K.: InTechOpen, 2011, pp. 181-208.

Mikroelektronika, "Light to Frequency Additional Board—User Manual," 2017.

MPR121, Proximity Capacitive Touch Sensor Controller—Data Sheet, document MPR121 Rev. 4, NXP, Eindhoven, The Netherlands, Feb. 2013.

Nano Protech, "Super Electrical Insulation Nano Protech," [Online]. Available: http://mpisuppliers.com/shop/super-insulation-nanoprotech.html [Accessed: Feb. 2017].

Nunziata F. et al., "Oil spill monitoring and damage assessment via PoISAR measurements," Aquatic Procedia, vol. 3, pp. 95-102, Mar. 2015.

Ohtani, K. et al., "Shape Recognition and Position Measurement of an Object Using an Ultrasonic Sensor Array", Sensor Array, Wuqiang Yang, IntechOpen, DOI: 10.5772/36115. May 23, 2012.

Oil Spill Response Research & Renewable Energy Test Facility (OHMSETT). Accessed: Jan. 2018. [Online]. Available: https://www.ohmsett.com/.

Panova, PV "The Airborne Remote Systems for Offshore Oil Seepage Detection," in Pro. of the Scientific Conf. "Space, Ecology, Safety" with Int. Participation, Jun. 10-13, 2005, Varna, Bulgaria.

Qurthobi, A., et al., "Design of capacitive sensor for water level measurement," Journal of Physics: Conference Series, vol. 776, No. 1, p. 012118, 2016.

Casanella, R., et al., "Continuous liquid level measurement using a linear electrode array," Measurement Science and Technology, 18(7): 1859, 2007.

Reddyhoff, T. et al., "The Phase Shift of an Ultrasonic Pulse at an Oil Layer and Determination of Film Thickness," J. of Eng. Tribology, vol. 219, No. 6, pp. 387-400, 2005.

RLX Components s.r.o. Electronic Components Distributor, "Light to Frequency Board (MIKROELEKTRONIKA)," [Online]. Available: http://rlx.sk/en/measurement-boards/448-light-to frequency-board-mikroelektronika.html. [Accessed: Feb. 2017].

Saleh, M., et al. "In situ measurement of oil slick thickness," IEEE Transactions on Instrumentation and Measurement, No. 99, pp. 1-13, 2018.

Salem, F, et al. "Hyperspectral Image Analysis for Oil Spill Detection," in Pro. of the 3rd Int. Symposium on Remote Sensing of Urban Areas, Jun. 11-13, 2002, Istanbul, Turkey.

Shi, TM, et al., "Capacitance-based instrumentation for multi-interface level measurement," Measurement Science and Technology, vol. 2, No. 10, p. 923, 1991.

SparkFun Electronics, "SparkFun Capacitive Touch Sensor Breakout—MPR121," [Online]. Available: https://www.sparkfun.com/products/retired/9695. [Accessed: Feb. 2017].

Svejkovsky J. et al., "Real-time Detection of Oil Slick Thickness Patterns with a Portable Multispectral Sensor," U.S. Department of the Interior Minerals Management Service, Jul. 31, 2006.

Texas Advanced Optoelectronic Solutions Inc., "TSL230R-LF, TSL230AR-LF, TSL230BR-LF Programmable Light-to-frequency Converters," TAOS079A, Oct. 2006.

Toth, FN, et al., "A planar capacitive precision gauge for liquid-level and leakage detection," IEEE Trans. Instrum. Meas., vol. 46, No. 2, pp. 644-646, 1997.

Yang, W., "Sensors and instrumentation for monitoring and control of multi-phase separation," Meas. Control, vol. 39, No. 6, pp. 178-184, 2006.

Yang, WQ et al., "A multi-interface level measurement system using a segmented capacitance sensor for oil separators," Meas. Sci. Technol., vol. 5, No. 9, pp. 1177-1180, 1994.

Ye, Y., et al., "A novel method for proximity detection of moving targets using a large-scale planar capacitive sensor system," Sensors, vol. 16, No. 5, 2016.

Yeh, T. et al. , "A Low Cost LED Based Spectrometer," Journal of the Chinese Chemical Society, 2006, 53, 1067-1072, 2006.

Otremba, Z. "Oil droplets as light absorbents in seawater", Optics Express, vol. 15, No. 14, pp. 8592-8597, Jul. 2007.

\* cited by examiner

Table I: Relative Differences of sensor electrodes

| | E1 | E2 | E3 | E4 | E5 | E6 | E7 | E8 | E9 | E10 | E11 | E12 | E13 | E14 | E15 | E16 | E17 | E18 | E19 | E20 |
|---|---|---|---|---|---|---|---|---|---|---|---|---|---|---|---|---|---|---|---|---|
| RD | 0.34 | 0.51 | 0.63 | 0.56 | 2.90 | 5.71 | 6.39 | 6.28 | 6.47 | 6.54 | 8.98 | 95.87 | 95.33 | 95.70 | 95.42 | 95.51 | 96.10 | 95.63 | 95.48 | 95.56 |
| Ratio | 1.45 | 1.23 | 0.90 | 5.11 | 1.96 | 1.11 | 0.98 | 1.02 | 1.01 | 1.37 | 10.44 | 1.01 | 1.00 | 0.99 | 1.00 | 1.00 | 0.99 | 0.99 | 1.00 | |

FIG. 2F  Relative Differences from Calibration

FIG. 2G  Ratios between Electrodes

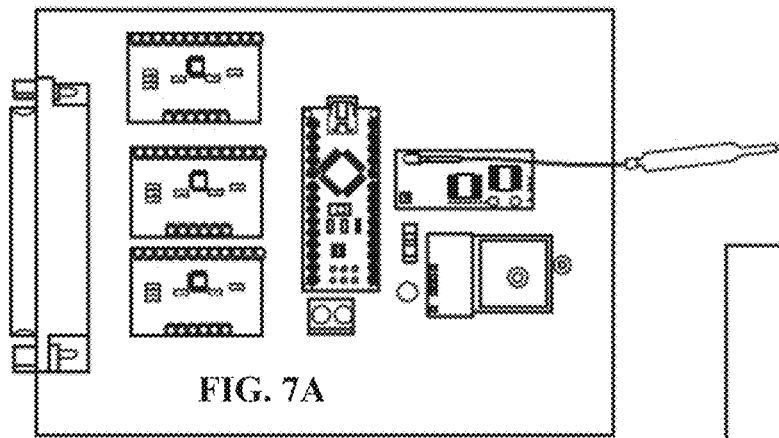
FIG. 7A
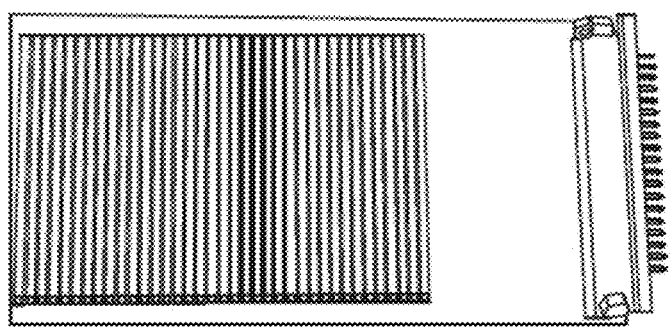
FIG. 7B
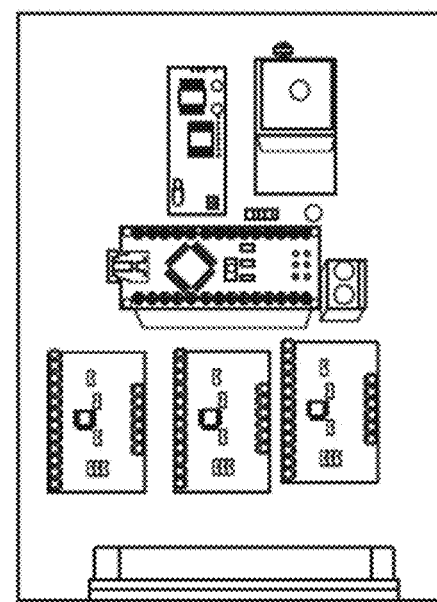
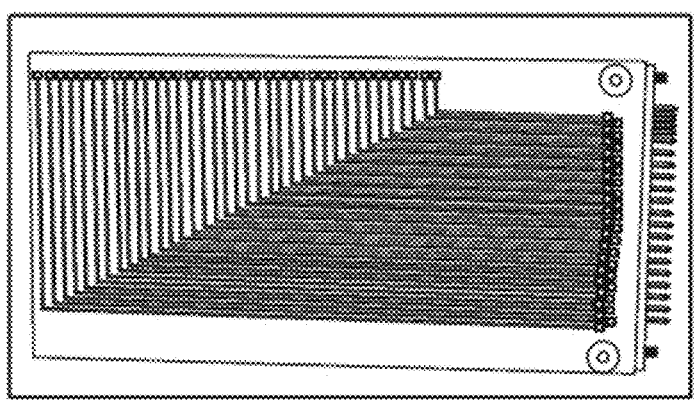
FIG. 7C
FIG. 7D

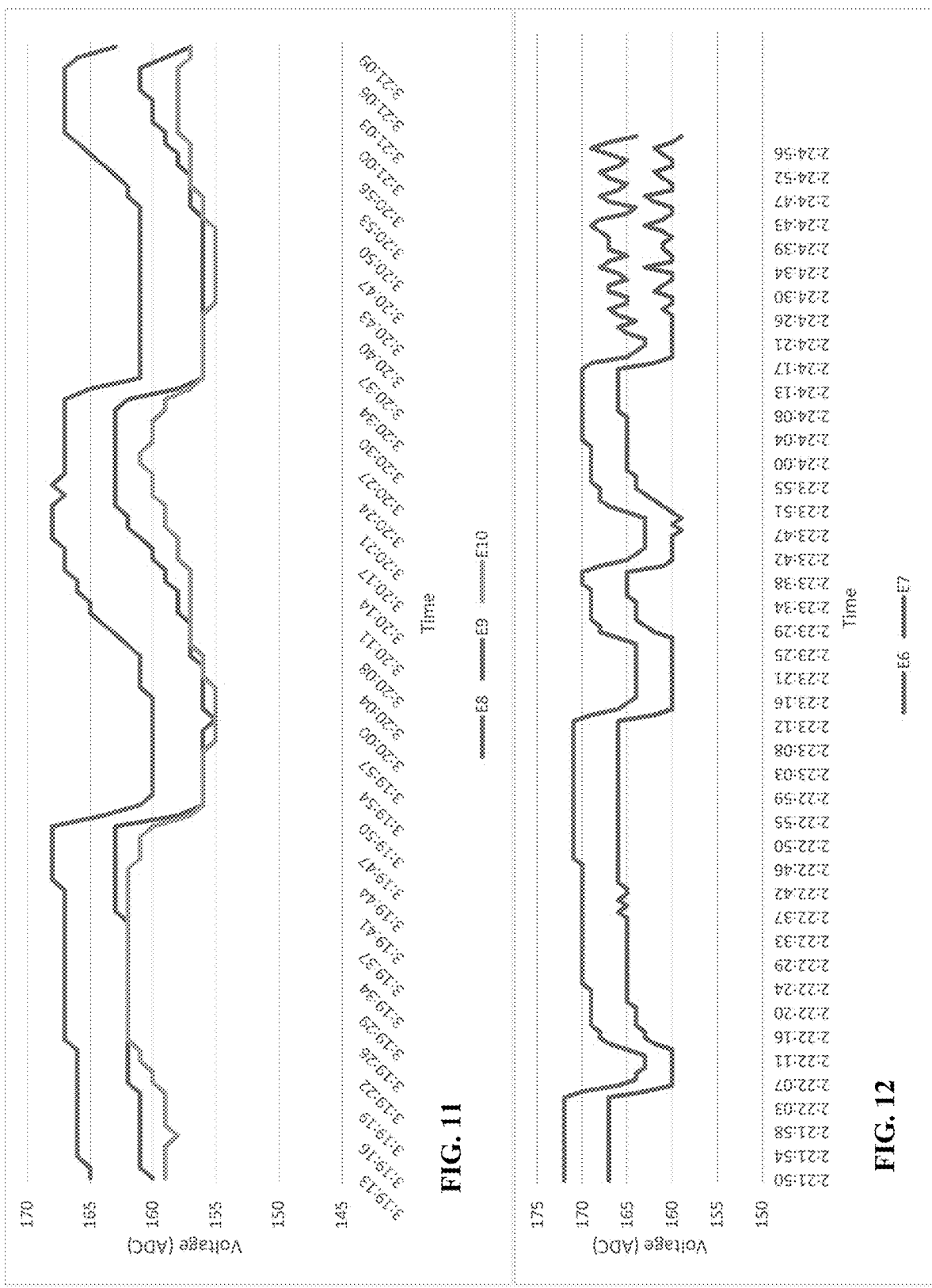

Table XV [: Interfaces detection algorithm – numerical experimental results

| E1 | E2 | E3 | E4 | E5 | E6 | E7 | E8 | E9 | E10 | E11 | E12 | E13 | E14 | E15 | E16 | E17 | E18 | E19 | E20 |
|---|---|---|---|---|---|---|---|---|---|---|---|---|---|---|---|---|---|---|---|
| 1 | 0 | 1 | 0 | 1 | 3 | 6 | 7 | 7 | 51 | 121 | 136 | 126 | 127 | 133 | 136 | 145 | 146 | 147 | 150 |
| 1 | 0 | 1 | 0 | 1 | 3 | 6 | 7 | 7 | 50 | 119 | 136 | 126 | 127 | 133 | 136 | 145 | 146 | 147 | 150 |
| 0 | 0 | 1 | 0 | 1 | 3 | 6 | 7 | 7 | 50 | 121 | 134 | 126 | 127 | 133 | 136 | 145 | 146 | 147 | 150 |
| 0 | 0 | 0 | 0 | 1 | 3 | 6 | 7 | 7 | 50 | 121 | 134 | 126 | 127 | 135 | 136 | 145 | 144 | 147 | 150 |
| 0 | 1 | 1 | 0 | 1 | 3 | 6 | 7 | 7 | 51 | 119 | 136 | 126 | 127 | 133 | 136 | 145 | 146 | 147 | 150 |
| 0 | 0 | 1 | 0 | 1 | 3 | 6 | 7 | 7 | 50 | 121 | 136 | 126 | 127 | 133 | 136 | 145 | 144 | 144 | 150 |
| 1 | 0 | 1 | 0 | 1 | 3 | 6 | 7 | 7 | 51 | 121 | 136 | 126 | 127 | 133 | 136 | 145 | 144 | 147 | 150 |
| 0 | 0 | 1 | 0 | 1 | 3 | 6 | 7 | 7 | 51 | 121 | 136 | 126 | 127 | 133 | 136 | 145 | 146 | 147 | 150 |
| 1 | 0 | 1 | 0 | 1 | 3 | 6 | 7 | 7 | 51 | 121 | 136 | 126 | 127 | 133 | 136 | 145 | 144 | 147 | 147 |
| 0 | 0 | 1 | 0 | 1 | 3 | 6 | 7 | 7 | 51 | 119 | 136 | 129 | 129 | 133 | 136 | 145 | 144 | 147 | 150 |
| 1 | 0 | 1 | 0 | 1 | 3 | 6 | 7 | 7 | 51 | 121 | 136 | 126 | 129 | 133 | 136 | 145 | 146 | 147 | 150 |
| 0 | 0 | 1 | 0 | 1 | 3 | 6 | 7 | 7 | 51 | 121 | 136 | 126 | 129 | 135 | 136 | 145 | 144 | 147 | 150 |
| 0 | 0 | 1 | 0 | 1 | 3 | 5 | 7 | 7 | 51 | 121 | 136 | 126 | 127 | 133 | 136 | 145 | 146 | 147 | 150 |
| 1 | 1 | 0 | 0 | 1 | 3 | 6 | 7 | 7 | 51 | 121 | 136 | 125 | 127 | 133 | 136 | 145 | 144 | 147 | 150 |
| 1 | 0 | 0 | 0 | 1 | 3 | 6 | 7 | 7 | 51 | 121 | 136 | 126 | 129 | 133 | 136 | 145 | 144 | 147 | 150 |
| 1 | 1 | 1 | 1 | 1 | 3 | 6 | 7 | 7 | 51 | 121 | 136 | 126 | 127 | 133 | 136 | 145 | 145 | 147 | 150 |
| 1 | 1 | 1 | 1 | 1 | 3 | 6 | 7 | 7 | 51 | 0.89 | 1.079 | 0.992 | 0.955 | 0.978 | 0.938 | 1 | 0.986 | 0.98 | 1 |
| 1 | 1 | 1 | 1 | 0.333 | 0.5 | 0.857 | 1 | 0.137 | 0.421 |  |  |  |  |  |  |  |  |  |  |

FIG. 15

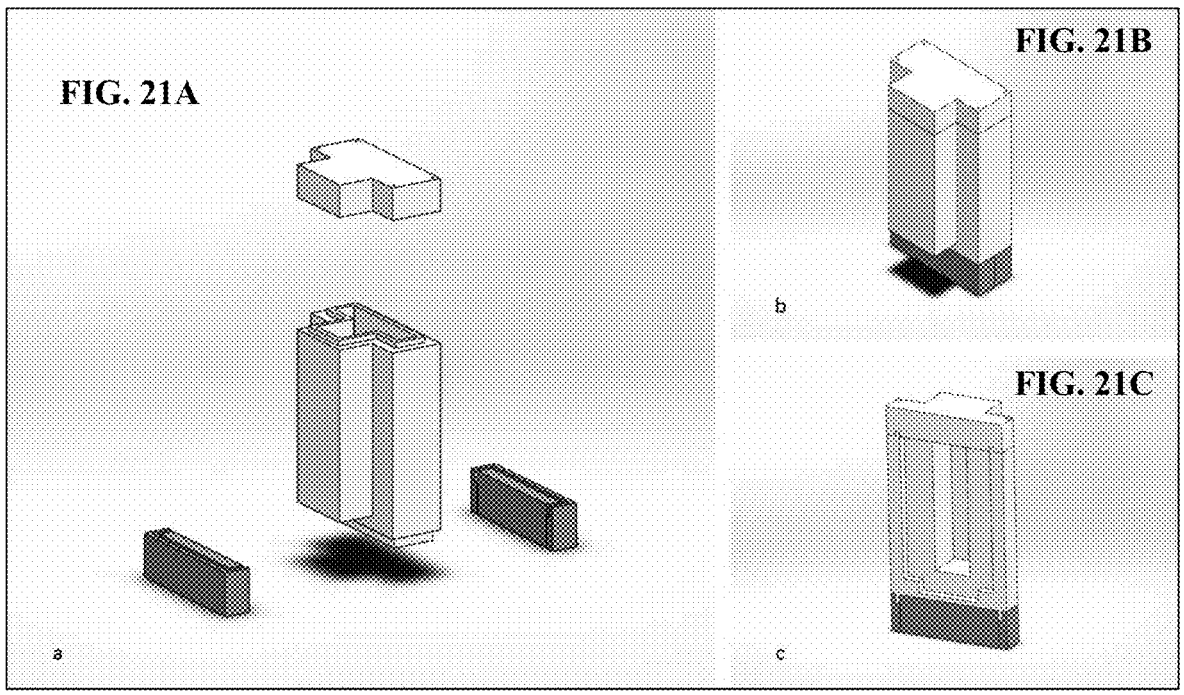
FIG. 21A
FIG. 21B
FIG. 21C
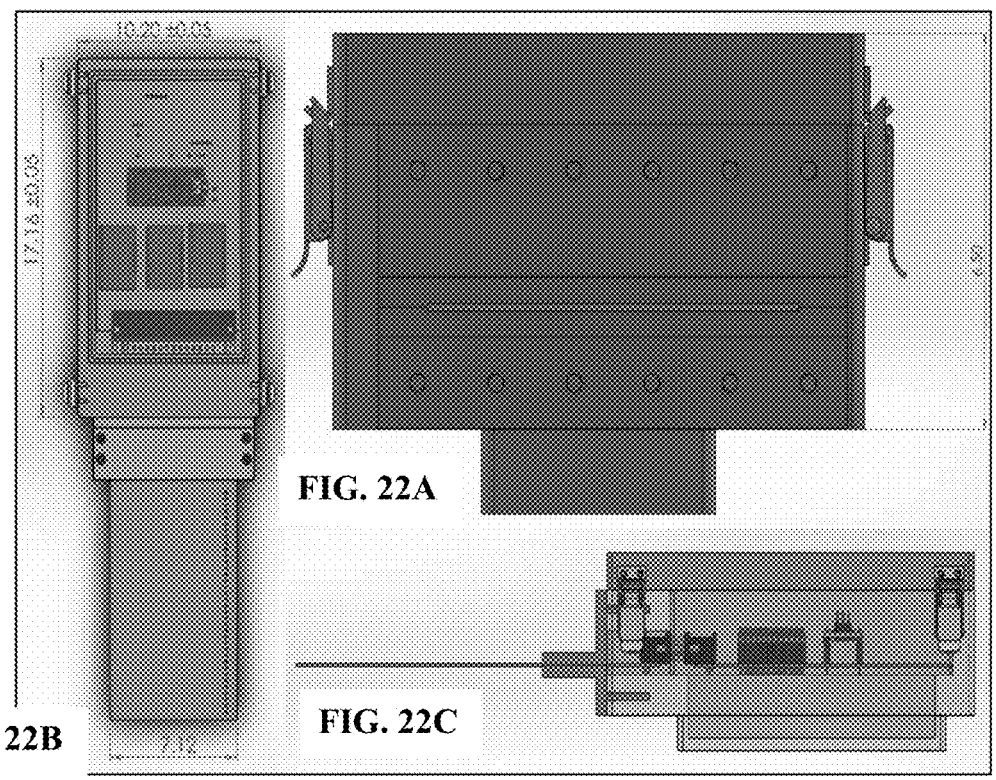
FIG. 22A
FIG. 22B
FIG. 22C

FIG. 26
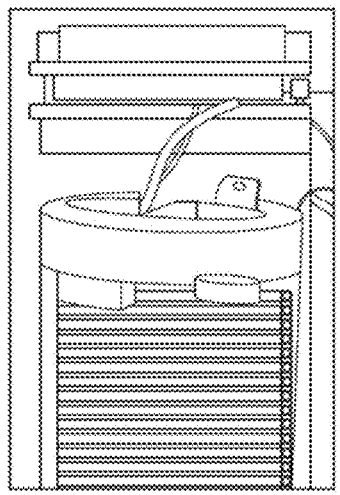
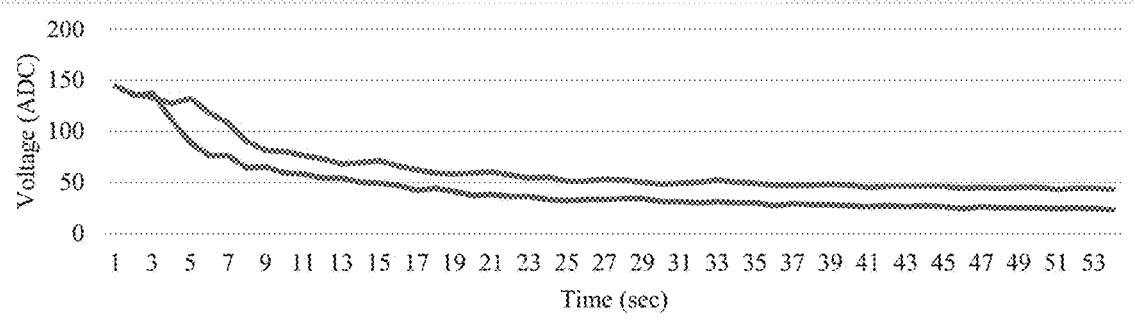
FIG. 27 —— E1-Without Vibrator —— E1-Vibrator
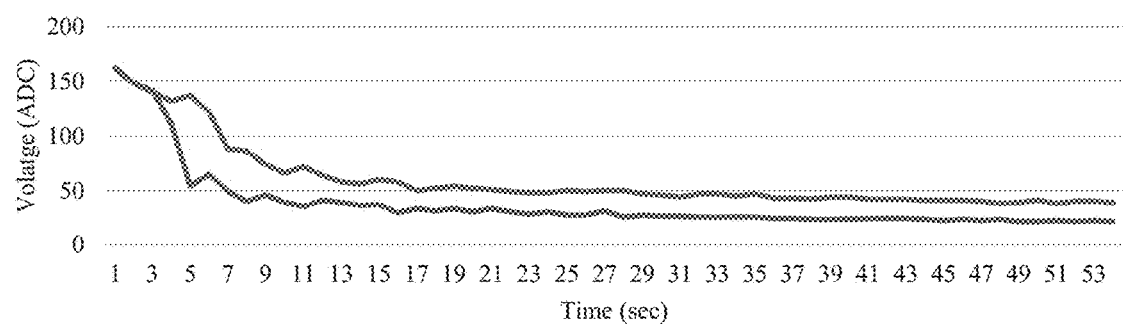
FIG. 28 —— E2- Without Vibrator —— E2-Vibrator

| Implemented Prototypes | Capacitance (pF) | | | |
|---|---|---|---|---|
| | Air | Oil | A.D.(measured) | A.D.(simulation) |
| Parallel | 4.8 | 5.8 | 1 | 2.79 |
| Concentric | 4.6 | 5.7 | 1.1 | 2.91 |
| Interleaved | 11.2 | 13.4 | 2.2 | 4.48 |
| Spiral | 12.3 | 14.6 | 2.3 | - |
| Pins (1 cell) | 1.6 | 2 | 0.4 | 1.07 |
| Pins (3 cells) | 3.2 | 4.7 | 1.5 | 3.20 |
| Pins (10 cells) | 7.2 | 11.1 | 3.9 | - |

THICKNESS MEASUREMENT DEVICE AND METHODS OF USE

CROSS REFERENCE TO RELATED APPLICATIONS

The present application claims priority from U.S. provisional application Ser. No. 62/625,736, filed Feb. 2, 2018, herein incorporated by reference in its entirety.

BACKGROUND

The invention generally relates to a measurement device.

Several sensing techniques have been proposed in the literature for measuring floating oil thickness. Most of the existing techniques used in oil detection and thickness estimation are either too expensive, inaccurate, give a broad estimate of the thickness within an area, are affected by environmental conditions, or do not provide continuous monitoring capabilities.

Techniques used to estimate/detect oil can be divided into two types: remote measurement or contact based. Remote measurement techniques include visual methods, where an expert provides an estimate of the slick thickness based on color. This technique is augmented with hyperspectral imaging, radar, and thermal imaging, from airborne vehicles or satellites. These techniques are helpful at providing a relatively global assessment of the thickness and are highly affected by lighting and atmospheric conditions, are expensive, or cannot be conducted continuously. On the other hand, the contact-based methods have the potential to provide localized and continuous thickness measurements. These methods include most traditional instrumentation approaches: conductivity, capacitance, light arrays, electromagnetic, and vision. However, the existing sensors in this domain still suffer from inaccuracies, sensitivity to lighting conditions, oil type, environmental conditions, fouling effects, and wave conditions. Very few commercial sensors exist and most are targeted at simple detection of leaks or to function in closed containers and not to measure the oil thickness in open water, particularly when the sensor is not stationary. The present invention attempts to solve these problems as well as others.

SUMMARY OF THE INVENTION

Provided herein are systems, methods and apparatuses for a thickness measurement device based on a capacitive array. The methods, systems, and apparatuses are set forth in part in the description which follows, and in part will be obvious from the description, or can be learned by practice of the methods, apparatuses, and systems. The advantages of the methods, apparatuses, and systems will be realized and attained by means of the elements and combinations particularly pointed out in the appended claims. It is to be understood that both the foregoing general description and the following detailed description are exemplary and explanatory only and are not restrictive of the methods, apparatuses, and systems, as claimed.

BRIEF DESCRIPTION OF THE DRAWINGS

In the accompanying FIG.s, like elements are identified by like reference numerals among the several preferred embodiments of the present invention.

FIG. 2F is a graph showing the Relative Differences from Calibration. FIG. 2G is a graph of the Ratios between Electrodes.

FIG. 7A is top view of the Capacitive Controller Circuit+GPS &Wireless; FIG. 7B is a top view of the Capacitive Sensor and Electrodes; FIG. 7C is a bottom view of the Capacitive Sensor and Tracks; and FIG. 7D is an overall view of the Capacitive Sensor PCB.

FIG. 11 is a graph of the Fuel-oil experiment 1—Locating oil/water interface.

FIG. 12 is a graph of the Fuel oil experiment 2—Locating air/oil interface.

FIG. 15 is Table XV: Interfaces detection algorithm—numerical experimental results.

FIG. 21A is an Isometric exploded view, FIG. 21B is an isometric view, FIG. 21C is a front plane section.

FIG. 22A is a front view, FIG. 22B is a bottom view, and FIG. 22C is a Right view.

FIG. 26 is a top view of the Capacitive sensor with vibration mechanism.

FIG. 27 is a graph showing the E1 voltage-drop, before & after installing the vibrator (Voltage (ADC) vs. Time (sec)).

FIG. 28 is a graph showing the E2 voltage drop before & after installing the vibrator (Voltage (ADC) vs. Time (sec)).

DETAILED DESCRIPTION OF THE INVENTION

Figure 1A:
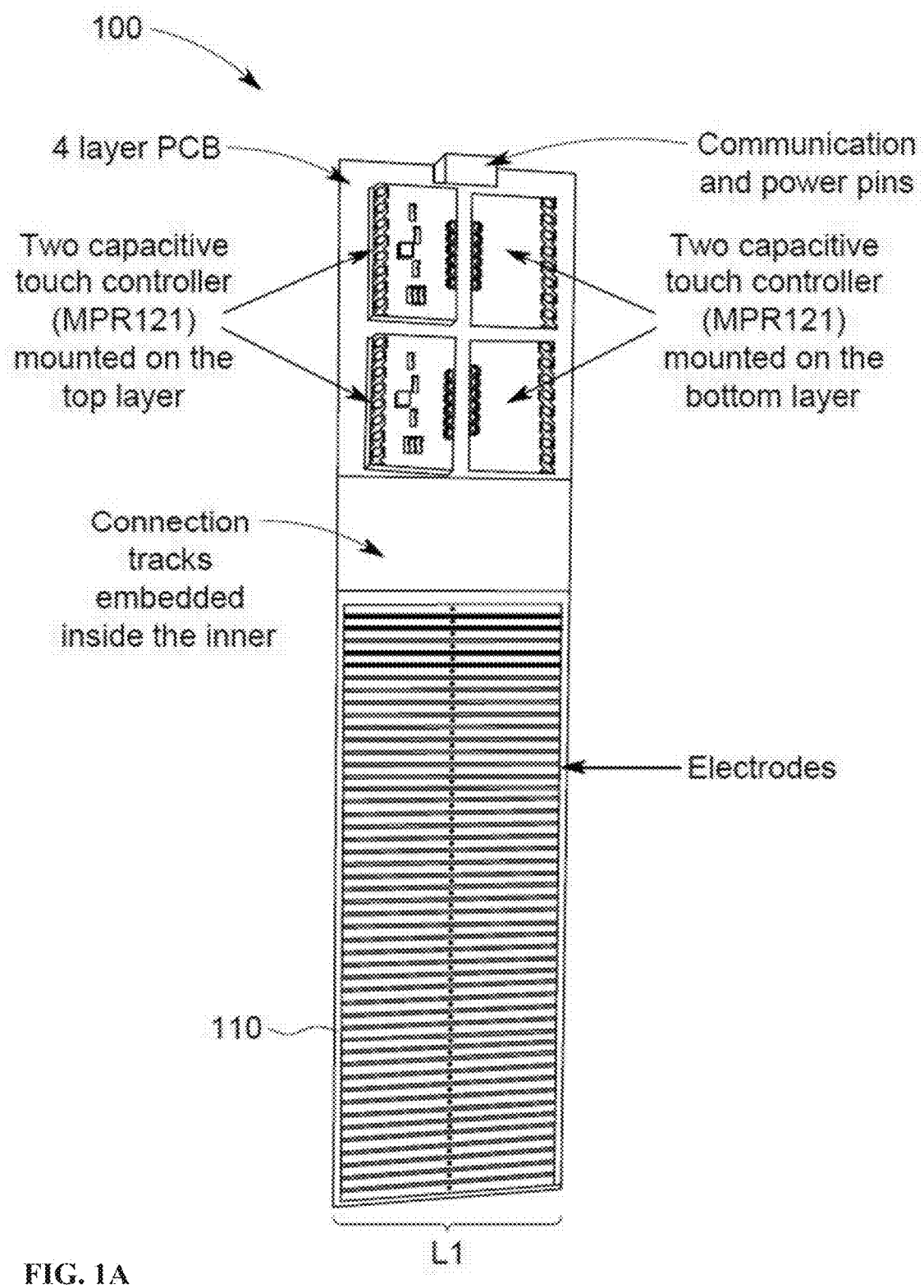
FIG. 1A is a top view of one embodiment of the thickness measurement device (basic design—without pins).

The foregoing and other features and advantages of the invention are apparent from the following detailed description of exemplary embodiments, read in conjunction with the accompanying drawings. The detailed description and drawings are merely illustrative of the invention rather than limiting, the scope of the invention being defined by the appended claims and equivalents thereof.

Embodiments of the invention will now be described with reference to the FIG.s, wherein like numerals reflect like elements throughout. The terminology used in the description presented herein is not intended to be interpreted in any limited or restrictive way, simply because it is being utilized in conjunction with detailed description of certain specific embodiments of the invention. Furthermore, embodiments of the invention may include several novel features, no single one of which is solely responsible for its desirable attributes or which is essential to practicing the invention described herein. The words proximal and distal are applied herein to denote specific ends of components of the instrument described herein. A proximal end refers to the end of an instrument nearer to an operator of the instrument when the instrument is being used. A distal end refers to the end of a component further from the operator.

The use of the terms "a" and "an" and "the" and similar referents in the context of describing the invention are to be construed to cover both the singular and the plural, unless otherwise indicated herein or clearly contradicted by context. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Recitation of ranges of values herein are merely intended to serve as a shorthand method of referring individually to each separate value falling within the range, unless otherwise indicated herein, and each separate value is incorporated into the specification as if it were individually recited herein. The word "about," when accompanying a numerical value, is to be construed as indicating a deviation of up to and inclusive of 10% from the stated numerical value. The use of any and all examples, or exemplary language ("e.g." or "such as") provided herein, is intended merely to better illuminate the invention and does not pose a limitation on the scope of the invention unless otherwise claimed. No language in the specification should be construed as indicating any nonclaimed element as essential to the practice of the invention.

References to "one embodiment," "an embodiment," "example embodiment," "various embodiments," etc., may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, biological, biochemical and sensing arts.

The thickness measurement device comprises a sensor capable of measuring the thickness of a fluid floating between at least two mediums (such as oil floating on water with air above and water below). The sensor is a capacitive array with at least two conductive plates placed side by side or above each other, as shown in FIGS. 1A and 1D. The conductive plates may not be parallel plates, according one embodiment. A dielectric material is placed in the empty space between the plates, where the fluids are facing each plate and each material type has a different dielectric constant. For example, dielectric constant of air is around 1, dielectric constant of lubricating oils ranges from 2.1 to 2.4, and dielectric constant of water is around 80 at room temperature. By measuring the change in capacitance between strips of the array, the floating liquid thickness measurement device identifies the air/oil interface and the oil/water interface. Once the interfaces are identified and given the sensor dimensions, the floating liquid thickness measurement device calculate the thickness of the floating fluid.

Dielectric materials are essentially insulators, which mean that no current will flow through the material when a voltage is applied. However, certain changes do happen at the atomic scale. When a voltage is applied across a dielectric object, it becomes polarized. Since atoms are made of a positively charged nucleus and negatively charged electrons, polarization is an effect which slightly shifts electrons towards the positive voltage. They do not travel far enough to create a current flow through the material—the shift is microscopic, but has a very important effect, especially when dealing with capacitors. Once the voltage source is removed from the material, it either returns to its original non-polarized state, or stays polarized if the molecular bonds in the material are weak. The difference between the terms dielectric and insulator is not very well defined. All dielectric materials are insulators, but a good dielectric is one which is easily polarized.

The amount of polarization which occurs when a certain voltage is applied to an object influences the amount of electrical energy that is stored in the electric field. This is described by the dielectric constant of the material. The dielectric constant is not the only property of dielectric materials. Other properties such as dielectric strength and dielectric loss are equally important in the choice of materials for a capacitor in a given application.

The dielectric constant of a material, also called the permittivity of a material, represents the ability of a material to concentrate electrostatic lines of flux. In more practical terms, it represents the ability of a material to store electrical energy in the presence of an electric field. All materials, including vacuum, store energy when placed in an electric field. The permittivity of vacuum is defined as the physical constant $\epsilon 0$, which is approximately $\epsilon 0 = 8.854 \times 10-12$ farads per meter. This constant appears in many electromagnetism formulas.

Since most capacitors are not made of vacuum, it makes sense to define permittivity for every material. The permittivity of a material is defined as $\epsilon = \epsilon r \epsilon 0$, where $\epsilon$ is the absolute permittivity and $\epsilon r$ is the relative permittivity. $\epsilon r$ is a number which is always greater than 1, meaning that all materials store more energy than free space when subjected to an electric field. This property is quite useful in capacitor applications. It should be noted that the relative permittivity depends on many factors, such as temperature, pressure and even frequency, which is why materials with more stable dielectric constant are favored in some applications but the disclosed sensor is not sensitive to this property.

The dielectric constant of water (80 at 20° C.) is much higher than that of oil (about 2.1-2.4), so measuring the dielectric constant is a convenient way to tell them apart and the thickness of each one. There is a substantial difference between the conductivities of water and hydrocarbons. This difference is often used as the basis for detecting the interface between these two fluids and their relative thicknesses.

Figure 1B:
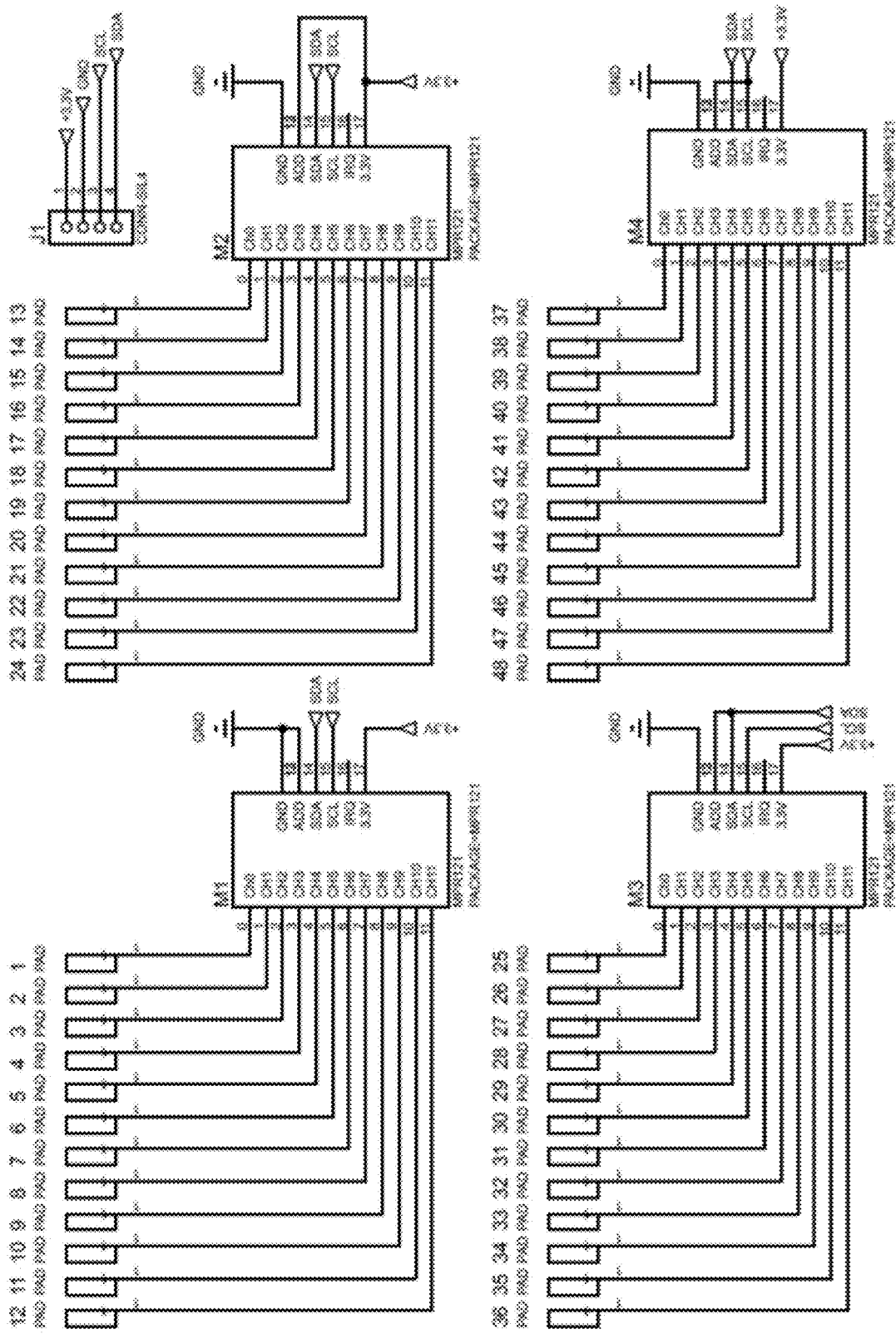
FIG. 1B is a Connection Schematic of device shown in FIG. 1A.

The sensor board shown in FIG. 1B is composed of a 4-layer PCB, with sensor pads (electrodes) mounted on the top and bottom layers of the PCB, and the connection tracks are mounted in the two inner layers of the PCB. The sensor pads (electrodes) are connected to the connection tracks through plugged via embedded in the inner layers of the PCB. To drive power and ensure data connections to the microcontroller in the processing and communication unit (FIG. 1C), a 4-pin connector (wire) is used. To cover the forty-eight sensing electrodes, four MPR121 breakout boards were used, each connecting to twelve electrodes. The electrical design schematic describing the connections and addressing of the circuit is shown in FIG. 1B. This schematic shows the connection between the four MPR121 breakout boards to the sensing pads (electrodes) labeled from 1 to 48. Addressing of the MPR121 boards is done by changing the connection of the ADD pin contained in each of the MPR121 breakout boards. The address pin (ADD) in the four MPR121 breakout boards was connected to GND, 3.3V, SDA, SCL. Thus, the four installed MPR121 controllers have the following unique I2C addresses respectively 0×5A, 0×5B, 0×5C, and 0×5D.

Figure 1C:
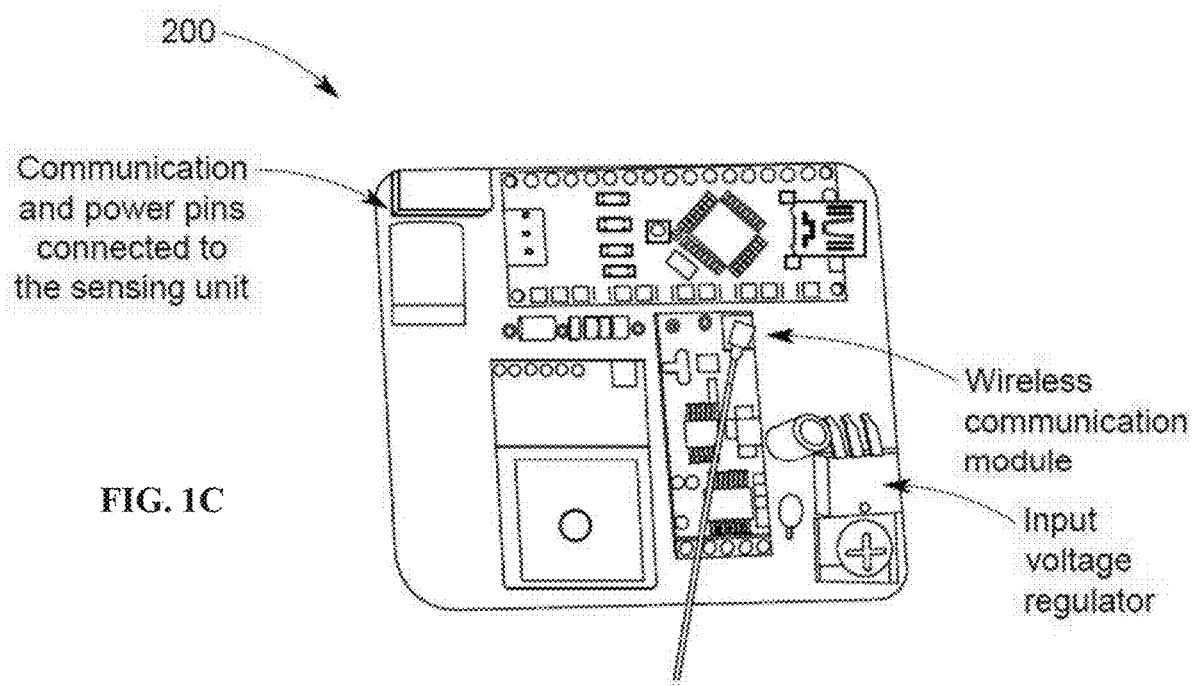
FIG. 1C shows the processing and communication unit of the thickness measurement device.
Figure 1D:
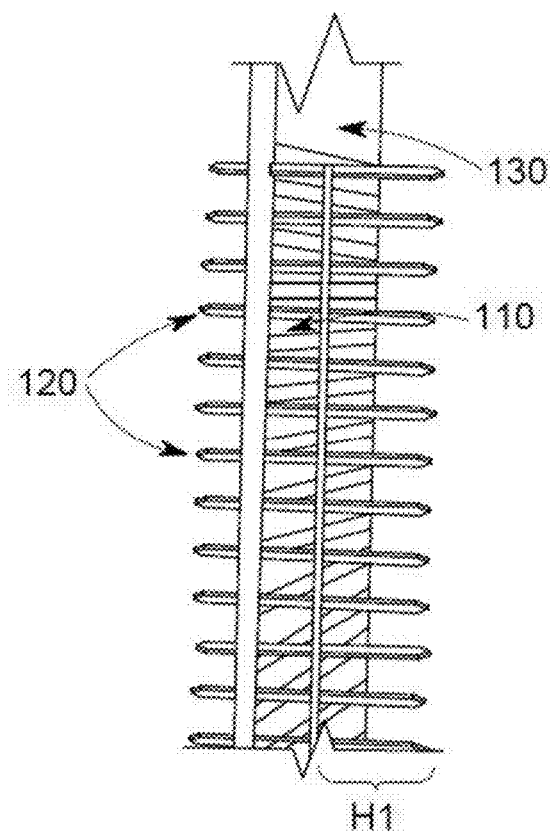
FIG. 1D is a side view of one embodiment of the sensor design with pins.

The components of the processing and communication unit shown in FIG. 1C are described as the following: First, the input power ranging between 6-26 VDC is converted to 5 VDC through a low-voltage drop linear voltage regulator (LM2940), in addition to two capacitors for signal smoothing (0.47 uF and 22 uF). Processing is done using the "Arduino Nano" development board containing the ATmega328 microcontroller. This module was selected due to its low-cost, low power consumption, and simple programmability. The wireless communication is done by the "TB394" RF module with an IPEX antenna. The wireless RF module is connected to the Arduino Nano board through its serial connection pins (RX, TX) and powered with the voltage regulator output (5V) through a transistor (2N3904) acting as a switch. The GPS module (SKM53) is connected to digital I/O Arduino pins (D3, D2), a software serial library is used to replicate the serial connection functionality on those pins. Also, the GPS module is powered by the voltage regulator output (5V) through a transistor (2N3904) acting as a switch. Resistors (11(52) are used to limit the current between the Arduino digital pins and the transistors base connector. A four-wire connector was added to connect the power and data pins to the sensing unit shown in FIG. 1A. A 6.35mm female power jack was included to connect to the power unit (9 VDC Battery).

Detection of Interfaces

According one embodiment, the sensor is not limited to only detect the level of an interface between liquid layers; instead, the sensor can detect interfaces between different mediums with different dielectric constants regardless of their state (gaseous/liquid). For the oil spill thickness measurement application, the sensor detects the interface between air (gas) and oil (liquid) and then between oil (liquid) and water (liquid). Since the electrodes are exposed to the liquid mixture, the electrodes located in the water region will be short-circuited because of the high conductivity of water. In contrast to many other capacitive sensors in the literature, short-circuiting of electrodes in the case of the disclosed sensor is not a problem since the absolute values of capacitance are not required to calculate the thickness. The short-circuited electrodes due to water contact are detected by the sensor because of their extremely low voltage values, and high relative differences from baseline calibration values taken in air. Thus, these electrodes are classified as water electrodes and removed from the sensing array. After removing the indices electrodes classified as being in water from the measurement array, the algorithm proceeds by identifying the remaining electrodes immersed in air and oil and detecting the interface electrode between the two mediums based on relative differences between them. In this case, since oil is a non-conductive liquid, the electrodes are not short-circuited and the actual capacitance of each electrode is acquired. Since the algorithm relies on relative differences between electrodes to find the interfaces, the actual correctness of the capacitance values is not a requirement.

The effectiveness of this technique in detecting the interfaces and calculating the oil thickness was validated through several experiments. In one experiment, the sensor was placed in a liquid mixture containing lubricant light-oil (10 W monograde), and water at a temperature of 23° C. and relative humidity of 60%. The actual oil thickness was around 16 mm, and a different number of electrodes were surrounded by air, oil, and water. To calculate the oil thickness, the air/oil interface and the water/oil interface were detected by using the relative ratios. As shown in Table I in FIG. 2E, the relative difference (RD) of each electrode was calculated. Ratios were obtained by dividing the value of the next electrode with that of the current electrode $V(k+1)/V(k)$, where k is the current electrode index. The graphs shown in FIG. 2F, and FIG. 2G represent the relative difference from calibration and ratio values for each electrode.

An algorithm was used to detect the two interfaces. After calculating the ratios, the algorithm proceeds by finding the indices of the electrodes having the maximum ratios. In this case, the two interfaces were detected at E4 and E11. The number of electrodes between the interfaces is counted and used in estimating the oil thickness (TH) as $TH=N \times W+(N-1) \times (G)$, where N is the number of electrodes covered by oil calculated as $N=11-4=7$, and W is the electrode width=2 mm, and G=0.5 mm is the gap width separating between electrodes. The oil thickness is calculated as $(14)+(3)=17$ mm.

In one embodiment, the floating liquid thickness measurement device comprises a capacitive sensor 100 including at least 48 conductive strips 110 having a height of 2 mm each and separated from each other vertically V1 by 1mm as shown in FIG. 1A. The specific ranges of the height and vertical separation should be reasonable with the intended application, as to be between about 1 mm to about 10 mm; alternatively, between about 0.1 mm to about 3 mm. The conductive strips are distributed into at least one column having forty eight strips. The measurement circuit was implemented on a separate Printed Circuit Board (PCB) holding the microcontroller and communication modules (GPS, wireless) 200 including a wireless communication module, communication and power pins to connect to the sensing unit, and an input voltage regulator, as shown in FIG. 1C.

The sensing technique relies on measuring relative changes in capacitance between stripes in order to identify dynamically and in real-time the floating liquid thickness.

Concept of Geometric Capacitive Sensing (Arrays)

Figure 2A:
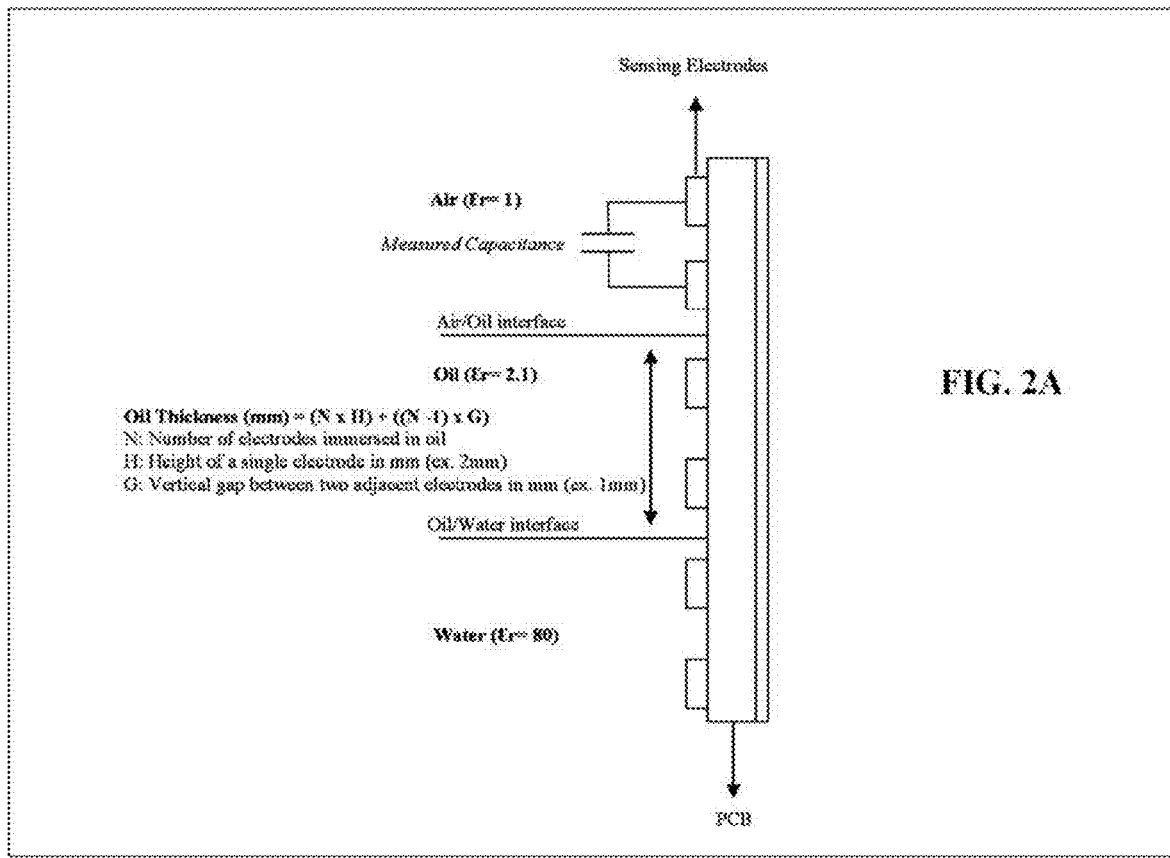
FIG. 2A is a side view of a schematic between strips detecting the thickness of an oil layer on water.
Figure 2B:
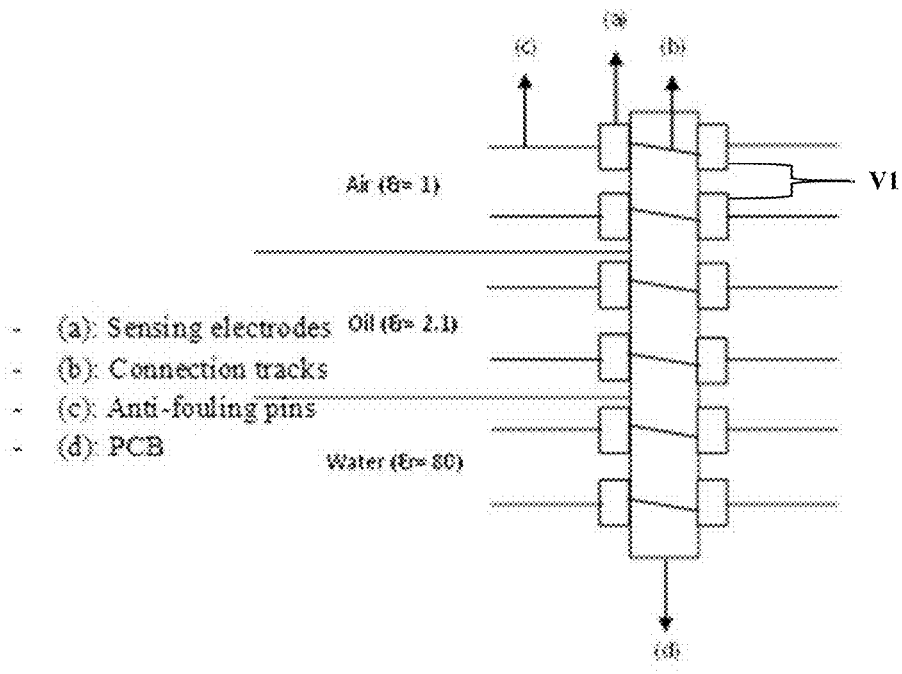
FIG. 2B is a side view schematic of the enhanced sensor design with pins.

Based on the capacitive sensing principle described above, the presented capacitive sensor is composed of a set of conductive plates (electrodes) forming an array of capacitors, implemented on a rectangular PCB plane. The change in capacitance at each electrode, caused by the change in the dielectric constant of the surrounding material is measured independently, in order to detect the type of the material (air/oil/water) it is in. The electric field formed by the electrodes extends above the sensing plane, and thus permitting the detection of the change in the dielectric constant of the liquid surrounding the sensor. The electric field distance is dependent on the charging parameters (Current and Time) in addition to the electrodes width and gap between them. FIG. 2A shows a cross-section of the capacitive sensor design. Since oil is lighter than water, it rises to the top of the water surface and floats, thereby forming a thin oil film. Due to sea water waves and the motion of the platform holding the sensor, the height of the examined liquid may vary up and down through the sensor plates, changing the surrounding medium of the electrodes (air/oil/water) and thus change the capacitance measured at each electrode. The main advantage of the vertical capacitive sensing arrays is that calibration against different types of oil/water is not needed on site since the sensor functions based on the difference in capacitance between electrodes and not on the absolute capacitance values.

By using the vertical capacitive sensor array design, the presented sensor can distinguish the water/oil interface and the oil/air interface. The thickness of oil can be deduced, regardless of where along the sensor this thickness occurred. In other words, in contrast to several implemented capacitive liquid level sensors found in the literature that use a floater to maintain a fixed position of the sensor on the top of the liquid surface, the presented sensor does not require any assumptions regarding its position relative to the liquid surface. If the sensor can deduce the two interfaces between the different mediums, the thickness can still be calculated (to within the resolution of the sensor). The application of this sensor does not require any special packaging considerations beyond waterproofing of the box in which the electronics and the battery are housed.

In one embodiment, the thickness measurement device measures the oil thickness during skimming operations in the open ocean. By using this thickness measurement device, the cleaning crew can assess, in real time, the oil thickness of the area they are cleaning, and accordingly decide if they should continue or stop the cleaning operation in that area.

In another embodiment, the thickness measurement device measures any medium lying between two other ones of different densities as long the media has different dielectric. The thickness measurement device can even be extended to measure any layered media for example the thickness of the humid layer in soil. For example, in the soil humidity measurement application, the dielectric constant of soils (mineral soil: 4, organic matter: 4, air: 1) is influenced by the water content which has much higher dielectric constant (water: 80).

In an attempt to address prior art limitations, the thickness measurement device sensor may be used during skimming operation, where the sensor is dragged through the water, while measuring the thickness of the oil on top. The thickness measurement device is novel in the sense that it provides oil thickness estimate by relying on an array of capacitive strips and relies on 'relative', rather than absolute readings, thereby making the sensor readings insensitive to manufacturing imperfections. In addition, the thickness measurement device sensor works in dynamic environments, with waves, different types of oils, salt/fresh water, different environmental conditions (lighting, temperature, humidity, etc.). The thickness measurement device design minimizes fouling effects having a thin-knife like design. The parameters vary for different materials having different dielectric constants depending on conditions such as excitation frequency and temperature. In one embodiment, the dielectric constant of water ranges between around 88 and 55 while temperature change between 0 and 100° C. It is assumed that water dielectric constant is around 80 at room temperature (20° C.). For other common materials, Vacuum is 1, Gases most around 1.00 at one atmosphere, Hexane is 1.8865 at 20° C., Benzene is 2.285 at 20° C., and lubricating oils are between 2.1 to 2.8 at room temperature depending on the viscosity of the oil. Used lubricating oils may have higher dielectric constants than the unused oils.

The algorithm for the measurement of oil in dynamic wave conditions is presented herein. The algorithm design and a large amount of test data. Several prototype boards and packaging material have been prepared and tested.

Enhanced Sensor Design with Pins

Figure 2C:
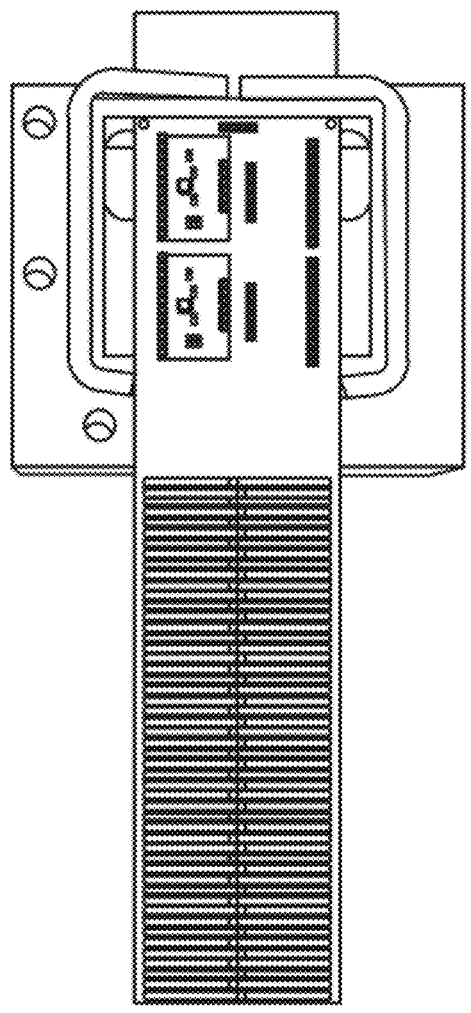
FIG. 2C shows the implemented enhanced sensor design prototype with pins.
Figure 2D:
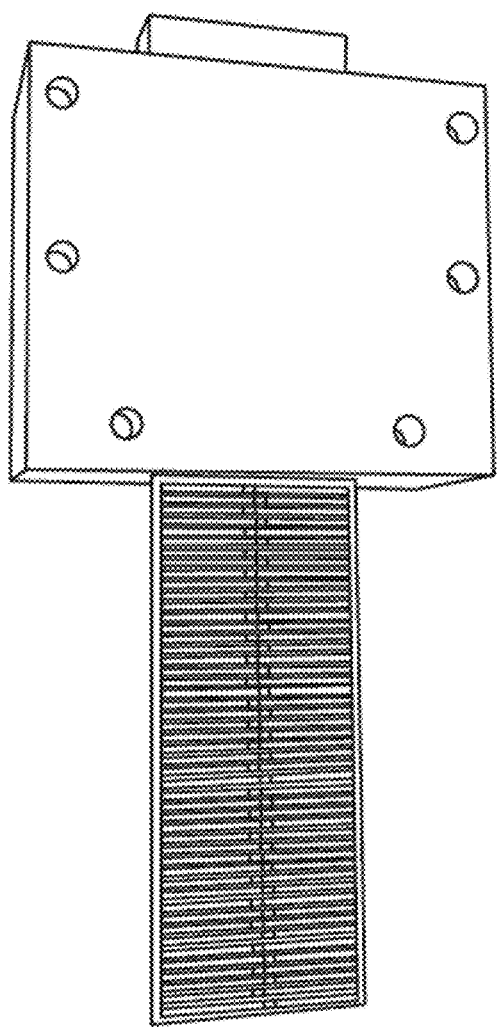
FIG. 2D shows the complete sensing unit with the waterproof enclosure.
Figure 2E:
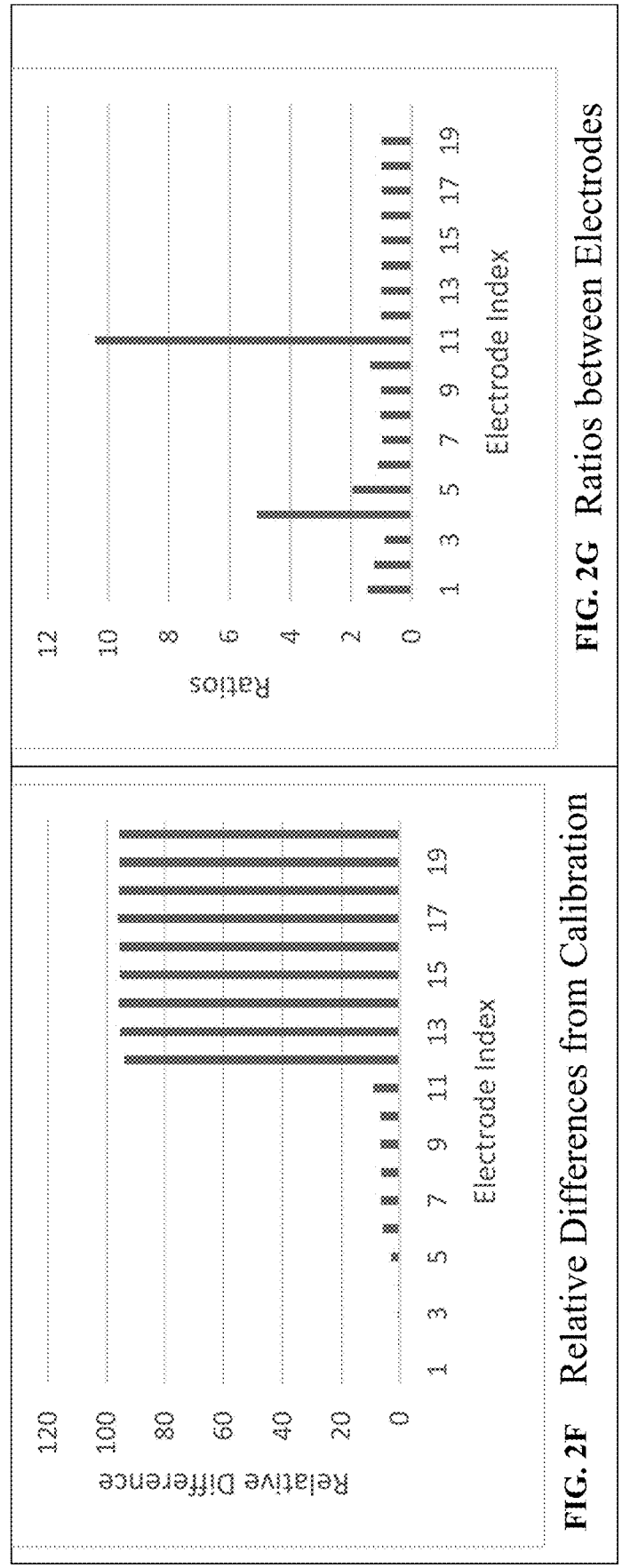
FIG. 2E is Table I showing the relative differences of sensor electrodes.

To reduce the fouling effect on the sensor, and to increase sensor sensitivity, in one embodiment, a plurality of horizontal pins 120 are operably coupled to the strips of the sensing array, as shown in FIG. 1D. In addition, sensing electrodes 110 were added to the two sides of the sensor and the connection tracks 130 were embedded in a 4-layer PCB design. The added pins 120 are able to penetrate the thick oil layer covering the sensor strips. While the sensor is immersed in the examined liquid containing oil and water layers, the pins located in the water section of the sensor are short-circuited due to water conductivity. The upper pins located in the oil section are totally immersed in oil and thus the measured capacitances are related to the dielectric constant of the oil, which is different from water and air. Based on this enhanced design, the actual sensing method used by the sensor can be represented as a mixture between capacitive sensing and conductive sensing techniques since short-circuiting is done in the water partition of the sensor and capacitive sensing is operational in the air and oil sections of the sensor due to their insulating properties. FIG. 1D illustrates the enhanced sensor design showing the following parts: (a): Sensing electrodes 110 (b): Connection tracks 130 (c): Anti-fouling pins 120 (d): PCB. The implemented sensor prototype with pins is shown in FIG. 2C. The complete sensor unit including the waterproof housing is shown in FIGS. 2C-2D.

Sensor Implementation

The implemented capacitive sensor prototype is composed of a sensing unit (electrodes array) and a processing unit (microcontroller). The sensing unit shown in FIG. 1A, contains a set of conductive electrodes mounted on a double sided four-layer PCB and four capacitive touch controller modules "MPR121". The height of each electrode is 2 mm and the vertical gap between two adjacent electrodes is 1 mm. The electrodes are placed sequentially from up to down on the PCB to cover all the target sensing range (10 cm). The capacitive touch controllers work by charging and discharging each sensing electrode with a DC current during a specific duration of time. During the excitation and measurement of each electrode, all other electrodes are connected to Ground. At the end of each charging and discharging cycle, the measured voltage is converted to a digital value and several layers of digital filtering are applied to the result, in order to increase the noise immunity in different environmental conditions. The microcontroller (Arduino Nano) located at the processing unit shown in FIG. 1C receives the digital voltage values, applies the thickness estimation algorithm to calculate and report the actual oil thickness. Finally, the thickness results are sent wirelessly to a base station.

Hydrodynamic Design

To maintain an accurate measure while the sensor is being dragged through the water, the sensor is designed to be very flat (knife-like design) so that it possesses minimal resistance and drag. In one embodiment, the width of the sensor cartridge body is between about 1.0 mm and 2.0 mm; alternatively, between about 1.2 mm and 1.8 mm; alternatively between about 1.4 mm and 1.6 mm. This way it "cuts" through water and oil whether going straight or in a turning maneuver. Since the sensing array is mounted on a slim PCB plate with sharp edges, water comes off easily from the sensor body while dragging, reducing the accumulation of oil on the sensing strips. Also, the horizontal pins added to the sensing electrodes play a major role in increasing the cleaning rate of the sensing array.

The algorithm for the measurement of oil in dynamic wave conditions is presented herein.

While described herein primarily with application to maritime oil spills, it will be understood that the system and method of the present invention may be adapted for use in connection with collection of oil in salt water or fresh water environments, in and around marinas, fueling areas, oil rigs, harbors and processing plants, and for coastal environmental defense against naturally occurring and/or manmade releases of oil and other petrochemicals. Additionally, while described primarily with regard to collection of oil from water, it will be understood that the system and method of the present invention may be adapted to separation of any lower density material from a higher density material, for example in specialty chemical processing, rendering of fats in meat processing plants, essential oil collection from plants, ore particle separation in mining, and various other applications and industrial processes Where a density differential is present between a first material and a second material. Dielectric differentials are needed also for the measurement. Density so there is separation and dielectric to allow measures.

Measurement Algorithm

The measurement algorithm aims to find the indices of the electrodes located at interfaces between materials with different dielectric constants. According one embodiment, and based on the sensor geometrical properties, electrodes located at the water/oil interface and the air/oil interface are detected and used to calculate the oil thickness in both static and dynamic conditions. The algorithm has a low dependence on the direct numerical values of the voltage measurements and can work on a device with a limited amount of computational resources. The system starts by measuring the voltage values of all electrodes in a sequential manner, using the capacitive touch controllers and multiplexers. The microcontroller reads the digital voltage values acquired from each electrode and applies several layers of digital filtering to enhance the stability of the measurements.

To normalize the acquired voltage values, relative percentage changes from baseline calibration values are calculated for each electrode. The calibration values are taken when the sensor is completely dry and placed in open air for a specific duration of time. The calculated relative percentage changes are used by the algorithm to decide on the state (air/oil/water) of each electrode. Since each ratio is assigned to its electrode index and knowing the geometrical dimensions of the sensor (separation between electrodes) the actual thickness of oil is calculated.

To handle dynamic cases where the sensor rises or drops (due to lift or dip of the vessel, or due to waves) a two-step algorithm is used. The first step is to detect the direction of sensor movement: by using the average value of all voltage measurements at each measurement cycle, the direction of the sensor movement can be deduced. To decrease the fouling effect, the "Highest Point" measurement algorithm is applied when the sensor reaches its highest point of movement during a specific interval of time. Another approach to handle the fouling effect named "Corrected Lowest Point" algorithm, is to detect the lowest point of the sensor movement and apply a correction method to remove the number of fouled electrodes from the detected oil electrodes. By using time interpolation, the correction mechanism works by finding the number of fouled electrodes and subtract it from the oil interval before calculating the actual thickness. Basically, the correction mechanism (Corrected Lowest Point Algorithm) is preferred against high viscous oil types where fouling is a major problem. When dealing with light oil types or when the sensor is not moving (static case), fouling effect is minimal, thus the correction step is not needed, and the "Highest Point" algorithm is used. The workflow of the overall algorithm is illustrated in the flowchart presented in FIG. 2H.

For light oil types (ex. Diesel), the "Highest Point Algorithm" is applied; the approach consists of measuring the thickness using the set of values taken when the sensor reaches its highest points (crests) through the stored array. This is done since with light oil fouled stripes that moved from oil to air will clean relatively fast and stripes that are fouled at the bottom side are minimal (if any) since at the highest point most of the fouled striped went back into the oil. This algorithm is used also in static cases since the highest points will be regular points in the array.

The second approach is more suited for the heavy oil types (ex. Hydrocal, Calsol) where the negative impact of fouling is more effective. This approach is called the "Corrected Lowest Point Algorithm". It works by detecting the measurements taken when the sensor reaches the lowest points in the stored array (minimums) and applying a correction method on them to remove the number of fouled electrodes. By using time interpolation, the correction mechanism works by finding the number of fouled electrodes and subtracting it from the detected oil interval before calculating the actual thickness. The reason for adopting this approach because with thick oils when sensor is on top the fouled stripes in the air will take long to clean. Therefore, instead consider the sensor when it is submerged the most since most fouled stripes would be at the bottom in the water. In this case, the algorithm will overestimate the oil thickness due to fouling and would require a correction step where fouled stripes are detected and removed from the thickness.

Algorithm Detailed Description: Calibration

The calibration voltage values are acquired while the sensor is completely dry and placed in open-air for a preset duration of time. For each electrode, the average of all measured voltages is stored in a one-dimensional array. While operating, the relative voltage difference (R) of each electrode of index 'i' is calculated using the following equation (1):

$$R(\%) = \frac{|Current[i] - Calibration[i]|}{Calibration[i]} \times 100 \quad (1)$$

Validity Check

At each measurement cycle, a validity check is applied on the acquired values to check if the sensor is in a valid sensing position. A sensing position is set to be valid when the last electrode in the sensor array is immersed in water. The relative change of the last electrode is calculated and compared to a threshold value (50%) to decide if the electrode is in water. If the calculated relative change is greater than 50%, the measure is considered valid. Otherwise, the measure is considered invalid, and not stored in the measurements array. Also, a text message (Invalid) is sent to the base station to inform the user about the sensor state. This would allow for the detection of the scenario where the sensor is out of the water.

Interface Detection (Detect-Interface)

To detect the interface between two different mediums, the algorithm uses a voting method named "Detect-Interface" and is described as the following:

Detect-Interface (Relative Differences Vector) by creating a one-dimensional array (Votes) of size N, where Votes=zeros (1, N) (initialized by zeros, one row, N columns). Then, calculate votes of each electrode starting from index=2, while (index<N), Votes (index)=(mean (Relative Differences (index+1: N))–mean (Relative Differences (1: index)))–(Relative Differences(index)/2). Then, get the index of the interface with the maximum value of votes, where the Max_Value=MAX(Votes), and the Interface=getIndex (Max_Values) (gets the index of the electrode with maximum vote value). And return the index of the interface, where "N" is the total number of electrodes, "index" is the electrode index.

To measure the oil thickness, the interface detection method is applied two times iteratively. After finding the water interface, all of the electrodes below it (greater in index) are removed, and the method is applied on the remaining electrodes to find the oil/air interface.

The Highest Point Algorithm starts by initializing the counter to zero with c=0, while (c<50). Then, measuring to get Relative Change, it checks the validity and if (measure is valid) then it adds to measurement array. Measures Array(c)=measure; where the increment counter is c=c+1. The algorithm ends if and while the measure array is Full with the Temporary Vector=zeros (48). Then, it gets the minimum relative difference from each column (electrode), for (k=1, k<48, k++). A Temporary Vector (k)=MIN (Measurements Array(K)); and end to Calculate thickness. It gets the Thickness (Temporary Vector) based on the "Detect-Interface" method described above (Detecting the oil/water interface, removing oil/water interface and all electrodes below it (greater in index) from Temporary Vector, and detect the air/oil interface, and calculate the oil thickness using the number of electrodes located between the two interfaces).

The Corrected Lowest Point Algorithm start by initializing the counter to zero, c=0, while (c<50). Then, it measures and gets Relative Difference for each electrode. Then, it check the Validity, and if measure is valid then it add to measurement array. Measures Array(c)=measure; with an increment counter c=c+1. It ends If and while the Measure Array Full with a Temporary Max Vector=zeros (48), a Temporary Min Vector=zeros (48), and a Temporary Amp Vector=zeros (48). Then it gets the maximums, minimums, and amplitudes. For (k=1, k<48, k++) the Temporary Max Vector (k)=MAX (Measurements Array(k)); the Temporary Min Vector (k)=MIN (Measurements Array(k)); and the Temporary Amp Vector=Temporary Max Vector (k)–Temporary Min Vector (k). To detect oil electrodes, the water interface is detected where Water Interface=Detect Water Interface (Temporary Max vector), then relative change of the sensor movement is calculated by relative Change=((mean (Temporary Max Vector)−mean (Temporary Min Vector))/ mean (Temporary Max Vector)) (100). Then, If relative change>3%, the sensor is considered moved and the correction step is applied on the water interface by decrementing the water interface index while (Temp Amp Vector (water Interface)>mean (Temp Amp Vector (0:index of Water interface; average of amplitudes before water interface index)). If the relative change is <3%, sensor is detected static, and water interface is not corrected. Then, the corrected water interface and all below electrodes (greater index) is removed from the Temporary Max Vector. The Oil Interface=Detect Oil Interface (Temporary Max Vector); and the Oil Interval=Water Interface−Oil Interface. And then it calculates thickness by getting the Thickness (Oil Interval), where thickness=(Oil Interval) (2)+(Oil Interval-1) (1). And it return the thickness.

Movement Tracking in Dynamic Liquid Conditions

As described before, the aim of the algorithm is to detect the best set of measurements to apply the analysis. The movement detection process identifies the dynamic state of the sensor (fixed/moving) and the direction of the movement (upward/downward). When the sensor is moving downward, most of the relative differences will increase since more electrodes will be immersed in the examined liquid. Electrodes moving from oil to water, and electrodes moving from air to oil will have more relative differences from baseline calibration values taken in air. In contrast, when the sensor is moving upward the relative differences will decrease. The average relative difference of all electrodes is calculated at each measurement cycle and used as an indicator for the sensor movement. For the static case, since no movement occurs, the average should be changing within the random error interval with respect to time. In dynamic cases, the average will be increasing or decreasing based on the direction of the sensor movement or waves. If the sensor is fixed in place, the average value is used to track the motion of the liquid hitting the sensor. To demonstrate this capability, the relative differences of all electrodes at each measurement cycle are stored in a 2D array and converted to a grayscale image, shown in FIG. 17C, 17B, and 17A, where the y-axis corresponds to the electrode index and x-axis corresponds to time. A clear variation of the color intensity in the image is observed with respect to the vertical movement of the sensor in waves. Brighter intensities reflect an increase in the relative difference due to water contact. According to this graph, the amplitude and frequency of the waves can be determined, since the sampling time and the geometrical sensor properties are known.

To detect the set of measurements taken at the highest point of the sensor movement, the minimum relative difference presented by each electrode during a certain interval of time is selected. In contrast, to detect the measurements taken at the lowest point, maximum relative differences are selected.

The discrete design concept of the sensor relies on the geometrical properties of the classified electrodes to calculate the oil thickness making it more reliable in comparison with the traditional continuous capacitive measurement techniques in such conditions.

Another advantage of the discrete measurement concept over the continuous capacitive sensing techniques is that calibration against different oil/water types is not required since the actual capacitance values are not used in fluid level calculations. This fact gives the sensor the capability of working against different liquid types (heavy and light oil/fresh and salty water) without the need of recalibration. The importance of this point is that the sensor can work in situations where several liquid types may mix together during the operational time such as in oil spill applications. In contrast, the continuous capacitive sensing techniques and other sensing technologies that require calibration against different liquid types may not be considered reliable in such applications (a mixture of unknown oil types).

Shape difference is also of importance because the sensor is designed to be like a knife cutting through water even when being dragged or when bobbing. The measurements of the sensor in the continuous capacitive sensing techniques, that use a floater to maintain a fixed position of the sensor on the top of the liquid surface, would cause oil accumulation and would not function properly if displaced vertically.

Figure 2I:
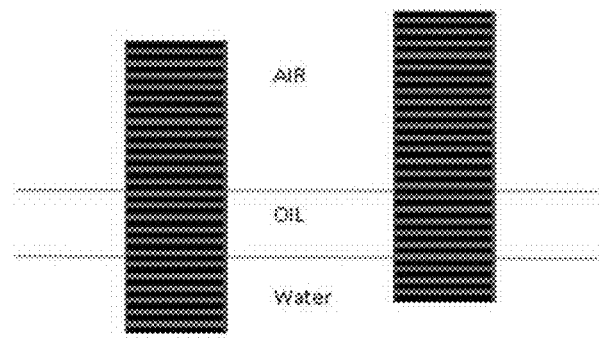
FIG. 2I is a schematic illustrating the vertical capacitive array at different positions.
Figure 2H:
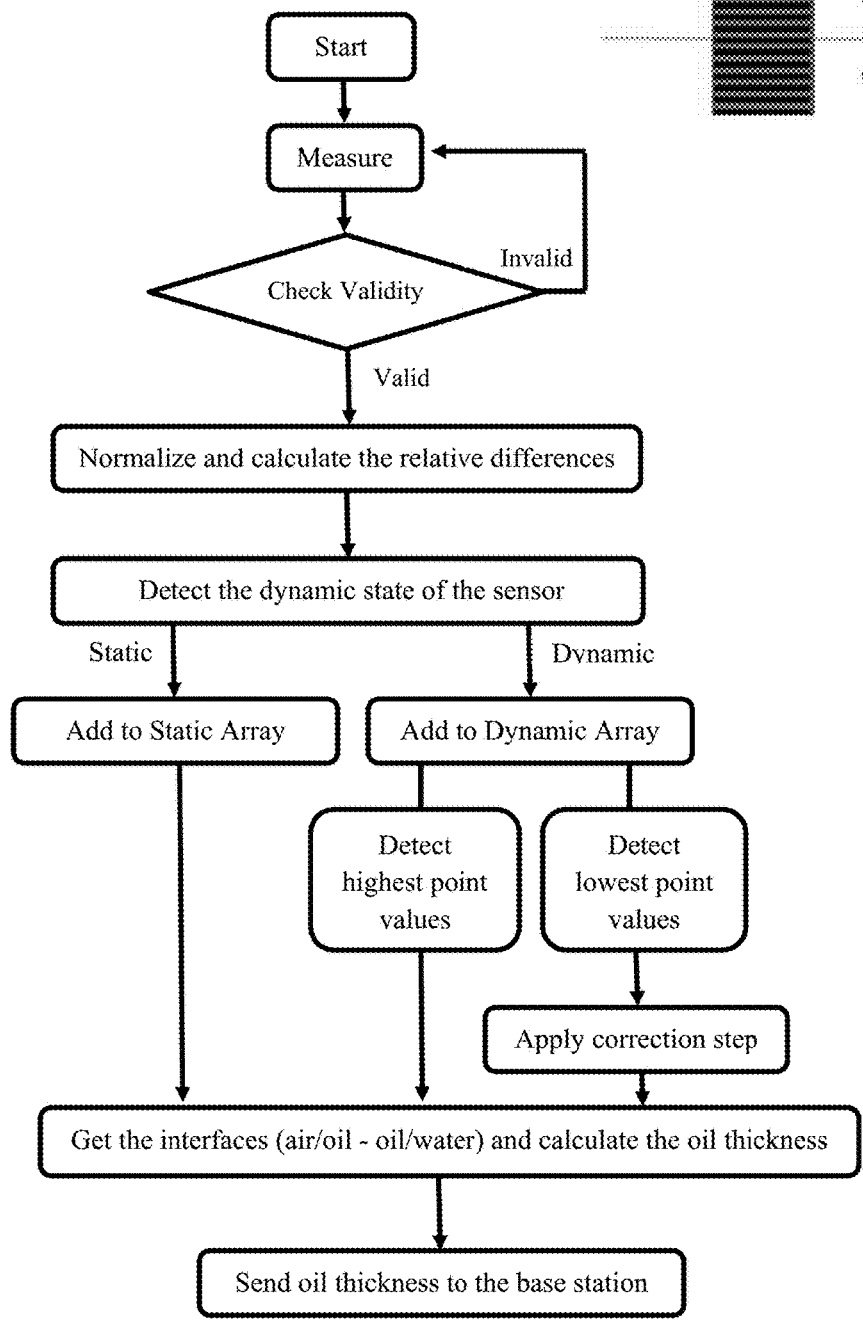
FIG. 2H is a flowchart of an algorithm, according one embodiment.

However, the disclosed sensor mounting design where a floater is not required to maintain the position of the sensor at a specific location (FIG. 2I). To handle dynamic conditions, the sensor uses relative differences to detect air/liquid interface and removes the air classified electrodes from the measurement array. Based on the discrete measurement design, the air partition is dynamically detected and removed despite different waves and dragging conditions. It is important to note here that the sensor could be fixed from its center to any mounting mechanism where the sensor electrodes starting from the air section to the underwater section are free to move vertically through the examined liquid.

The capacitance measurement technique used in the disclosed sensor is with modern capacitive touch controllers. The multi-input, low-cost, and low power capacitive touch controllers used in the system measures the capacitance of each electrode sequentially and converts the corresponding voltage to a digital value before sending it to the microcontroller. The capacitive controllers work by charging and discharging each sensing electrode with a DC current during a specific duration of time. At the end of each charging and discharging cycle, the measured voltage is converted to a digital value and several layers of digital filtering are applied to the result increasing the noise immunity for different environmental conditions. The microcontroller receives digital voltage values and provides them to the relative thickness estimation algorithm to calculate the actual oil thickness.

The calculation of the thickness of the floating fluid based on dimensions of the sensor is based on the discrete measurement principle, where the floating fluid thickness is calculated after detecting the number of electrodes immersed in the liquid and using their geometrical properties instead of actual capacitance measurements.

Since the measurement algorithm is relative relaying on the differences between the current values of all electrodes and not on the calibration values, changes in temperature and relative humidity and lightning does not have any impact on the measurement algorithm.

The sensor is intended to measure the thickness of different liquid layers in open water (in addition to the closed vessels) without any need for special mounting or floating platforms. As stated before, the sensor can detect and handle air medium thickness which makes it free from special mounting and floating requirements.

The disclosed sensor uses a discrete measurement principle and no reference sensors are required since the actual capacitance values are not used in thickness estimation algorithm. The disclosed sensor doesn't need to know anything about the exact permittivity of the liquids prior to measurement. It is important to note here that during oil spills, different oil types may mix together limiting the use of predefined permittivity values to calculate the actual oil thickness. Thus, the main advantage of the disclosed sensor is that pre-calibration against different liquids before the operation is not needed. The disclosed sensor can work against different oil types (heavy/light) and water types (fresh/salty) based on the base values taken in the air only.

The disclosed sensor doesn't use any insulating material. All electrodes are exposed to the examined liquid. Electrodes are measured sequentially and a discrete measurement technique is used to get the thickness without using the actual capacitance value (continuous measurement).

The disclosed sensor adapts to the wave movement by detecting the air portion of the sensor allowing its use in dynamic and wave conditions.

The disclosed sensor is designed to work on open water environments in addition to vessels and has a relatively-high resolution (few millimeters). The disclosed sensor design can handle dynamic conditions and waves by relying on the discrete measurement technique and continuously detecting the air portion of the sensor.

The disclosed sensor doesn't use the actual capacitance value to convert to thickness.

Instead, it uses a discrete measurement technique allowing it to differentiate between several mediums by detecting interfaces (air/oil—oil/water) by using the geometrical properties of the sensor without the need of knowing the actual dielectric constant of the examined liquid. It is important to note here that using the actual measured capacitance value to get the thickness will be highly affected in dynamic conditions due to fouling phenomena, especially when dealing with high-viscous liquids (ex. heavy crude oils).

The disclosed sensor can work by detecting multiple interfaces between several mediums with different types (gas/liquid) having different dielectric constants. In the oil thickness application, the disclosed sensor works by detecting two interfaces; the first between air and oil (air/oil interface) and the second between oil and water (oil/water interface). Also, the number of interfaces could be extended to meet the desired application.

The disclosed sensor measures the capacitance of each electrode independently and uses a relative algorithm to detect the interfaces between several mediums based on percentage change values without relying on any threshold values.

Capacitive Sensor: Sensor Design

The capacitive sensor is composed of a set of conductive plates (electrodes) forming an array of capacitors, implemented on a planar PCB. The change in capacitance at each electrode caused by the change in the dielectric constant is measured independently to detect the type of the surrounding material (air/oil/water). The electric field formed by the electrodes extend above the sensing plane and thus permitting the detection of the change in the dielectric constant of the liquid surrounding the sensor. The capacitive sensor is composed of the sensing unit and the processing unit.

Capacitive Sensing Unit

Figures 3A, 3B, 3C:
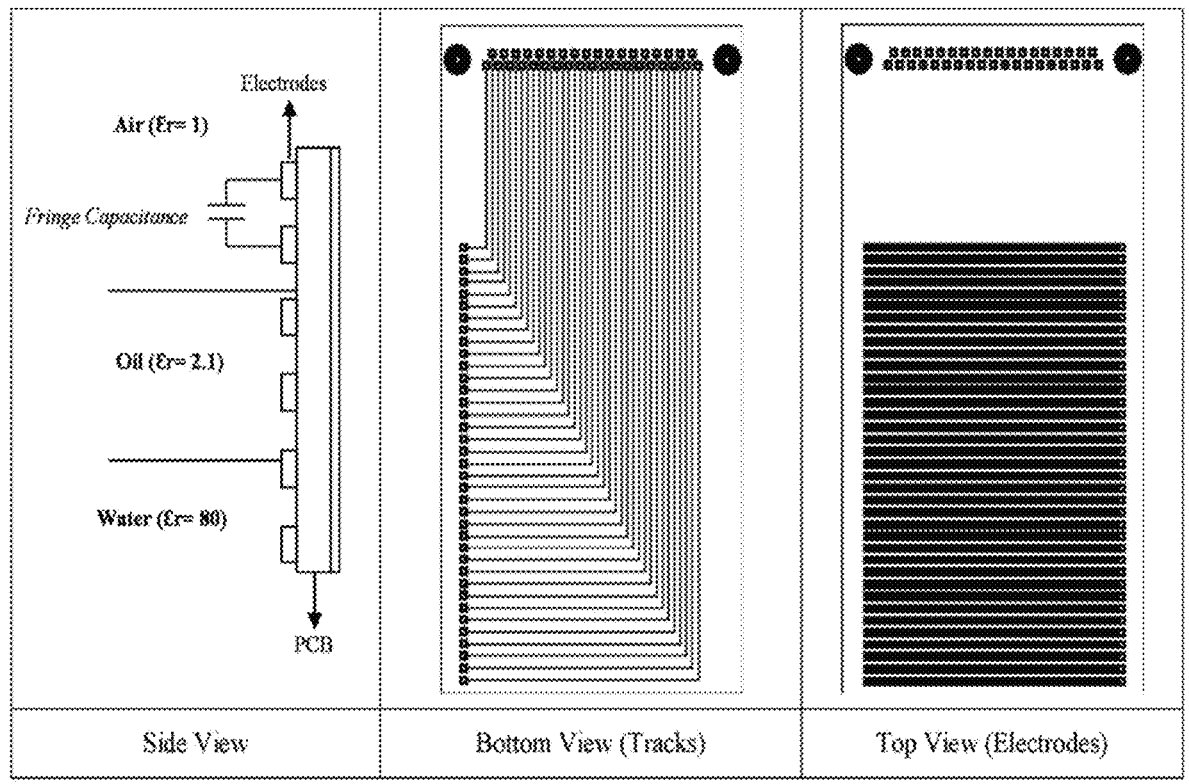
FIG. 3A is a side view of a schematic of the Capacitive Sensor Design.
FIG. 3B is a bottom view of a schematic of the tracks of the Capacitive Sensor Design.
FIG. 3C is a top view of the schematic electrode of the Capacitive Sensor Design.

The sensing unit contains thirty-seven conductive electrodes distributed equally-distanced from top to bottom on the top layer of a double-faced PCB (FIGS. 3A-3C). In one embodiment, the electrodes have the following dimensions: Width: about 2 mm, Length: about 50 mm, Vertical separation gap: about 0.5 mm. The bottom layer of the PCB contains the tracks connecting electrodes to the connection socket. A 37-Pin D-Subminiature PCB connector [7, 8] was selected to connect the sensing unit to the capacitive controller modules (MPR121) in the processing unit. The D-Subminiature connectors are selected due to their compact size, and the high number of pins they offer. The sensing unit is coated with a transparent electrical insulation material provided by "Nanoprotech" [9] composed of the following ingredients: highly purified mineral oil, anticorrosion additives, antioxidant paraffinic, and naphthenic hydrocarbons. The recommended temperature for operation of this material is between about −20° C. to about +35° C. and it maintains its properties for a temperature range from about −80° C. to about +140° C.

Capacitive Processing Unit

The capacitive processing unit contains the capacitive sensor controller modules MPR121

Figure 4:
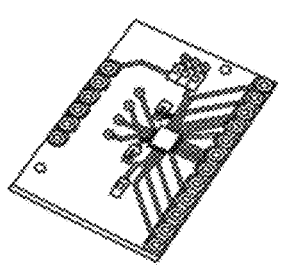
FIG. 4 is a perspective view of one embodiment of the MPR121 Breakout Board.

(FIG. 4) to measure the capacitance values and a microcontroller board (Arduino Nano) to control the measurement process and calculate the oil thickness The MPR121 is a capacitive sensor controller used in touch and proximity sensing applications. It supports twelve sensing electrodes and can be connected to a microcontroller equipped with an I2C communication channel. This module normally works with an input voltage between 1.6V and 3.3V under a temperature range of about −40° C. to about +85° C. It has a low current consumption of around about 29 µA at a sampling rate of about 16ms. The address pin (ADD) is used to set the I2C address of the chip. By default, the ADD pin is connected to GND setting the I2C address to 0×5A. The chip may be configured to three other I2C addresses by connecting the ADD pin as the following: ADD to 3.3V=0× 5B/ADD to SDA=0×5 C / ADD to SCL=0×5 D [10].

Three MPR121 modules are used in the controller board after assigning a unique I2C address for each module. Each module is connected to the Arduino controller board by using two power lines and two I2C communication lines (3.3V-3.3V/SCL-A5/SDA-A4/GNG-GND). The sensing pins are connected sequentially to the electrodes in the sensing card starting from top to bottom. The code scans each electrode iteratively and reads the filtered voltage value provided by the internal 10-bit Analog-to-Digital-Converter (ADC).

Figure 5:
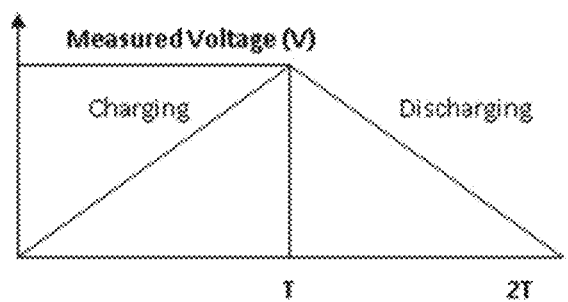
FIG. 5 is a graph of embodiment of the MPR121 Voltage Measurement Cycle.

The MPR121 can measure a range of capacitances from around about 10 pF to about 2000 pF with a resolution of about 0.01 pF. The voltage measured by the chip is inversely proportional to the capacitance which is affected by the amount of charge stored in each electrode. The voltage of each electrode is measured after applying a constant amount of current for a fixed duration of time (FIG. 5). The capacitance of the electrode changes due to the change in the dielectric constant of the examined liquid, thus changing the measured voltage. The current amount (I) and charge time (T) are configured to set the charge amount applied to the electrodes. The peak voltage is measured after charging each electrode sequentially. The capacitance (C) is calculated as $C=Q/V=I \times T/V$, Where Q is the charge amount measured in coulomb, and V is the voltage amount measured in volts.

The chip contains a set of different registers used to configure the operational parameters and to get the output data from the device. The main registers used in the disclosed system are listed as follows:

Electrode Filtered Data Register (0×04-0×1D):

This register holds the filtered output data corresponding to the output of the second filter ranging from 0 to 1024. This data is obtained by measuring the voltage value of each channel and converting it from analog to digital using the internal 10-bit ADC. This register is updated every ESI x SFI and is a read only register.

Filter/Global CDC Configuration Register (0x5C)

The first two bits of this register are used to set the number of iterations for the first filter (First Filter Iterations—FFI) and may be set to the following values: 00 (6 samples—Default), 01 (10 samples), 10 (18 samples), and 11 (34 samples). The remaining six bits are used to configure the amount of charge current applied to the electrodes. This current configuration section is named the Charge Discharge Current (CDC) and can be set to a range of values between 0 and 63 (000000 (Disabled), 1 (1 µA), 010000 (16 µA) (Default), and 111111 (63 µA)).

Filter/Global CDT Configuration Register (0x5D)

The first three bits of this register are used for configuring the charging time (Charge-Discharge Time—CDT), two bits to set the number of samples taken for the second filter (Second Filter Iterations—SFI), and three bits to set up the sampling time (Electrode Sample Interval—ESI). The CDT can be set to about 32 µs by setting the bits to 111 and may be disabled by using 000. Other values may be set by using the following equation: CDT=2^(n-2), where n is the decimal encoding of the three-bit binary value. The default value for the CDT bits is 001 which corresponds to 0.5 µs. The SFI can be set to the following values: 00 (4 samples—Default), 01 (6 samples), 10 (10 samples), and 11 (18 samples). The ESI may be set to a value between 000 and 111 which corresponds to period value between 1ms and 128ms using the following equation period=2^n ms, where n is the decimal encoding of the 3-bit binary value used. The 0x5C and 0x5D registers are the two main registers used to configure the MPR121 devices. All the global filtering and charging parameters are set up using these two registers. The applied settings will be utilized by all electrodes if the auto-configuration option and the individual charge/discharge feature are disabled.

Figure 6:
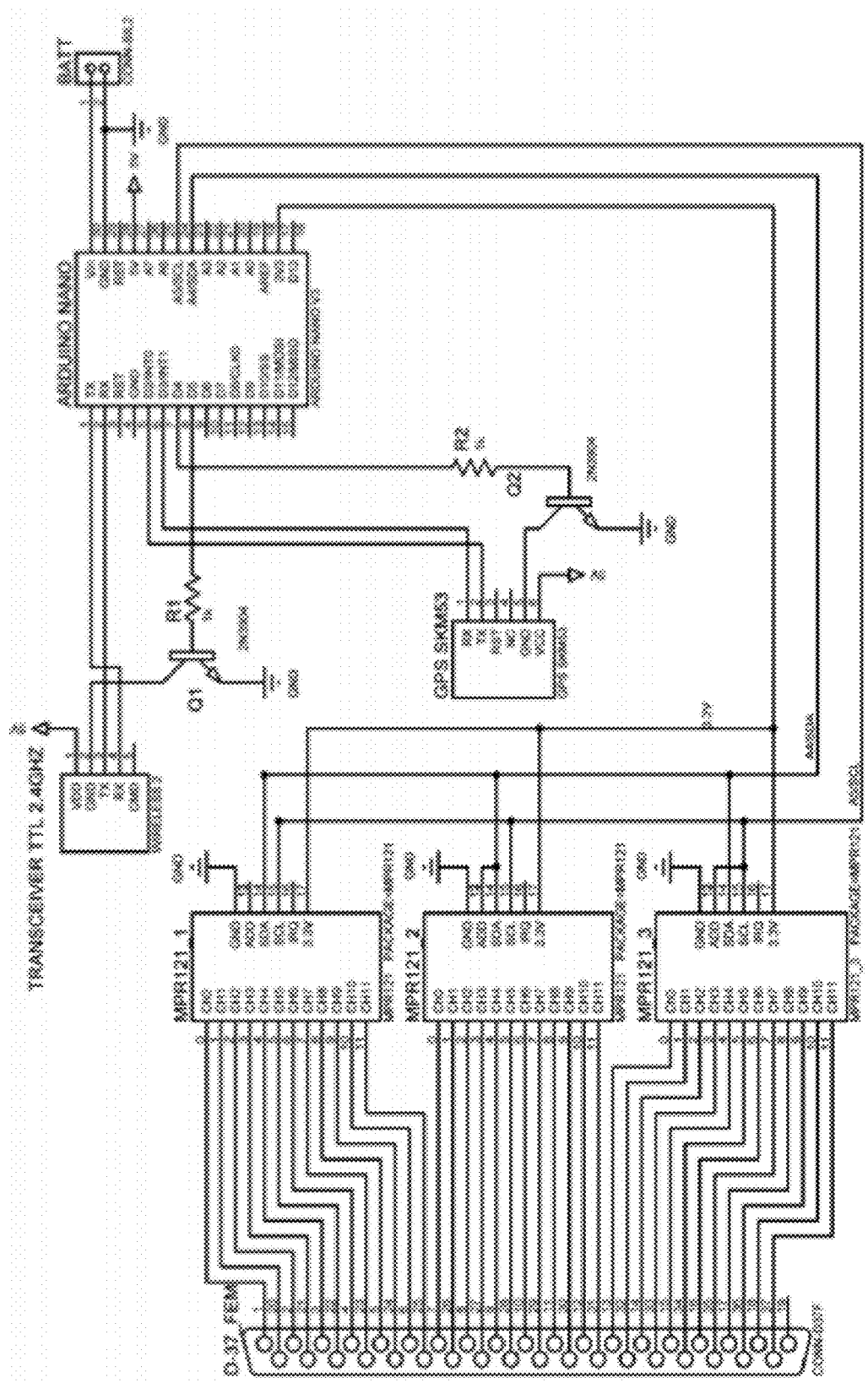
FIG. 6 is a schematic of the Capacitive Sensor Control Circuit.

The Arduino Nano board was chosen due to its low-cost, simple programmability, and capability of I2C communication. FIG. 6 shows the connections schematic between the Arduino and the MPR121 modules. Twelve input channels from each MPR121 modules are connected to the electrodes of the sensing unit. The main power supply (VDD) of the MPR121 having an operational voltage range between about 1.71V and about 3.6V is connected to the about 3.3V output pin in the Arduino board regulator and decoupled by a 0.1 µF capacitor to GND. The GPS module (SKM 53) and a wireless transceiver (2.4 GHz) is connected to the Arduino through hardware and software serial communication. Transistors (2N3904) are controlled by the microcontroller and used as a switch to power ON/OFF the GPS and wireless modules. FIGS. 7A-7D shows the hardware implementation of the capacitive sensor.

EXAMPLES

Several experiments were performed to assess the output of the proposed capacitive sensor under different conditions and using different oil types (Heavy/Light). During the experiments, the sensor was immersed in the examined liquid (oil/water), and voltage measurements were sent wirelessly to the base station. A software application was developed to receive and save the measured voltage values automatically.

Oil Types

Fuel Oil

Experiments were performed to assess the performance of the proposed capacitive sensor while working with heavy fuel oil. However, the viscosity of the procured heavy fuel oil was measured using the viscous meter available in our labs, and the results were in the range of 3300 to 3500 cP. The viscosity of the fuel oil was measured using the following procedure: a spindle of a specified diameter is immersed into the oil and rotated at a precise speed in RPM, the drag measured gives out the viscosity of the medium. The results are shown in Table I.

TABLE I

| Measured Viscosity (Fuel Oil) | | |
|---|---|---|
| Spindle | Speed (RPM) | Viscosity (cP.) |
| SP R4 | 10 | 3446.4 |
| SP R4 | 20 | 3456.1 |
| SP R4 | 30 | 3381.7 |
| SP R4 | 50 | 3332.6 |
|  | Average | 3404.2 |

As shown in Table I, the measured viscosity is in Centipoise (cP.), which represents the absolute viscosity of the oil. The kinematic viscosity is represented in Centistokes (cSt.). The main difference between the two units is that the cSt (kinematic) represents the ratio of a liquid density to its absolute viscosity in cP. To convert from absolute (cP) to kinematic (cSt), the obtained values (cP.) should be divided by the density of the liquid. Most hydrocarbons (fuel or lubricating oil) have a density between 0.85 and 0.9. To calculate the average kinematic viscosity for this fuel oil, the average of the measured absolute viscosity (3400 cP.) is multiplied by the density of the oil. For a density of about 0.85, the kinematic viscosity is about 4000 cSt. For a density of about 0.9, the kinematic viscosity is about 3777cSt. The kinematic viscosity of the available fuel oil is between about 3777 and about 4000 cSt. measured at room temperature (about 25° C.).

Light/Medium Oil

Three different mono-grade oil types available in the local Lebanese market were selected for the light and medium oil experiments each with a different viscosity as shown in Table II.

TABLE II

| Viscosity of light and medium oil samples | | |
|---|---|---|
| Viscosity (cSt) | Name | Description |
| 680 cSt | BP Energol GR-XP 680 | Industrial Extreme Pressure Gear Oil |
| 140 cSt | Power Gear 140 W | Automotive Gear Oil |
| 10 cSt | Power 10 W | Engine Oil |

Preliminary Experiments

Experiments were first conducted on the proposed capacitive sensor to assess its ability to differentiate between air, water, and oil. The configuration parameters of the MPR121 modules were set to 16 µA charge current, 0.5 µsec charge time duration, and 1ms period time.

Experiment 1—Sensor in Air

Figure 8:
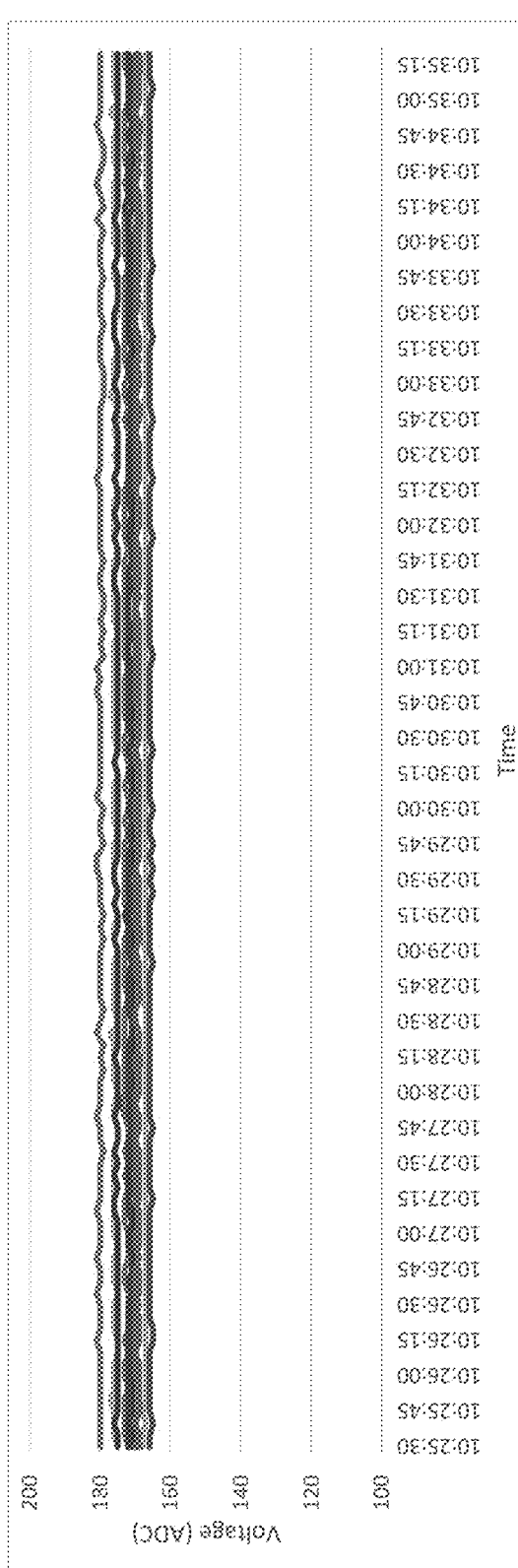
FIG. 8 is a graph of the Experiment 1 for the Sensor in Air.

In this experiment, the sensor was immersed only in the air, the values of the first twelve electrodes were measured and logged every five seconds. An instance of experimental results is shown in Table III, and the corresponding graph is shown in FIG. 8.

TABLE III

Experiment 1 (Air)-Numerical Values

| Time | E1 | E2 | E3 | E4 | E5 | E6 | E7 | E8 | E9 | E10 | E11 | E12 |
|---|---|---|---|---|---|---|---|---|---|---|---|---|
| 10:25:30 | 180 | 170 | 168 | 172 | 170 | 175 | 172 | 175 | 169 | 171 | 166 | 170 |
| 10:25:35 | 180 | 170 | 168 | 173 | 171 | 176 | 172 | 175 | 170 | 171 | 166 | 169 |
| 10:25:40 | 180 | 170 | 167 | 173 | 170 | 176 | 172 | 176 | 170 | 172 | 165 | 170 |
| 10:25:45 | 180 | 170 | 168 | 173 | 171 | 176 | 172 | 175 | 169 | 171 | 166 | 169 |
| 10:25:50 | 180 | 169 | 167 | 173 | 170 | 177 | 172 | 175 | 169 | 171 | 166 | 169 |
| 10:25:55 | 180 | 170 | 167 | 172 | 170 | 176 | 172 | 175 | 169 | 171 | 166 | 169 |
| 10:26:00 | 180 | 170 | 167 | 173 | 170 | 176 | 172 | 175 | 169 | 171 | 166 | 170 |
| Average | 180 | 170 | 167 | 173 | 170 | 176 | 172 | 175 | 169 | 171 | 166 | 169 |

Note how the results show the difference between the absolute voltages measured by each electrode while placed in the same medium (air). This difference is primarily attributed to the resulting inevitable manufacturing inconsistencies between each electrode, including issues such as trace length, soldering, and connectors. However, since the oil thickness estimation algorithm is based on relative, and not the absolute voltage measurements, the difference between the measured values will not affect the accuracy of the results. More importantly is the stability and repeatability of the measured values over time.

Experiment 2—Locating the Oil/Water Interface (Light-oil)

Figure 9:
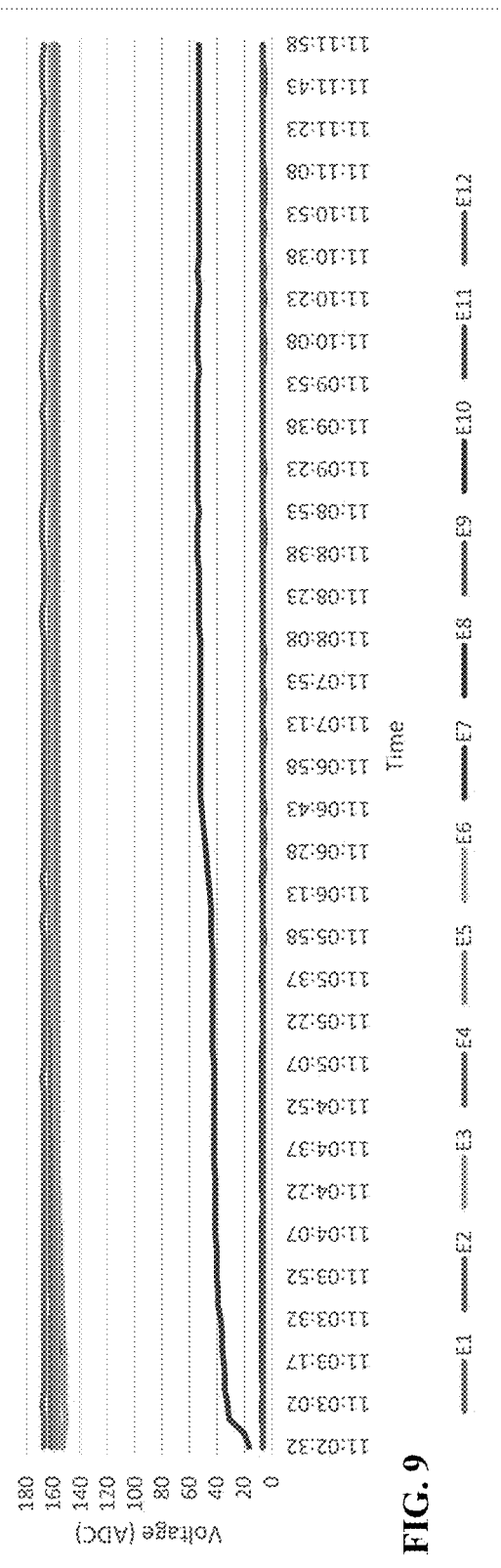
FIG. 9 is a graph of the Experiment 2 for the Light Oil/Water.

The aim of this experiment is to monitor the effect of oil on the actual voltage value measured by each electrode. The sensor was placed initially in water, and light oil (10 cSt) was gradually added to the container; this procedure ensures no oil contact with the bottom sensor electrodes during immersion. Thus, the first six electrodes from the top of the sensor were covered with oil, and the remaining electrodes are immersed in water. Voltage values of the first twelve electrodes were measured every five seconds; an instance of experimental results is shown in Table IV, and the corresponding graph is shown in FIG. 9.

TABLE IV

Experiment 2 (Light Oil/Water)-Numerical Values

| Time | E1 | E2 | E3 | E4 | E5 | E6 | E7 | E8 | E9 | E10 | E11 | E12 |
|---|---|---|---|---|---|---|---|---|---|---|---|---|
| 11:11:03 | 168 | 157 | 157 | 162 | 159 | 162 | 53 | 6 | 6 | 6 | 5 | 6 |
| 11:11:08 | 167 | 157 | 158 | 162 | 159 | 162 | 53 | 6 | 6 | 6 | 5 | 6 |
| 11:11:13 | 167 | 157 | 158 | 162 | 159 | 162 | 53 | 6 | 6 | 6 | 6 | 6 |
| 11:11:18 | 168 | 157 | 158 | 162 | 159 | 162 | 53 | 6 | 6 | 6 | 6 | 6 |
| 11:11:23 | 168 | 157 | 157 | 162 | 159 | 162 | 53 | 6 | 6 | 6 | 6 | 6 |
| 11:11:28 | 168 | 157 | 158 | 162 | 160 | 162 | 53 | 6 | 6 | 6 | 6 | 6 |
| 11:11:33 | 167 | 157 | 157 | 162 | 159 | 162 | 53 | 6 | 6 | 6 | 6 | 6 |
| 11:11:43 | 168 | 157 | 157 | 162 | 159 | 162 | 53 | 6 | 6 | 6 | 5 | 6 |
| 11:11:48 | 168 | 157 | 157 | 162 | 159 | 162 | 53 | 6 | 6 | 6 | 5 | 6 |
| 11:11:53 | 168 | 157 | 158 | 162 | 159 | 162 | 53 | 6 | 6 | 6 | 6 | 6 |
| 11:11:58 | 167 | 157 | 157 | 162 | 159 | 162 | 53 | 6 | 6 | 6 | 6 | 6 |
| Average | 168 | 157 | 157 | 162 | 159 | 162 | 53 | 6 | 6 | 6 | 6 | 6 |

As seen in FIG. 9, the results show that the voltage measured by the bottom five electrodes (E8-E12) was much lower than the voltage measured by the other electrodes. This result was expected because the dielectric constant of water (80) is much higher than the dielectric constant of the other non-conductive mediums (air=1, oil=2.1). Also, the voltage of the first five electrodes (covered by oil) was lower than the voltage read by the same electrodes while placed in the air medium (experiment 1). The voltage measured by the seventh electrode (E7) was partially decreased because of it being located at the interface of oil and water, and accordingly being partially immersed in oil. These results proved the viability of disclosed approach in estimating oil thickness.

Experiment 3—Locating the Oil/Air Interface (Light Oil)

Figure 10:
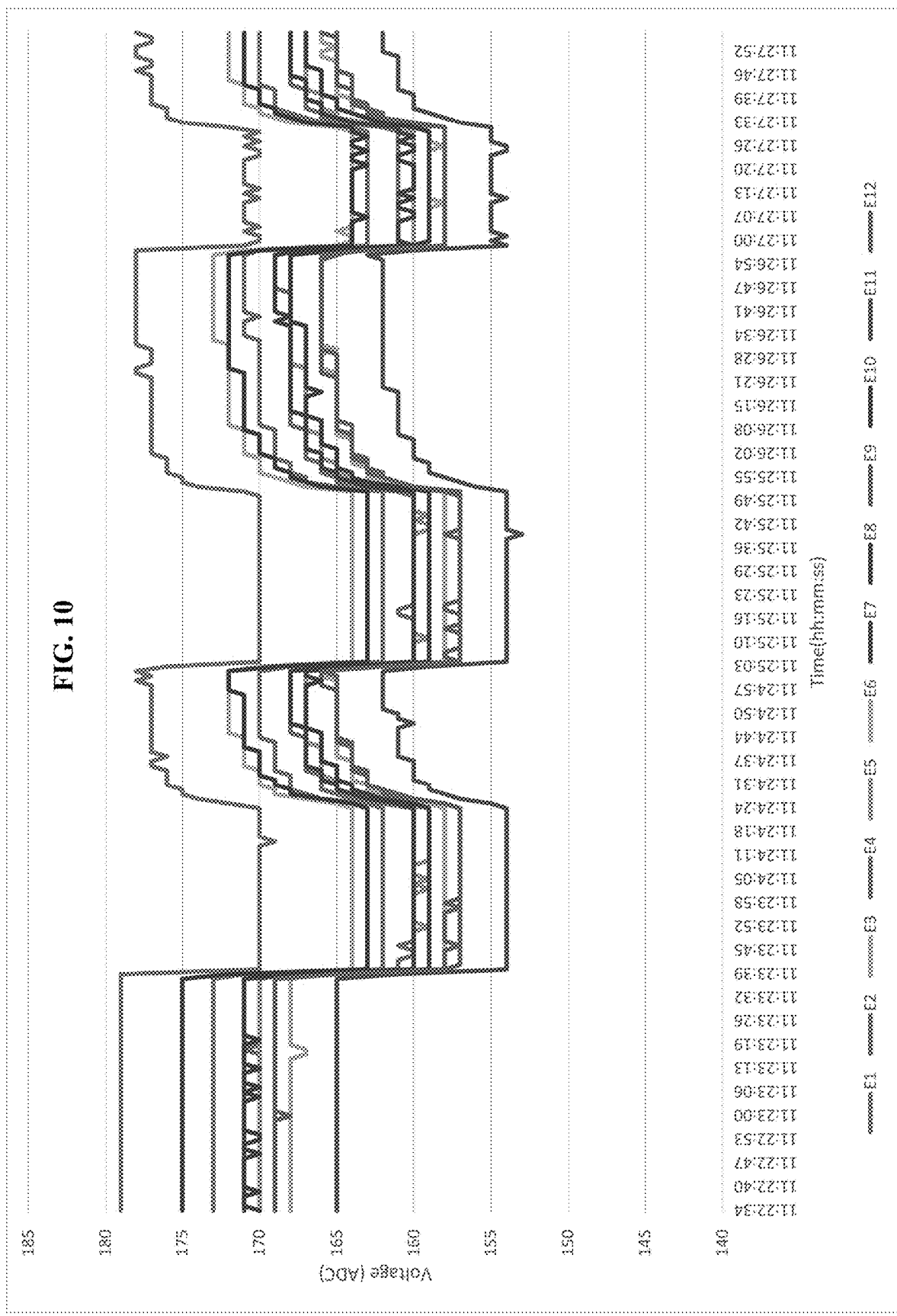
FIG. 10 is a graph of the Experiment 3 for the Air/Light Oil.

The aim of experiment 3 is to monitor the difference between the voltage measured by the sensor electrodes while moving the sensor between the air and oil mediums. The voltage measured by the first twelve electrodes of the sensor were recorded while moving the sensor vertically between the two mediums. A measurement was recorded every second. An instance of the experimental results is shown in Table V and the corresponding graph is shown in FIG. 10.

TABLE V

Experiment 3 (Air/Oil)-Numerical Values

| Time | E1 | E2 | E3 | E4 | E5 | E6 | E7 | E8 | E9 | E10 | E11 | E12 | Status |
|---|---|---|---|---|---|---|---|---|---|---|---|---|---|
| 11:23:27 | 179 | 170 | 168 | 173 | 170 | 175 | 171 | 175 | 169 | 171 | 165 | 169 | Air |
| 11:23:29 | 179 | 170 | 168 | 173 | 170 | 175 | 171 | 175 | 169 | 171 | 165 | 169 | |
| 11:23:30 | 179 | 170 | 168 | 173 | 170 | 175 | 171 | 175 | 169 | 171 | 165 | 169 | |
| 11:23:31 | 179 | 170 | 168 | 173 | 170 | 175 | 171 | 175 | 169 | 171 | 165 | 169 | |
| 11:23:32 | 179 | 170 | 168 | 173 | 170 | 175 | 171 | 175 | 169 | 171 | 165 | 169 | |
| 11:23:34 | 179 | 170 | 168 | 173 | 170 | 175 | 171 | 175 | 169 | 171 | 165 | 169 | |
| 11:23:35 | 179 | 170 | 168 | 173 | 170 | 175 | 171 | 175 | 169 | 171 | 165 | 169 | |
| 11:23:36 | 179 | 170 | 168 | 173 | 170 | 175 | 171 | 175 | 169 | 171 | 165 | 169 | |
| 11:23:38 | 179 | 170 | 168 | 173 | 170 | 175 | 171 | 175 | 169 | 171 | 165 | 169 | |
| 11:23:39 | 179 | 169 | 166 | 171 | 168 | 172 | 168 | 172 | 165 | 167 | 161 | 165 | |
| 11:23:40 | 170 | 161 | 158 | 162 | 160 | 164 | 160 | 163 | 158 | 159 | 154 | 158 | Oil |
| 11:23:41 | 170 | 161 | 158 | 162 | 160 | 164 | 160 | 163 | 158 | 159 | 154 | 157 | |
| 11:23:43 | 170 | 161 | 158 | 162 | 160 | 164 | 160 | 163 | 158 | 159 | 154 | 157 | |
| 11:23:44 | 170 | 160 | 158 | 162 | 160 | 164 | 160 | 163 | 158 | 159 | 154 | 157 | |
| 11:23:45 | 170 | 160 | 158 | 162 | 160 | 164 | 160 | 163 | 158 | 159 | 154 | 157 | |
| 11:23:47 | 170 | 161 | 158 | 162 | 160 | 164 | 160 | 163 | 157 | 159 | 154 | 157 | |
| 11:23:48 | 170 | 160 | 158 | 162 | 160 | 164 | 160 | 163 | 158 | 159 | 154 | 157 | |
| 11:23:49 | 170 | 160 | 158 | 162 | 160 | 164 | 160 | 163 | 158 | 159 | 154 | 157 | |
| 11:23:51 | 170 | 160 | 158 | 162 | 160 | 164 | 160 | 163 | 158 | 159 | 154 | 157 | |
| 11:23:52 | 170 | 160 | 158 | 162 | 159 | 164 | 160 | 163 | 158 | 159 | 154 | 157 | |
| 11:23:53 | 170 | 160 | 158 | 162 | 160 | 164 | 160 | 163 | 158 | 159 | 154 | 157 | |

The experiment shows an immediate change in the measured voltages upon moving between the oil and air mediums. Note that although the difference is small, the measured voltage in air is always higher than in oil.

Dealing with Oil Fouling

Coating the Capacitive Sensor

The use of a super-hydrophobic coating on the capacitive sensor acts as both protection for the copper strips and a repellant of any oil residue on the surface of the sensor. The Ultra-Ever-Dry product [13] provided by Ultratech [14] was tested.

Fuel-Oil Experiments

Experiment 1—Locating Oil/Water Interface

In this experiment, the sensor was immersed in fuel oil and water, the values of three electrodes were measured and logged every one second. The aim of this experiment is to monitor the sensor voltage readings while moving the sensor electrodes between fuel oil and water. The results of one of the experiments are shown in Table VI, and the corresponding graph is shown in FIG. 11. (Temperature: 23° C., RH: 60%).

TABLE VI

Fuel oil experiment 1-Numerical values

| Time | E8 | E9 | E10 |
|---|---|---|---|
| 3:19:13 | 165 | 160 | 159 |
| 3:19:14 | 165 | 161 | 159 |
| 3:19:15 | 166 | 161 | 159 |
| 3:19:16 | 166 | 161 | 159 |
| 3:19:17 | 166 | 161 | 158 |
| 3:19:18 | 166 | 161 | 159 |
| 3:19:19 | 166 | 161 | 159 |
| 3:19:20 | 166 | 161 | 159 |
| 3:19:21 | 166 | 161 | 159 |
| 3:19:22 | 166 | 162 | 160 |
| 3:19:23 | 166 | 162 | 160 |
| 3:19:24 | 166 | 162 | 161 |
| 3:19:26 | 166 | 162 | 161 |
| 3:19:27 | 167 | 162 | 162 |
| 3:19:28 | 167 | 162 | 162 |
| 3:19:29 | 167 | 162 | 162 |
| 3:19:30 | 167 | 162 | 162 |
| 3:19:31 | 167 | 162 | 162 |
| 3:19:34 | 167 | 162 | 162 |
| 3:19:35 | 167 | 162 | 162 |
| 3:19:36 | 167 | 162 | 162 |
| 3:19:37 | 167 | 162 | 162 |
| 3:19:39 | 167 | 162 | 162 |
| 3:19:40 | 167 | 162 | 162 |
| 3:19:41 | 167 | 162 | 162 |
| 3:19:42 | 167 | 163 | 162 |
| 3:19:43 | 167 | 163 | 162 |
| 3:19:44 | 167 | 163 | 162 |
| 3:19:45 | 168 | 163 | 162 |
| 3:19:46 | 168 | 163 | 162 |
| 3:19:47 | 168 | 163 | 161 |
| 3:19:48 | 168 | 163 | 161 |
| 3:19:49 | 168 | 163 | 161 |
| 3:19:50 | 168 | 163 | 160 |
| 3:19:52 | 164 | 158 | 157 |
| 3:19:53 | 161 | 156 | 156 |
| 3:19:54 | 160 | 156 | 156 |
| 3:19:55 | 160 | 156 | 156 |
| 3:19:56 | 160 | 156 | 156 |
| 3:19:57 | 160 | 156 | 156 |
| 3:19:58 | 160 | 156 | 156 |
| 3:19:59 | 160 | 156 | 155 |
| 3:20:00 | 160 | 156 | 155 |
| 3:20:01 | 160 | 155 | 155 |
| 3:20:03 | 160 | 156 | 155 |
| 3:20:04 | 160 | 156 | 155 |
| 3:20:06 | 161 | 156 | 155 |
| 3:20:13 | 165 | 158 | 157 |
| 3:20:14 | 165 | 158 | 157 |
| 3:20:15 | 166 | 158 | 157 |
| 3:20:16 | 166 | 159 | 157 |
| 3:20:17 | 167 | 159 | 157 |
| 3:20:19 | 167 | 160 | 158 |
| 3:20:20 | 167 | 160 | 158 |
| 3:20:21 | 168 | 161 | 158 |
| 3:20:22 | 168 | 162 | 159 |
| 3:20:23 | 168 | 162 | 159 |
| 3:20:24 | 168 | 163 | 159 |
| 3:20:25 | 167 | 163 | 160 |
| 3:20:26 | 168 | 163 | 160 |
| 3:20:27 | 167 | 163 | 160 |
| 3:20:28 | 167 | 163 | 161 |
| 3:20:29 | 167 | 163 | 161 |
| 3:20:30 | 167 | 163 | 160 |
| 3:20:32 | 167 | 163 | 160 |
| 3:20:33 | 167 | 163 | 160 |
| 3:20:34 | 167 | 163 | 159 |
| 3:20:35 | 167 | 162 | 159 |
| 3:20:36 | 165 | 158 | 157 |
| 3:20:37 | 161 | 156 | 156 |
| 3:20:38 | 161 | 156 | 156 |
| 3:20:39 | 161 | 156 | 156 |
| 3:20:40 | 161 | 156 | 156 |
| 3:20:41 | 161 | 156 | 156 |
| 3:20:42 | 161 | 156 | 156 |
| 3:20:43 | 161 | 156 | 156 |
| 3:20:45 | 161 | 156 | 155 |
| 3:20:46 | 161 | 156 | 155 |
| 3:20:47 | 161 | 156 | 155 |
| 3:20:48 | 161 | 156 | 155 |
| 3:20:49 | 161 | 156 | 155 |
| 3:20:50 | 161 | 156 | 155 |
| 3:20:51 | 161 | 156 | 155 |
| 3:20:52 | 161 | 156 | 155 |
| 3:20:53 | 161 | 156 | 156 |
| 3:20:54 | 161 | 157 | 156 |
| 3:20:55 | 162 | 157 | 156 |
| 3:20:56 | 162 | 157 | 157 |
| 3:20:57 | 163 | 157 | 157 |
| 3:20:59 | 164 | 158 | 157 |
| 3:21:00 | 165 | 158 | 157 |
| 3:21:01 | 166 | 159 | 157 |
| 3:21:02 | 167 | 159 | 158 |
| 3:21:03 | 167 | 160 | 158 |

The results show the difference between the absolute voltage measured by each electrode while moving between fuel oil and water. The high values illustrated in FIG. 11 correspond to values measured while the electrodes are in fuel-oil, and the low values correspond to values measured in water. Although the sensor electrodes are completely covered with a thin layer of oil after being immersed in the fuel oil for the first time (due to its high viscosity), the voltage values measured by the electrodes, while being immersed in oil are different from the values measured in the water, despite being covered with fuel oil. This difference is used in the algorithm to distinguish between oil/water interfaces.

Experiment 2—Locating Oil/Air Interface

The aim of this experiment is to monitor the difference between the voltage measured by the sensor electrodes while moving between fuel oil and air. Voltage values of two electrodes were measured every one second; experimental results for one of the experiments are shown in Table VII, and the corresponding graph is shown in FIG. 12. (Temp: 23° C., RH: 60%).

TABLE VII

Fuel oil experiment 2- Numerical values

| Time | E6 | E7 |
|---|---|---|
| 2:21:50 | 172 | 167 |
| 2:21:51 | 172 | 167 |
| 2:21:52 | 172 | 167 |
| 2:21:53 | 172 | 167 |
| 2:21:54 | 172 | 167 |
| 2:21:55 | 172 | 167 |
| 2:21:56 | 172 | 167 |
| 2:21:57 | 172 | 167 |
| 2:21:58 | 172 | 167 |
| 2:22:00 | 172 | 167 |
| 2:22:01 | 172 | 167 |
| 2:22:02 | 172 | 167 |
| 2:22:03 | 172 | 167 |
| 2:22:04 | 172 | 167 |
| 2:22:05 | 172 | 167 |
| 2:22:06 | 170 | 163 |
| 2:22:07 | 166 | 160 |
| 2:22:08 | 164 | 160 |
| 2:22:26 | 170 | 165 |
| 2:22:27 | 170 | 165 |
| 2:22:28 | 170 | 165 |
| 2:22:29 | 170 | 165 |
| 2:22:30 | 170 | 165 |
| 2:22:31 | 170 | 165 |
| 2:22:32 | 170 | 165 |
| 2:22:33 | 170 | 165 |
| 2:22:34 | 170 | 165 |
| 2:22:35 | 170 | 165 |
| 2:22:36 | 170 | 165 |
| 2:22:37 | 170 | 165 |
| 2:22:39 | 170 | 166 |
| 2:22:40 | 170 | 165 |
| 2:22:41 | 170 | 166 |
| 2:22:42 | 170 | 165 |
| 2:22:43 | 170 | 165 |
| 2:22:44 | 170 | 166 |

The results show that the voltage measured by the two electrodes (E6-E7), while moving between fuel-oil and air is different. In the last part of the experiment, the rate of movement was increased thus producing a higher frequency signal, as shown in FIG. 12. This result reveals that the sensor is feasible for oil types with high viscosity such as the tested fuel oil.

Environmental Conditions Effect

To assess the environmental conditions (temperature and relative humidity) effect on the measurements two experiments were conducted. In the first experiment, the sensor was placed in open air, and the readings were logged every 30 sec. During the 16-hour experiment, the relative humidity varied between 72% and 58% and the temperature ranged from 21° C. to 24.7° C. The span of measurement for each electrode was very limited and didn't exceed 3.8% in the worst case.

In the second experiment, the sensor was placed in a closed room where the temperature and humidity were changing relatively fast due to air conditioning. During the experiment, the relative humidity varied between about 60% and about 46% and the temperature varied between about 21.2° C. and about 24.7° C. The span of measurement for each electrode was very limited and didn't exceed about 2.7% in the worst case.

These results provide initial evidence that the sensor repeatability will be high under different environmental conditions.

Algorithm for Estimating the Oil Thickness

The measurement algorithm aims to produce a vertical profile of the examined liquid. Oil thickness is calculated based on the sensor geometrical dimensions after counting the number of electrodes immersed in oil. Several approaches were evaluated to detect the most accurate and reliable method to estimate the oil thickness in all cases (static/dynamic). The following sections describe the main evaluated methods.

K-Means Algorithm

Figure 13:
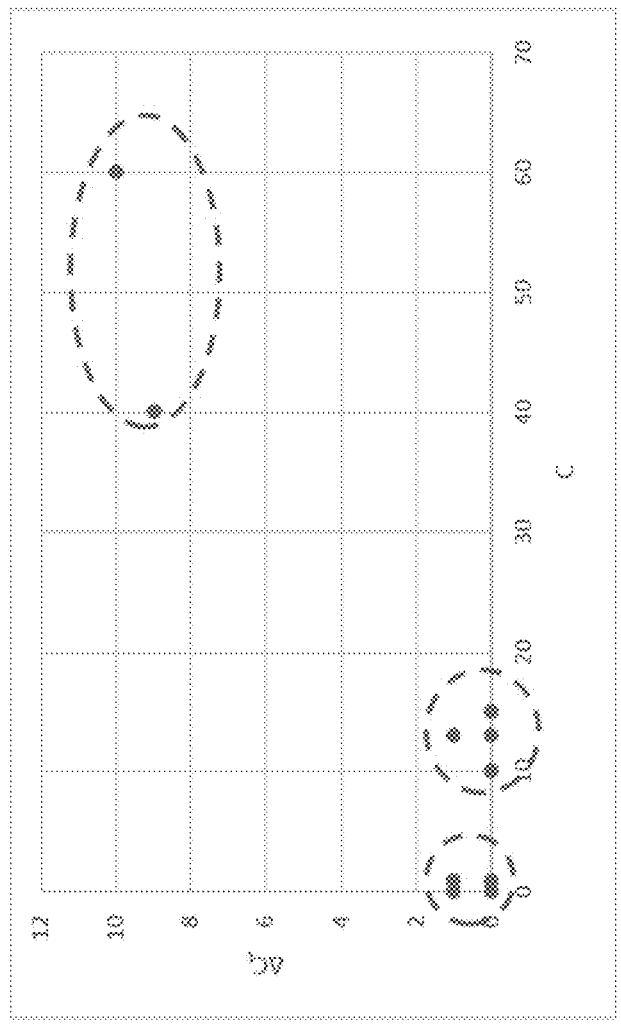
FIG. 13 is a graph of C vs. ACt.

Before implementing any algorithm to estimate oil thickness, the experimental results were plotted on a C vs. ΔCt graph, where C is the difference between the baseline capacitance (in air) of each strip and its capacitance in its residing medium; ΔCt is the transient change in C, representing how fast the oil is slipping off a strip (FIG. 13).

In this graph, the obvious clustering of data points is noted according to the medium they are in. Accordingly, the group data points were based on a feature vector comprised of C and ΔCt using K-Means [15] as the clustering method, since it is known to produce good results when the number of clusters is known beforehand. Here, three clusters were chosen, representing air, oil, and water. To implement the algorithm in real-time, software was developed using Microsoft Windows Forms .Net (C#) framework. The results of the measurement algorithm including the estimated oil-thickness (mm) and the index of electrodes included in each cluster and the raw voltage measurements are shown in the Graphical User Interface of the application (FIG. 14).

Figure 14:
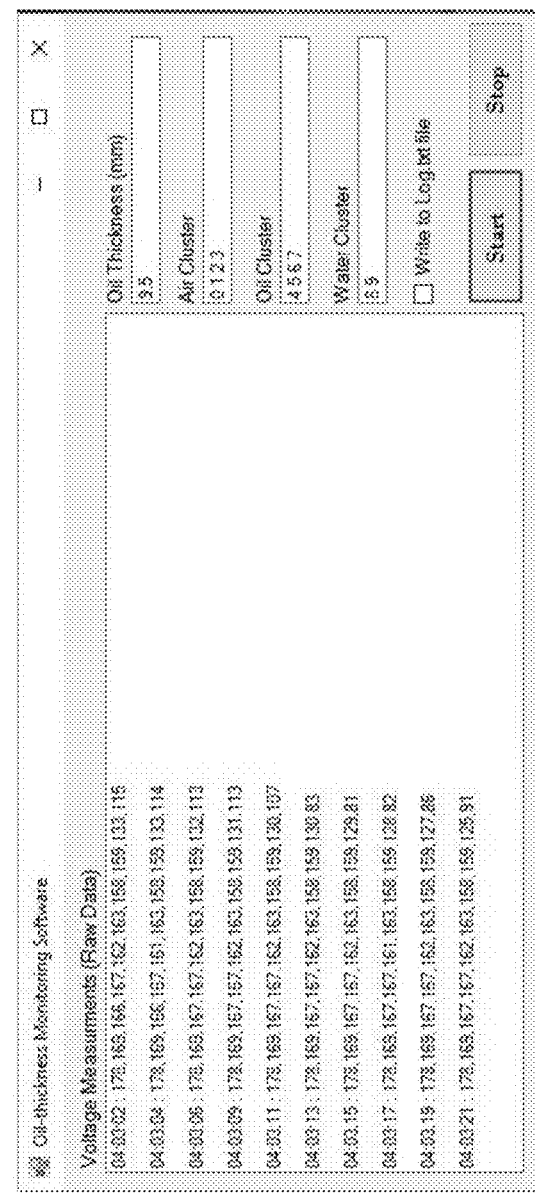
FIG. 14 is a chart showing the K-means algorithm results.

As shown in FIG. 14, the activated electrodes (first ten) are clustered into three different groups (air/oil/water). The index of each electrode classified into one of the three clusters is shown in the FIG. 14. The sensor was immersed vertically from the air medium into the oil/water medium. Notice that, as expected, the decreasing values of the bottom two electrodes (E8 & E9) didn't affect the classification decision since the rate of change is considered as the second attribute of clustering. The estimated number of oil electrodes (4) in this case was identical to the actual number of electrodes immersed in oil as observed visually.

Although the results of the K-means algorithm were accurate while the sensor was not moving (static case), the results were highly affected by the sensor continous vertical movement (dynamic case) since this scenario might introduce different cases including stripes that are in transition between mediums.

Thickness Estimation Based on Interfaces Detection

Another approach was implemented and tested to detect the oil thickness based on the difference between the air/oil interface and the oil/water interface. To test the algorithm, an experiment was conducted using a sampling rate of 1/300msec. The oil type used is a light engine oil (10W-40). The sensor was immersed in an oil/water mixture with 1 cm of oil thickness. The experiment was implemented in the lab under a temperature of 24° C. and relative humidity of 59%. The experimental results shown in Table XV (FIG. 15) represent the percentage difference of each electrode voltage measurement with the calibration value taken in air.

Figure 16:
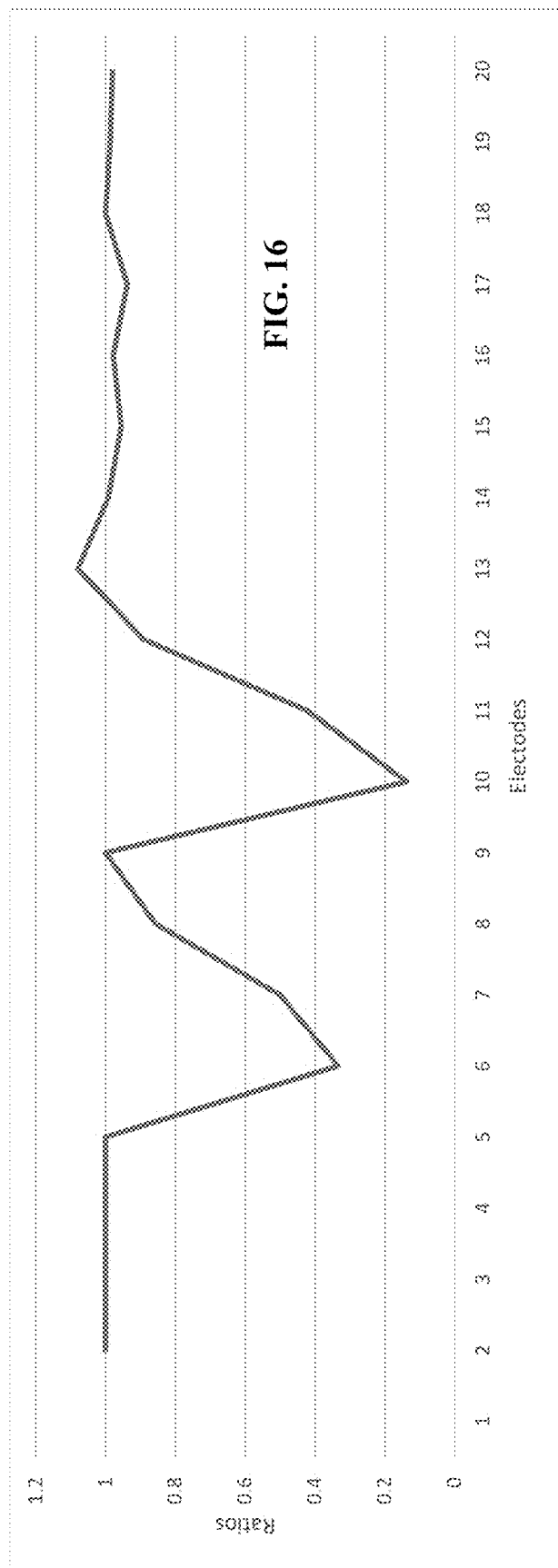
FIG. 16 is graph showing the Interfaces detection algorithm—Ratios.

To get the oil thickness, one way is to calculate the difference between the index of an electrode located at the oil/water interface and the index of the electrodes located at the air/oil interface. To do so, the interfaces should be identified by an algorithm based on relative electrode behavior. Depending on the results shown in Table XV FIG. 15), a clear difference between the values before and after electrode E5 was noticed. Also, electrode E9 shows a similar behavior. After calculating the average of the presented readings for each electrode, a new parameter is introduced named "ratios" calculated by dividing the average of each electrode of index "i" with its neighbor electrode of index "i+1", shown in last row of Table XV (FIG. 15). Since the ratios are calculated by performing division operations, the algorithm replaces zero values by one to avoid division errors. FIG. 16 shows the graph of the calculated ratios shifted by one electrode to the right.

As shown in FIG. 16, the electrodes located at the interface layers (E6 and E10) show a severe drop in the computed ratios. To get the index of each interface electrode, the algorithm proceeds by getting the first two minima of the ratios series. Then the difference between the indexes of the two minimum electrodes is calculated (E10 -E6=4). This difference is used for calculating the oil thickness based on the electrodes geometrical dimensions.

This method is proved to give accurate results in the static case only, since after testing it for several iterations while moving the sensor vertically through the examined liquid, a high error was observed in detecting the air/oil interface due to the small difference in the dielectric constants between air and oil and the decreased signal to noise ratio due to movement.

Based on the results obtained from the first two methods, the algorithm must detect the static case versus the dynamic case and focus on the strips that are exhibiting change because those would be the electrodes that are transitioning between mediums.

Uncertainty Analysis in the Static Case (Light Oil)

After implementing the measurement algorithm, the capacitive sensor was tested in static mode and accuracy results were calculated after taking a set of thickness measurements. Based on finding the maximum spatial gradients in an iterative manner, the air/oil and water/oil interfaces were detected and the number of electrodes located between them is used to calculate the thickness. Two cases were tested in this experiment. The first case represents applying the measurement algorithm on each voltage reading without using any averaging. In the second case, a moving average of the voltage readings is used before applying the measurement algorithm. To calculate the moving average, each new voltage reading is added to the voltage measurements taken before and divided by two. The following are the results of the measurement accuracy. In each case, the averages of around three hundred measurements were taken. The oil used is light-oil with a viscosity of 10 cSt. The experiment was done indoor under a temperature of around 24°. The first case results are shown in Table VIII and the second case measurements are shown in Table IX.

TABLE VIII

Capacitive Static Experiment Results (Case 1)

| Index of Oil/Water Interface | Index of Water/Oil Interface | Oil Interval | Measured Thickness (mm) | Actual Thickness (mm) | Percentage Error (%) |
|---|---|---|---|---|---|
| 29 | 24.05 | 4.94 | 11.86 | 12.5 | 5.08 |

TABLE IX

Capacitive Static Experiment Results (Case 2)

| Index of Oil/Water Interface | Index of Water/Oil Interface | Oil Interval | Measured Thickness (mm) | Actual Thickness (mm) | Percentage Error (%) |
|---|---|---|---|---|---|
| 29 | 24 | 5 | 12 | 12.5 | 4 |

The experimental results show that after applying the moving average (Case 2) the percentage error is reduced from 5% to 4%. Note that this accuracy is accepted due to the nature of the sensor relying on discrete electrodes having a width of 2 mm and a vertical gap of 0.5 mm. Note that in case 1, the error occurred at detecting the Air/Oil interface due to the small difference of the dielectric constants of the two mediums.

Dynamic Case Analysis

Figure 17:
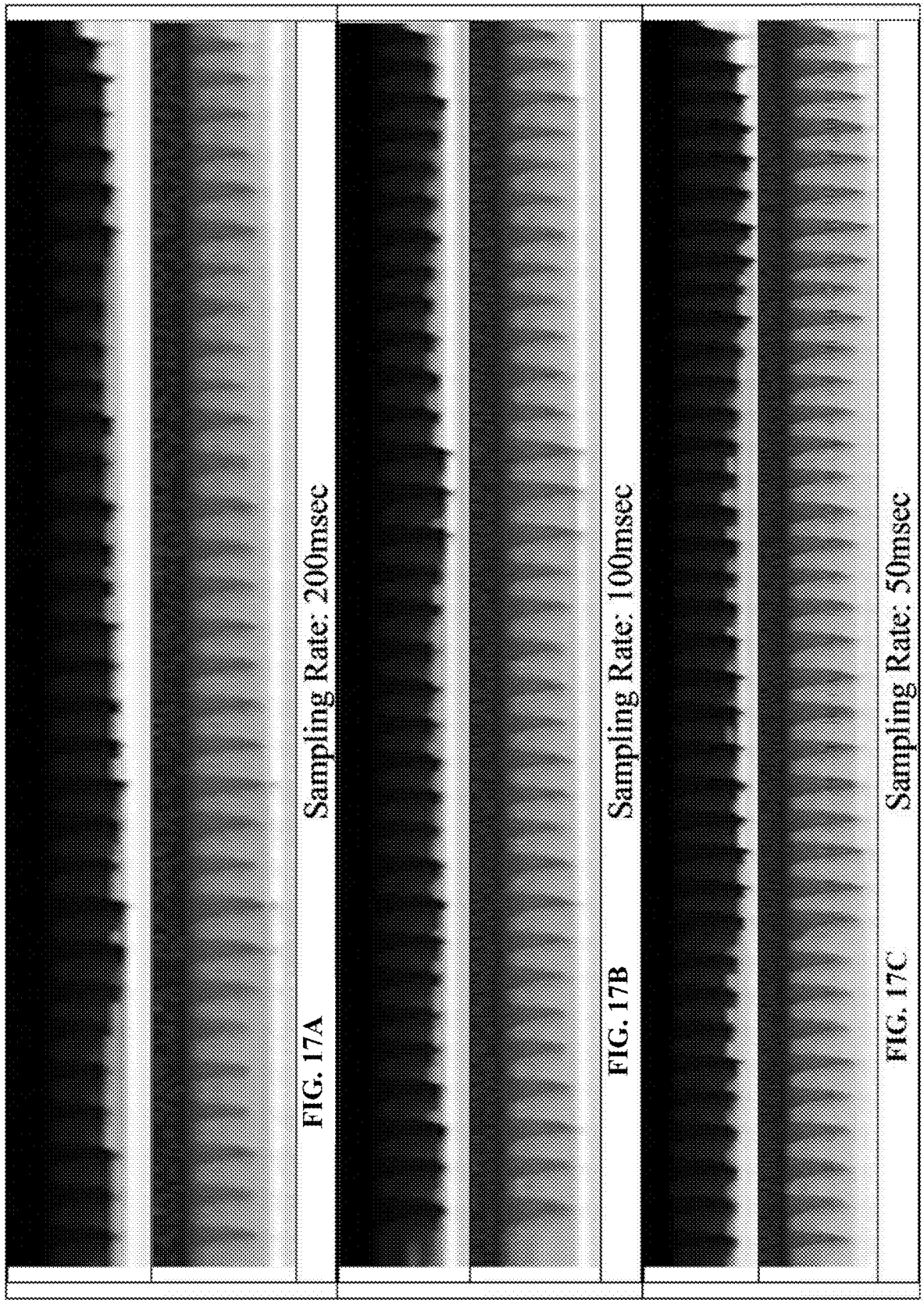
FIGS. 17A-17C are graphs showing the Sensor output versus time grayscale representation with a Sampling Rate: 50 msec (FIG. 17A); Sampling Rate 100 msec (FIG. 17B); and Sampling Rate 200 msec (FIG. 17C).

To enhance the visualization of the measurements, voltages were stored in two-dimensional arrays and converted to grayscale images. As shown in FIG. 17A, 17B, and 17C, a clear variation is observed in the color with the movement of the sensor. This observation gives a description of the wave properties such as its amplitude and frequency. Note that the image in the first row of each figure is the original image and the image in the second row is obtained after applying the histogram equalization to produce better contrast. The y-axis corresponds to the electrode index (starting from the top), and the x-axis corresponds to time. The y-axis represents the relative difference in capacitance of all the strips, starting with the ones in the air at the top (in black), to the ones in oil (in gray) and the ones in water (in white).

After analyzing the obtained images, a multi-case algorithm was developed to detect the oil thickness in all cases. The new algorithm is described in the following section.

Multi-Case (Static or Dynamic)

Figure 18:
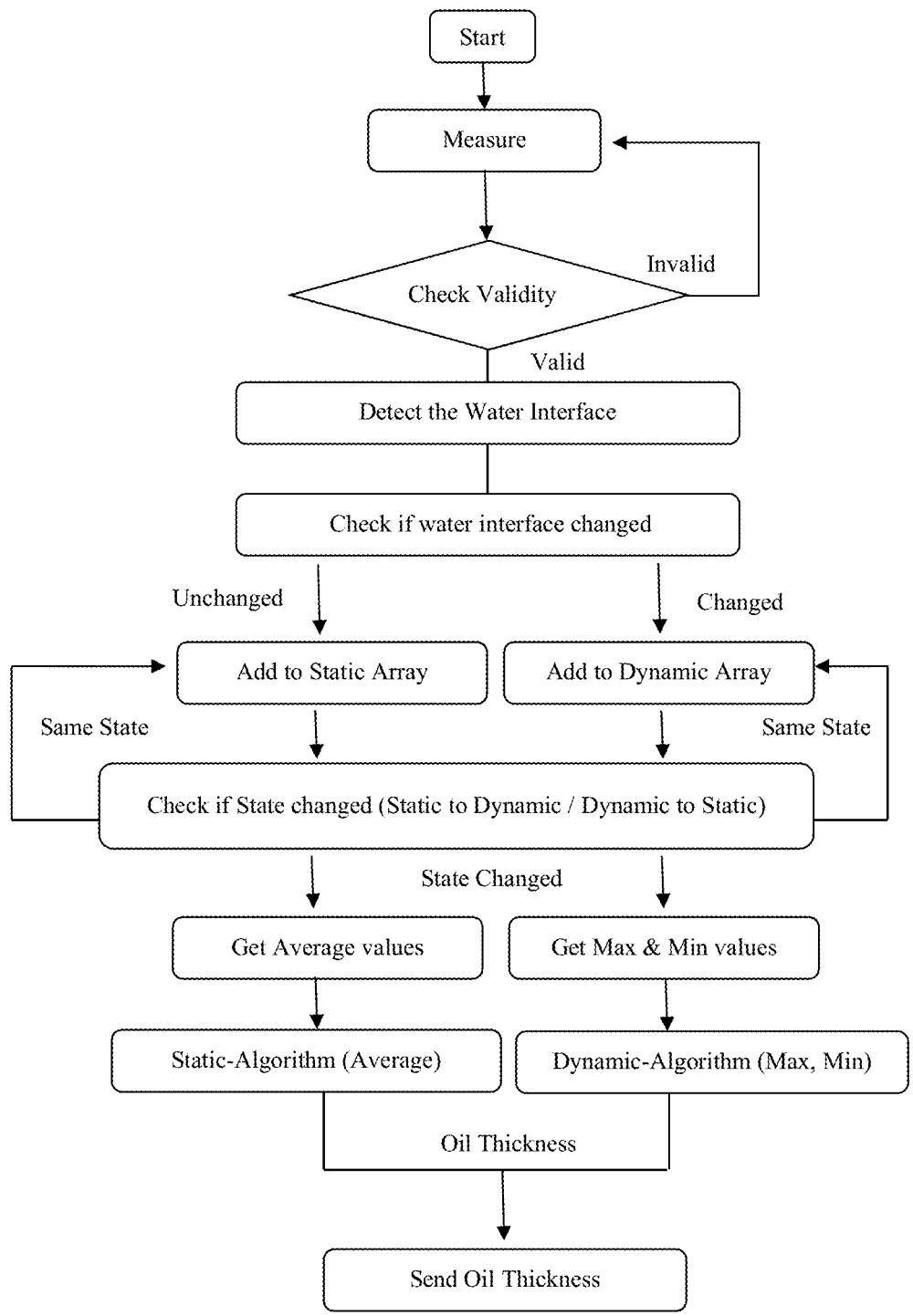
FIG. 18 is a schematic of the Multi-case Algorithm Flowchart.

The multi-case algorithm processes the voltage values acquired from the sensor and decides on the sensor state before selecting the suitable criteria for measuring the actual thickness. The algorithm uses two different approaches to detect the oil electrodes based on the sensor dynamic state. The first method relies on the differences between the real-time voltage values and the calibration voltage values. This method is used when the sensor is in a stationary mode. The second approach is based on the temporary differences between the raw sensor values only and doesn't use the calibration values. The second method is applied when the sensor is moving vertically relative to oil within the examined liquid. The flowchart shown in FIG. 18 summarizes the multi-case algorithm.

Calibration

The calibration voltage values are acquired while the sensor is completely dry and placed in open-air for a preset duration of time. For each electrode, the average of all measured voltages is stored in a one-dimensional array. While operating, the relative voltage difference (R) of each electrode of index 'i' is calculated using the following equation:

$$R(\%) = \frac{|\text{Current}[i] - \text{Calibration}[i]|}{\text{Calibration}[i]} \times 100 \quad (1)$$

Detecting the Water Interface

During a certain interval of time, a set of voltage measurements for all electrodes are acquired and stored in a two-dimensional array, where the number of columns corresponds to the number of the activated electrodes, and the number of rows corresponds to the number of measurements taken within the time interval. Before storing the measurement vector, a validity check is applied on the acquired values to check if the measurement is taken while the sensor is in a valid sensing position. A sensing position is set to be valid when at least one of the bottom sensor electrodes presents a relatively-high percentage difference from calibration (ex. More than 50%), indicating that it is immersed in water.

For each measurement, the water interface is calculated and stored in a separate array named Levels. Since the major difference in the obtained values is between the electrodes immersed in water and the other electrodes surrounded by air or oil, the water interface for each measurement (K) is calculated by using the following method named Detect-Interface:

Detect-Interface (Values-Vector), then Create a one-dimensional array (Votes) of size N. Votes=zeros (1, N). Then Calculate votes of each electrode with an index=2. While (index<N). Votes(index)=mean (Values (index+1: N)−mean (Values (1: index-1)). The Max_Value=MAX(Votes). Then get the index of the interface with the maximum value of votes. Interface=get. Index (Max_Values). Then Return the index of the interface. The Return Interface, where "N" is the total number of electrodes, "I" is the electrode index, and "K" is the measurement index.

Detecting the Sensor State

Based on the detected water interfaces stored in the "Levels" array, the sensor state is detected as dynamic or static. For each state, a new two-dimensional array is created to store the voltage values of each electrode as the sensor is in the same state. When a change in state is detected, the measurement method is applied to get the oil thickness. The measurement methods for each case (static/dynamic) will be described in the following section. To decide about the sensor state, for each measurement (K) the following process is applied:

For the Dynamic Case: While levels are changing (increasing or decreasing). While (Levels(K)!=Levels(K-1)). Then Store Values vector in a temporary matrix named Dynamic. Dynamic (K)=Values(K); if the is State changed then Clear (Dynamic). Get the Maximum value of each electrode and store it in a new vector. Max=MAX(Dynamic). Get the Minimum value of each electrode and store it in a new vector. Min=MIN(Dynamic). Then Call the Dynamic-Algorithm to calculate the oil-thickness. Oil Thickness=Dynamic-Algorithm (Max, Min)

For the Static Case: Counter=1. While the sensor is not moving. While (Levels(K) Levels(K-1)). Add values vector to a temporary matrix. Static (K)=Values(K). IF (Counter>20) {Break}, then State changed or number of values>20. Clear (Static), then Calculate the average of each electrode values and stored it in a new vector. Average=Mean(Static). Then Call the Static-Algorithm to calculate the actual oil thickness. Where Oil Thickness=Static-Algorithm (Average)

Where "K" is the measurement index, and "Dynamic/Static" are a temporary two-dimensional matrix to store values when the sensor is in the same state. The Max and Min are created each time the state is changed and carries the maximum/minimum value for each electrode within the temporary matrix (Dynamic/Static). The Average vector is obtained by calculating the average value of each electrode after a state change is detected, or the number of static records exceeds a preset threshold.

Calculating the Oil Thickness

The number of oil electrodes is used in estimating the oil thickness (TH) by the following equation: Where N is the number of electrodes covered by oil, W is the electrode width=2 mm, and G=0.5 mm is the gap width separating between electrodes.

The Dynamic-Algorithm is used to get the oil thickness after a change in the dynamic state is detected. This method takes the Max and Min vectors as inputs and returns the actual oil thickness. The method can be summarized as the following:

Dynamic-Algorithm (Max, Min): Calculate the difference between each value in the Max and Min vectors. Diff-Vector=(Max)−(Min). Then Assign a threshold value to use for detecting the fixed and changed electrodes threshold=MAX(Max)−MAX(Min). Then to get the number of electrodes that changed mediums index=1; K=0; While (index<=N). IF (Diff-Vector[index]>threshold). Changed[C]=index. K=K+1. index=index+1. C=Length (Changed). Then to get the number of electrodes that are still in oil index=1; C=0; While (index<=N). Then the oil electrodes are located between the changed electrodes, IF ((Diff [index]<=threshold) and (index!>MAX(Changed) and (index! <MIN(Changed)). Fixed[C]=index. C=C+1. index=index+1. interval=Length(Changed/2)+Length (Fixed). If 2 mm is the width of each electrode and 0.5 mm is the vertical gap between them thickness=(interval) (2) +(interval-1) (0.5). Return (thickness).

In the static case, the temporary differences between voltage measurements cannot be used to calculate thickness since the sensor is not moving and values will not be changing except within the noise range. Instead, the relative differences from calibration are used to detect the air/oil and the oil/water interface iteratively. The Static-Algorithm takes the Average vector as an input parameter and returns the actual oil thickness. The method uses the Detect-Interface method described above can be summarized as follows:

Static-Algorithm (Average): Detect the oil/water interface, where WI=Detect-Interface (Average). Then remove all electrode indexes greater than the water interface. SV=Average (1: (WI-1)). Then Detect the air/oil interface. AI=Detect-Interface (SV); Calculate the number of oil electrodes. Interval=WI-AI; Calculate the oil thickness where thickness=(interval) (2)+(interval-1) (0.5), then Return (thickness).

Results of the Multi-Case Algorithm

After applying the multi-case algorithm to a set of measurements taken while the sensor was moved vertically at a random rate, emulating the real-case scenario of random waves, the estimated thickness was acceptable where the maximum number of misclassified electrodes was equal to one—which means that the maximum error was in the order of sensor resolution. The experimental results are shown in Table XVI.

TABLE XVI

Multi-Case Algorithm- Experimental results

| Thickness | Actual (mm) | Estimated (mm) |
|---|---|---|
| 1 | 27 | 27 |
| 2 | 27 | 27 |
| 3 | 27 | 29.5 |
| 4 | 27 | 27 |
| 5 | 27 | 27 |
| 6 | 27 | 24.5 |
| 7 | 27 | 27 |
| 8 | 27 | 27 |
| 9 | 27 | 27 |
| 10 | 27 | 27 |
| 11 | 27 | 27 |
| 12 | 27 | 27 |
| 13 | 27 | 24.5 |
| 14 | 27 | 27 |
| 15 | 27 | 24.5 |
| 16 | 27 | 27 |
| 17 | 27 | 27 |

TABLE XVI-continued

Multi-Case Algorithm- Experimental results

| Thickness | Actual (mm) | Estimated (mm) |
|---|---|---|
| 18 | 27 | 27 |
| 19 | 27 | 27 |
| 20 | 27 | 27 |
| Average | 27 | 26.75 |

As shown in Table XVI, the average of the measured oil thickness using the multi-case algorithm is 26.75 mm. Based on the actual thickness (27 mm) the percent error is calculated as 0.95%, which is acceptable.

Packaging; Capacitive Sensor; Preliminary Designs

Figure 19:
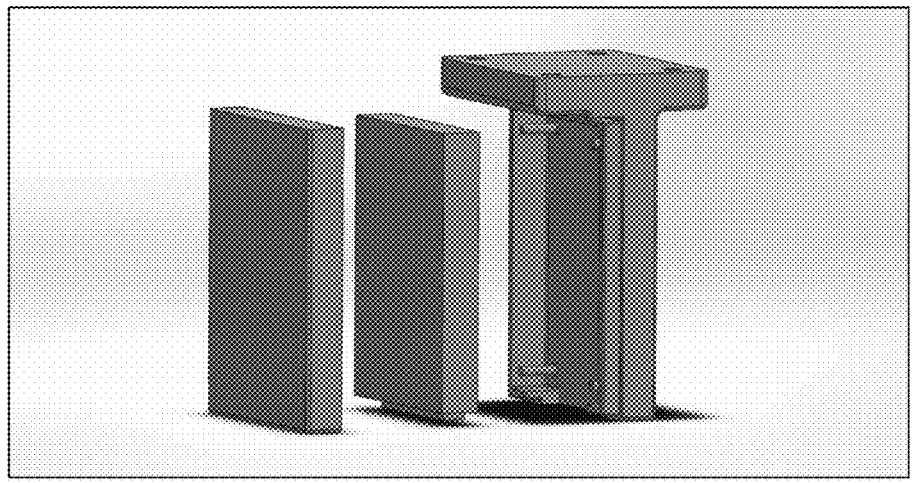
FIG. 19 is a perspective view of one embodiment of the Packaging prototype.
Figure 20:
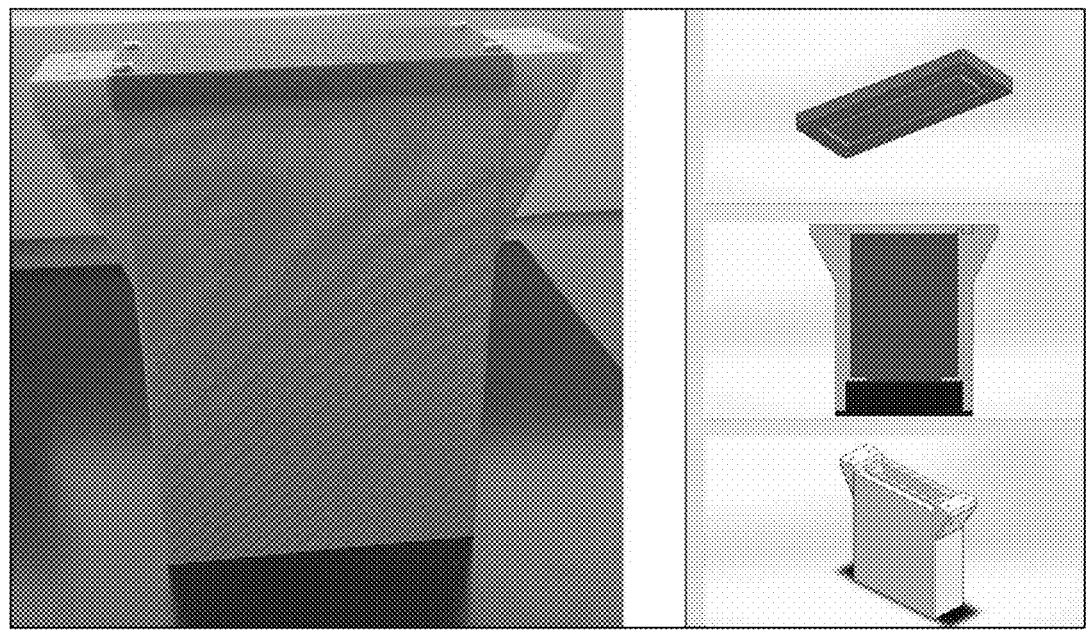
FIG. 20 is a perspective view of one embodiment of the Packaging prototype.

Preliminary design iterations have been made; modifications have been made to each design to fit a final description of an easy to manufacture and sealed package. FIG. 19 is the CAD model of the very first design made, it did not account for sealing and locking. FIG. 20 represents the first iteration, it contained a sealed chamber and a sealed cap with side brackets for fixture purposes, this iteration has been 3D printed and evaluated. FIGS. 21A, 21B, 21C represents the second iteration, this iteration takes into account space for battery storage and sealing measures.

Latest Design Iteration

Figures 23A, 23B, 23C:
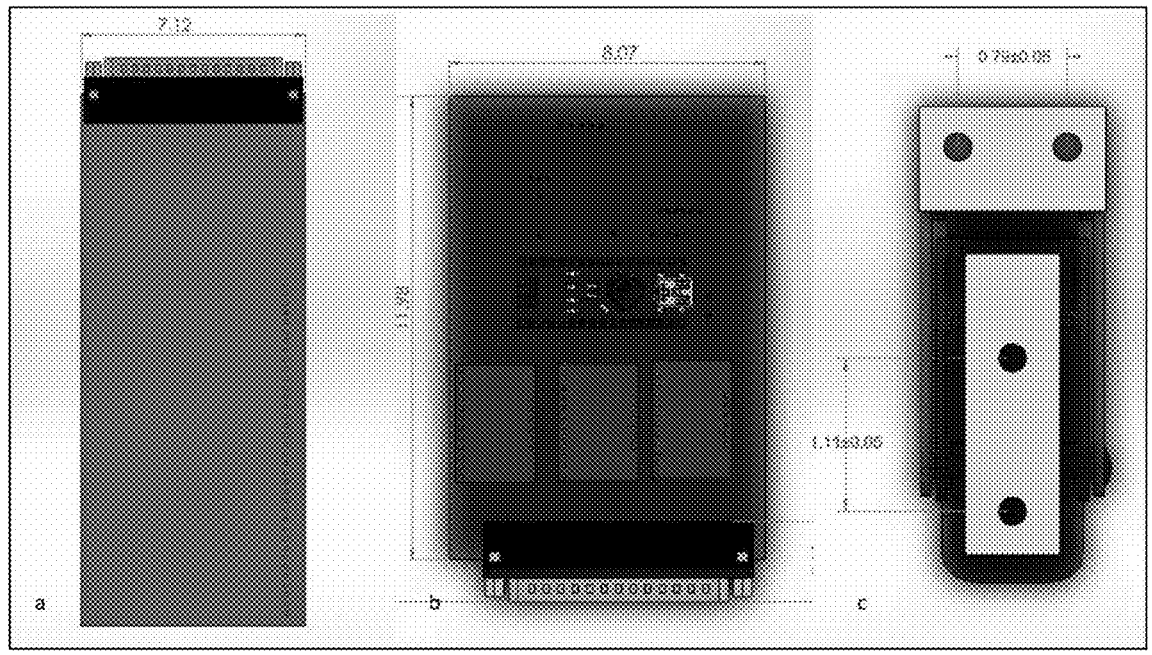
FIG. 23A is a Capacitive card.
FIG. 23B is a Control board.
FIG. 23C is a Spring reinforced hasp lock.

The final iteration in FIGS. 22A, 22B, 22C, takes into consideration the manufacturing process and tolerances within this design can be achieved on the available CNC mill, sealing is achieved by applying pressure on rubber O-rings and gaskets. FIGS. 23A, 23B, 23C provides a close-up on the capacitive strip, control board, and the hasp lock chosen to apply pressure on the case gasket.

The capacitive sensor packaging is at the university's manufacturing shops, the material chosen for the package is polyamide acting as hard rubber/strong plastic, and the separate parts will fit together using compressive sealing of 40% compression for the O-rings and rubber gasket through spring reinforced hasp locks from McMaster.

Test Beds: Wave Tank

The following is the initial wave tank design showing the linear guide on top.

The chosen pump model for wave generation is the Abyzz A200 manufactured by VENOTEC Germany, which can deliver up to 171 /h flow rate at a maximum speed of 5.4 m/s with a maximum head of 8.8 m and maximum pressure of 1.5 bar, and a power range of 4 to 200 W.

Figure 24:
FIG. 24 and FIG. 25 show the design of the experimental testbed (Tank).
Figure 25:
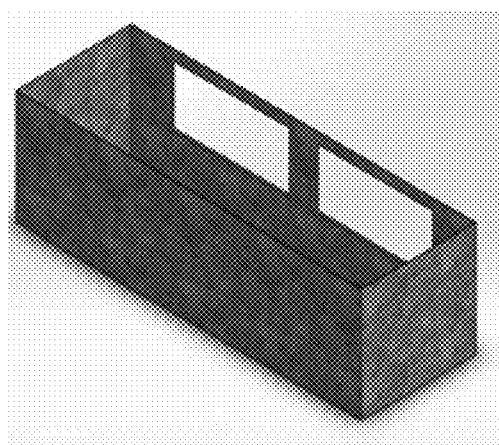

The large wave tank was manufactured and delivered to the testing location as shown in FIG. 24, FIG. 25. Tests to check the resistance of the tank to waves were conducted. The pump was first run in positive mode from 0% to 100% (200 W) power, random mode was tested with random flow directions at random power delivery; wave mode was tested with varying flow direction time (symmetric profile and non-symmetric profile). Furthermore, the pump was tested with minimum negative flow direction (varying from 0% to 100%) as well as positive direction (minimum, to full power positive flow direction). The tank passed all tests, welds were checked for leakage as well as the see-through windows, and no leaks were detected.

Wave Tank Actuator

A linear actuator has been assembled for the wave tank in order to slide the capacitive sensor back and forth across the waves in different scenarios, the actuator is an OPEN-BUILDS V-Slot 1.5 m timing belt actuator. Since the tank is 3 m long an extension has been manufactured using 4×4 cm square beam of length 3.1 m in order to have 5 cm overhang on both sides, stoppers have been welded on the extension to keep it in place during tests and avoid sliding or falling into the tank. The actuator is mounted on the extension using angle iron brackets, two of which are welded onto the extension beam, the other two are for straightening purposes.

Lab Tank

A 3-phase brushless DC motor (BLDC) has been chosen to actuate the rack and pinion mechanism, used to move the sensor vertically through the oil/water mixture, fitted on the lab tank (plexi-glass container 50×50 cm), the motor specifications are as follows: Operating Voltage: 12V; Motor rated speed: 3700 rpm; Motor diameter: 36 mm; Gearbox: planetary gear reducer; Speed: about 150 rpm/s. Shaft length: 20 mm; Reduction ratio: 27:1; Signal cycle pulse number: 2*27; Control mode: PWM speed control, Direction control; Feedback pulse output The motor is interfaced with MATLAB Simulink using an Arduino Mega 2560 to run real-time external mode simulations with all speed profiles normalized to PWM ranges. After conducting several experiments on the motor for parameter identification purposes, it has been noted that the motor speed reaches a maximum of 150 rpm at a PWM range of 150 to 255.

Adding High-Frequency Vibration Mechanism to the Sensor

Although the initial testing phase proved the ability of the Capacitive sensor in determining the medium it is in, one problem was observed with the oil soiling of the electrodes in the water under the oil slick level, while the sensor bobs up and down. Although the oil eventually slides off these strips and rises to the surface, the dynamics of the process is relatively slow for thick oils and risks affecting the determination of the oil/water interface. To deal with this issue, the sensor was equipped with a vibrating module (FIG. 26), to help expedite the removal of oil from fouled strips.

To assess the effect of the vibrator module, two experiments were performed; before and after activating the vibrators. The same procedure was used in performing the two experiments. The sensor was immersed vertically from a fixed position into the water through a thin floating oil-layer. The voltage measured by the capacitive stripes was recorded. To interpret the experimental results, the voltage-drop of two stripes passing from the initial position (Air) to the end position (Water), while penetrating the oil layer, were recorded and compared. An instance of the experimental results is shown in Table 30, and the corresponding graphs, displaying the voltage drop of the two stripes with respect to time, are shown in FIG. 27, and FIG. 28.

TABLE 30

Vibrator Experiment (Voltage (ADC) vs. Time (sec))

| Time (sec) | E1 (ADC) | E1 with vibrator (ADC) | E2 (ADC) | E2 with vibrator (ADC) |
|---|---|---|---|---|
| 1 | 144 | 144 | 161 | 162 |
| 2 | 136 | 135 | 148 | 148 |
| 3 | 133 | 137 | 140 | 142 |
| 4 | 127 | 111 | 132 | 111 |
| 5 | 132 | 89 | 137 | 54 |
| 6 | 118 | 76 | 122 | 65 |
| 7 | 108 | 76 | 88 | 49 |
| 8 | 90 | 64 | 86 | 40 |
| 9 | 81 | 65 | 74 | 46 |
| 10 | 80 | 59 | 66 | 39 |
| 11 | 76 | 58 | 72 | 35 |

TABLE 30-continued

Vibrator Experiment (Voltage (ADC) vs. Time (sec))

| Time (sec) | E1 (ADC) | E1 with vibrator (ADC) | E2 (ADC) | E2 with vibrator (ADC) |
|---|---|---|---|---|
| 12 | 73 | 54 | 64 | 41 |
| 13 | 68 | 54 | 58 | 39 |
| 14 | 69 | 50 | 56 | 36 |
| 15 | 71 | 49 | 60 | 37 |
| 16 | 66 | 47 | 58 | 29 |
| 17 | 62 | 42 | 50 | 33 |
| 18 | 59 | 44 | 52 | 31 |
| 19 | 58 | 41 | 54 | 33 |
| 20 | 59 | 37 | 52 | 30 |
| 21 | 60 | 38 | 51 | 33 |
| 22 | 57 | 36 | 49 | 30 |
| 23 | 54 | 36 | 48 | 28 |
| 24 | 55 | 33 | 48 | 30 |
| 25 | 51 | 32 | 50 | 27 |
| 26 | 51 | 33 | 49 | 27 |
| 27 | 53 | 33 | 50 | 31 |
| 28 | 52 | 34 | 50 | 25 |
| 29 | 50 | 34 | 47 | 27 |
| 30 | 48 | 1 | 46 | 26 |

The experimental results revealed that the use of vibrators helped increase the rate of the voltage drop of the two electrodes. This result supports the idea of using a vibration system, since speeding up the voltage drop is the essential in decreasing the oil-fouling effect.

Preliminary Work Done on Coating with the Nanoprotech material

In addition to the proposed vibrator above, several coating materials were tested. First, the sensor was coated with a transparent electrical insulation material provided by "Nanoprotech" [9] composed of the following ingredients: highly purified mineral oil, anticorrosion additives, antioxidant paraffinic and naphthenic hydrocarbons. The recommended temperature for operation of this material is between −20° C. to +35° C. and it maintains its properties for a temperature range from −80° C. to +140° C. Spraying the sensor cartridge with the Nanoprotech material is done manually, and the board is kept to dry in air for around twenty-four hours before the first use. The excess of the spraying process (liquid residue) remaining on the sensor's body is removed, after the drying process is completed. The material is completely transparent, and covers all the components of the sensor including, the pins, stripes, and connection tracks.

To compare the sensor performance before and after applying the Nanoprotech coat, two identical experiments were performed. In the two experiments, the sensor was immersed into the oil/water mixture starting from a fixed position above the water surface. To monitor the effect of the material on the oil-fouling process, the voltage-drop of the last two electrodes (E35, and E36), while passing from the air layer until reaching the water layer, were recorded and analyzed. The experimental results of the immersing experiment are shown in FIG. 29.

Figure 29:
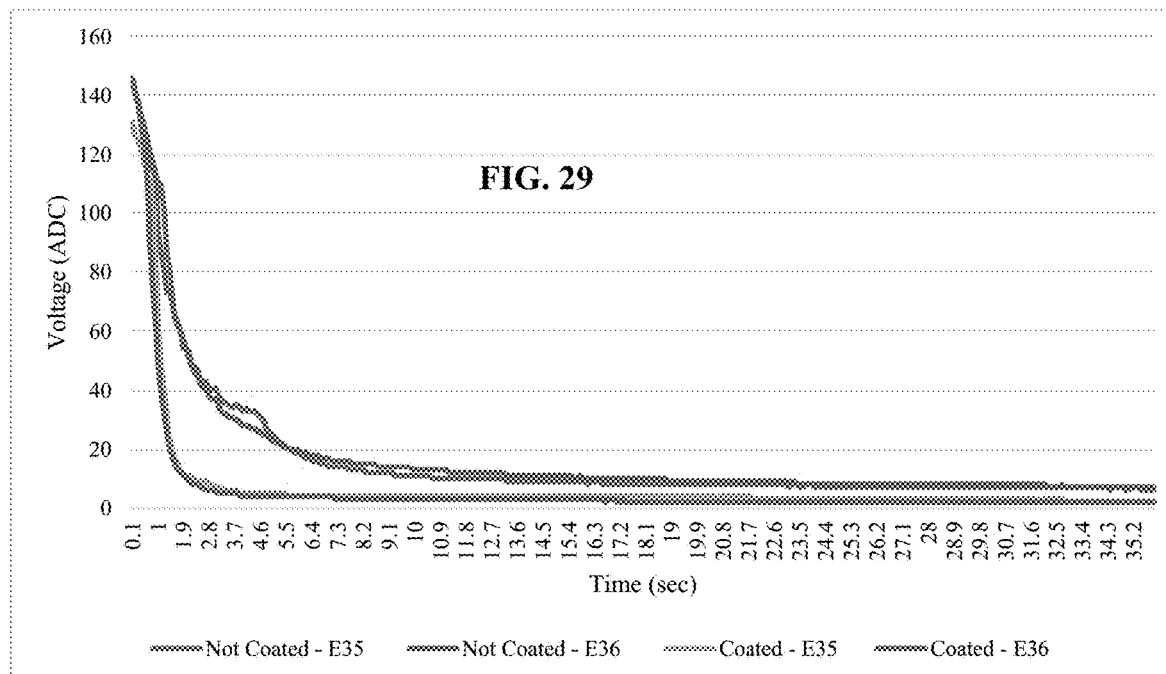
FIG. 29 is a graph showing the E35 and E36 voltage drop before and after applying the Nanoprotech electrical insulation material (Voltage (ADC) vs. Time (sec)).

As shown in FIG. 29, the Nanoprotech coating increased the change rate of the measured voltage, while the sensor is immersed from oil to water. This can be deduced from the severe drop in E35 and E36 voltages, recorded immediately after the immersing started. In contrast, before applying the coat, the change rate was much slower as shown in the graph. For more detailed interpretation of the results, the numerical values corresponding to all measured voltages (ADC).

At the end of the experiment, when the voltages are almost stable, values measured by the coated sensor were lower than the values recorded non-coated sensor. For instance, the voltages measured by E35 and E36 before coating, were between seven and eight (ADC). After coating, the voltages of E35 and E36 decreased to around two and three (ADC). This decrease validates that the coating played a role in enhancing the conductivity of the electrodes.

In addition to the oil-fouling assessment experiments, several experiments were done to analyze the effect of the coating on the sensor response in all conditions (Air-Oil-Water). Voltages measured by electrodes when immersed in air and water, with and without coating, are shown in Table 31.

TABLE 31

Voltages measured in air & water, before and after coating with Nanoprotech insulation material

| | Voltage (ADC) | | | |
|---|---|---|---|---|
| Electrode | Air (Not Coated) | Air (Coated) | Water (Not Coated) | Water (Coated) |
| E25 | 138 | 138.19 | 3 | 2 |
| E26 | 132 | 132 | 3 | 2 |
| E27 | 132 | 132.06 | 2.44 | 2 |
| E28 | 134 | 134.78 | 2.46 | 2 |
| E29 | 133 | 133.01 | 2.04 | 2 |
| E30 | 134 | 134.99 | 2.06 | 2 |
| E31 | 133.69 | 134 | 2.24 | 2 |
| E32 | 135 | 135 | 2.02 | 2 |
| E33 | 132.05 | 133 | 2 | 2 |
| E34 | 131 | 131.99 | 2 | 2 |
| E35 | 131 | 131.96 | 2.04 | 2 |
| E36 | 148 | 148.99 | 2.91 | 2 |

As shown in Table 31, the voltages measured by the sensor electrodes are almost equal in Air and Water cases, before and after coating. However, it was noticed that in the Water case, voltages measured after coating are slightly lower and more stable than the voltages measured before coating. This result validates the conclusion made in the previous experiment, saying that the Nanoprotech coating enhanced the conductivity of the stripes without impacting the sensor behavior in other cases (equal values in Air case).

Also, to check the Nanoprotech coating effect on oil detection, two identical experiments were performed before and after coating the sensor cartridge. Initially, the sensor was partially immersed in water, where the first five electrodes were surrounded by air. Then, oil was added to the water container from a fixed position above the water surface. The purpose of this method is to monitor the oil effect while contacting the electrodes directly without being altered by the sensor motion. Also, the main aim of this experiment is to check if the coating impact on the oil detection capability. The experimental results including the measured voltages (ADC) and the percent relative changes of the voltages are shown in Table 32.

TABLE 32

Relative differences (%) in Oil case, before and after coating with Nanoprotech insulation material

| Elec-trode | Not Coated | | | Coated | | |
|---|---|---|---|---|---|---|
| | Voltage (ADC) | | Relative Difference | Voltage (ADC) | | Relative Difference |
| | Air | Oil | (%) | Air | Oil | (%) |
| E1 | 167 | 160 | 4.19 | 168 | 161 | 4.17 |
| E2 | 157 | 149 | 5.10 | 158 | 150 | 5.06 |
| E3 | 156 | 148 | 5.13 | 157 | 149 | 5.10 |
| E4 | 159 | 150 | 5.66 | 160 | 151 | 5.63 |
| E5 | 158 | 149 | 5.70 | 159 | 149 | 6.29 |

The experimental results revealed that the percentage relative changes, due to the oil contact, were similar in both versions (4-6%); coated and non-coated. Thus, it can be concluded, that the coating didn't have any negative effect on the oil detection ability.

As a result, the experimental results presented above showed that the Nanoprotech coating helped in reducing the oil-fouling process, while not impacting the air and oil detection capabilities. Also, the use of the Nanoprotech material was observed visually to decrease the wetness of the sensor board while being immersed in water. However, several questions were raised regarding the actual composition of this material, and the reason behind enhancing the conductivity of the electrodes. Clarification of the actual role of the material is needed, based on the fact that this material major role is to insulate electrical parts in water and not to enhance the conductivity. However, further investigation regarding these results will be done.

Preliminary Work Done on Coating with the Ultra-Ever Dry Material

While attempting to reduce oil-foiling of the strips, Ultra-Ever-Dry product [13] provided by Ultratech [14] was tested. First, after spraying the sensor with the two product components (base coat and top coat), the sensor was immersed and removed several times in a set of water/oil mixtures, including light, medium and heavy (Fuel) oil samples. As a result, in most of the trials, it was observed that the oil was falling-off immediately after removing the sensor from the examined liquid. However, in some cases, especially when dealing with heavy oil types (Fuel), some oil residue was observed remaining on the sensor board after dipping.

To analyze the effect more accurately, several experiments were performed. The experiments were done using the same sensor board, before and after applying the coating. The ultra-ever dry material is applied by manual spraying in two stages. In the first stage, the sensor cartridge is sprayed by the bottom coat material. Then, the board is kept drying in air for around 15 minutes. In the second stage, the top coat material is applied to the board by manual spraying. After applying the top coat, the sensor is kept drying in air for around twenty-four hours, before the first use. The spraying process was performed under a specialized fume hood. The fume hood is a self-contained, filtered laboratory enclosure, used to remove hazardous vapors and particles resulting from the spraying process. It is important to note that the spraying was done based on a regular motion iterations, to have a homogenous and equally distributed amount of coating material on the sensor surfaces. However, since the spraying was done manually (by hand), some differences in the coating distribution was observed on the sensor surfaces.

Figure 30:
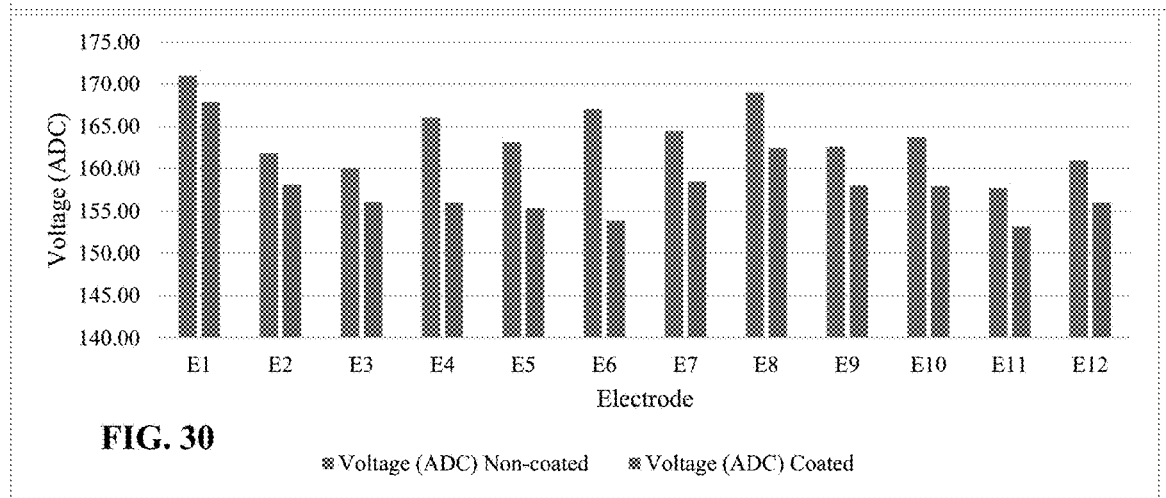
FIG. 30 is a graph showing the Comparison between voltages (ADC) measured before and after coating with Ultra-ever dry (Air)—Graph.

In the first experiment, the voltages measured by the sensor electrodes were recorded while the sensor was set to a fixed position in air. To assess the impact of this material on the sensor, voltage values obtained after applying the coating are compared to the corresponding values stored before applying the coating. A sample of the experimental results, showing the average of a set of voltages measured by the first twelve activated electrodes, are shown in Table 33, and the corresponding graph is shown in FIG. 30.

TABLE 33

Relative differences (%) and Voltages (ADC) in Air case, before and after coating with Ultra-ever dry

| Electrode | Non-coated (Avg. Voltage (ADC)) | Coated (Avg. Voltage (ADC)) | Relative Differences (%) |
|---|---|---|---|
| E1 | 171.00 | 167.83 | 1.85 |
| E2 | 161.79 | 158.11 | 2.27 |
| E3 | 160.05 | 156.03 | 2.51 |
| E4 | 166.00 | 156.00 | 6.02 |
| E5 | 163.12 | 155.31 | 4.79 |
| E6 | 167.02 | 153.86 | 7.88 |
| E7 | 164.48 | 158.46 | 3.66 |
| E8 | 168.98 | 162.40 | 3.89 |
| E9 | 162.60 | 158.03 | 2.81 |
| E10 | 163.72 | 157.91 | 3.55 |
| E11 | 157.72 | 153.17 | 2.88 |
| E12 | 160.93 | 156.00 | 3.06 |

The experimental results revealed that the voltages measured by the capacitive stripes in the Air case, decreased after applying Ultra-ever dry material. Since the voltage is inversely related to the capacitance, it was concluded that the additional coating layer increased the base capacitance of the stripes. To assess the voltage-drop numerically, the percent relative differences are calculated and shown in Table 33. The percentage differences varied between the stripes, ranging between 1.85% and 7.88%. This variation is due to the different distribution of the coating material on the sensor surface. The average percentage difference is around 3.77%.

To monitor the effect of the coating material in the Oil and Water cases, another experiment was performed. In this experiment, the sensor was partially immersed in an oil/water mixture. Before applying the coat, the thirty-six activated electrodes were distributed in the oil/water mixture as the following: E1 to E16: Air; E17 to E21: Oil; E22 to E36: Water.

The voltages measured for the non-coated sensor, before and after immersing in the examined liquid, in addition to the percentage relative differences, are shown in Table 34.

TABLE 34

Non-coated - Voltage (ADC) & R.D (%). - Partially immersed in oil/water mixture

| Case | Electrode | Voltage (ADC) | | Relative Difference (%) |
|---|---|---|---|---|
| | | Calibration (Air) | Partially immersed in oil/water mixture | |
| Air | E1 | 171.00 | 172.00 | 0.58 |
| | E2 | 161.79 | 162.01 | 0.14 |
| | E3 | 160.05 | 160.99 | 0.59 |
| | E4 | 166.00 | 165.13 | 0.53 |
| | E5 | 163.12 | 162.97 | 0.09 |
| | E6 | 167.02 | 166.06 | 0.58 |
| | E7 | 164.48 | 164.94 | 0.29 |
| | E8 | 168.98 | 170.29 | 0.78 |
| | E9 | 162.60 | 164.00 | 0.86 |

TABLE 34-continued

Non-coated - Voltage (ADC) & R.D (%). - Partially immersed in oil/water mixture

| Case | Electrode | Calibration (Air) | Partially immersed in oil/water mixture | Relative Difference (%) |
|---|---|---|---|---|
|  | E10 | 163.72 | 163.43 | 0.18 |
|  | E11 | 157.72 | 159.03 | 0.83 |
|  | E12 | 160.93 | 160.94 | 0.01 |
|  | E13 | 148.09 | 147.86 | 0.15 |
|  | E14 | 149.65 | 149.19 | 0.30 |
|  | E15 | 150.06 | 149.83 | 0.15 |
|  | E16 | 154.02 | 153.03 | 0.65 |
| Oil | E17 | 152.98 | 147.97 | 3.27 |
|  | E18 | 155.90 | 148.99 | 4.44 |
|  | E19 | 154.02 | 147.88 | 3.99 |
|  | E20 | 157.00 | 149.01 | 5.09 |
|  | E21 | 153.68 | 141.99 | 7.61 |
| Water | E22 | 154.00 | 66.82 | 56.61 |
|  | E23 | 149.01 | 48.33 | 67.56 |
|  | E24 | 151.04 | 48.15 | 68.12 |
|  | E25 | 138.94 | 74.94 | 46.06 |
|  | E26 | 139.61 | 45.64 | 67.31 |
|  | E27 | 140.18 | 35.21 | 74.88 |
|  | E28 | 142.98 | 18.07 | 87.36 |
|  | E29 | 140.99 | 21.00 | 85.11 |
|  | E30 | 143.09 | 36.58 | 74.43 |
|  | E31 | 141.99 | 77.72 | 45.26 |
|  | E32 | 143.51 | 17.97 | 87.48 |
|  | E33 | 140.00 | 23.29 | 83.36 |
|  | E34 | 139.43 | 17.49 | 87.46 |
|  | E35 | 138.99 | 12.44 | 91.05 |
|  | E36 | 153.23 | 32.11 | 79.04 |

The same experiment was repeated after coating the sensor with the ultra-ever dry material. The voltages (ADC) measured by all electrodes, in addition to percentage relative differences are shown in Table 35.

TABLE 35

Coated (Ultra-ever dry) - Voltage (ADC) & R.D (%). - Partially immersed in oil/water mixture

| Case | Electrode | Calibration (Air) | Partially immersed in oil/water mixture | Relative Difference (%) |
|---|---|---|---|---|
| Air | E1 | 167.83 | 166.95 | 0.52 |
|  | E2 | 158.11 | 157.97 | 0.09 |
|  | E3 | 156.03 | 156.00 | 0.02 |
|  | E4 | 156.00 | 157.04 | 0.66 |
|  | E5 | 155.31 | 156.60 | 0.82 |
|  | E6 | 153.86 | 155.15 | 0.84 |
|  | E7 | 158.46 | 157.01 | 0.92 |
|  | E8 | 162.40 | 163.33 | 0.57 |
|  | E9 | 158.03 | 157.81 | 0.14 |
|  | E10 | 157.91 | 156.99 | 0.59 |
|  | E11 | 153.17 | 152.11 | 0.70 |
| Oil | E12 | 156.00 | 153.99 | 1.29 |
|  | E13 | 143.23 | 140.06 | 2.21 |
|  | E14 | 144.69 | 139.30 | 3.72 |
|  | E15 | 144.20 | 139.78 | 3.07 |
|  | E16 | 150.06 | 144.17 | 3.93 |
| Water | E17 | 147.03 | 126.89 | 13.70 |
|  | E18 | 144.94 | 107.01 | 26.17 |
|  | E19 | 127.00 | 91.21 | 28.19 |
|  | E20 | 127.97 | 92.70 | 27.57 |
|  | E21 | 147.00 | 103.11 | 29.86 |
|  | E22 | 147.09 | 103.90 | 29.36 |
|  | E23 | 144.03 | 103.19 | 28.36 |
|  | E24 | 146.97 | 103.74 | 29.41 |
|  | E25 | 130.43 | 95.82 | 26.53 |
|  | E26 | 131.94 | 95.25 | 27.81 |
|  | E27 | 137.00 | 97.62 | 28.75 |
|  | E28 | 154.00 | 136.27 | 11.51 |
|  | E29 | 137.14 | 95.97 | 30.03 |
|  | E30 | 133.03 | 97.48 | 26.72 |
|  | E31 | 137.00 | 95.62 | 30.20 |
|  | E32 | 134.00 | 94.69 | 29.34 |
|  | E33 | 135.03 | 89.08 | 34.03 |
|  | E34 | 135.71 | 83.13 | 38.75 |
|  | E35 | 136.20 | 78.64 | 42.27 |
|  | E36 | 152.29 | 90.60 | 40.51 |

Figure 31:
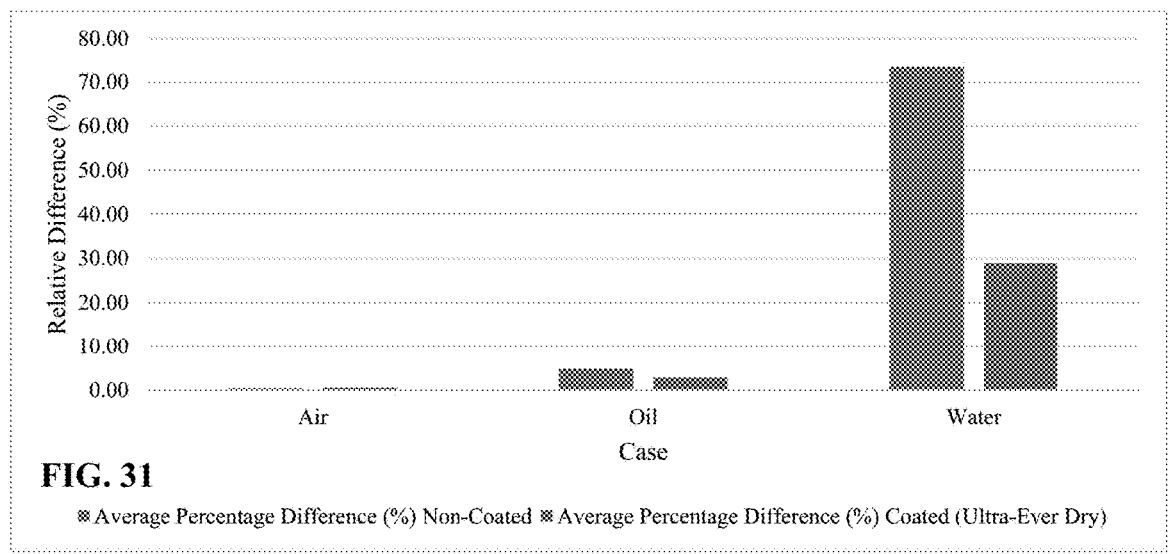
FIG. 31 is a graph showing the Comparison between average percentage differences in Air/Oil/Water cases before and after coating with Ultra-ever dry material.

To assess the effect of the coating material on each of the three cases (Air/Oil/Water), the average value of the percent relative differences calculated for each case in the two previous experiment (Table 34 and Table 35) are shown in Table 36, and the corresponding graph is shown in FIG. 31.

TABLE 36

Comparison between average percentage differences in Air/Oil/Water cases before and after coating

| | Average Percentage Difference (%) | |
|---|---|---|
|  | Non-Coated | Coated (Ultra-Ever Dry) |
| Air | 0.42 | 0.53 |
| Oil | 4.88 | 2.84 |
| Water | 73.41 | 28.95 |

This experiment revealed that after applying the Ultra-ever dry coating, the relative percentage change in the Water case was reduced. Theoretically, this result was expected since the coating plays a major role in isolating the electrodes from water. Without coating, the electrodes were short-circuited due to the water conductivity, thus, the potential difference was dropped to around zero. In contrast, after the coating was applied, an additional layer (dielectric) was added to the electrodes, increasing the base capacitance, and decreasing the sensor sensitivity. Also, a decrease of the relative change of the electrodes immersed in oil was observed.

Several important notes were recorded while working with the ultra-ever dry material. First, it was noted that the manual spraying technique (by hand) resulted in an irregular distribution of the coating thickness on the sensor surfaces. Thus, a non-uniform coating layer was observed, impacting the base capacitance of the electrodes inconsistently. Based on this, a more consistent method is recommended to be used during the coating process. Also, it was observed that the addition of the Ultra-ever dry coating layer, decreased the sensitivity of the sensor. This conclusion was made after observing the decrease in the percentage relative difference calculated for each of the electrodes while being immersed in water and oil. Further investigation regarding the performance of this coating and super-hydrophobic materials may be done.

Evaluating the Impact of Different Power Sources on the Sensor Performance

Figure 32:
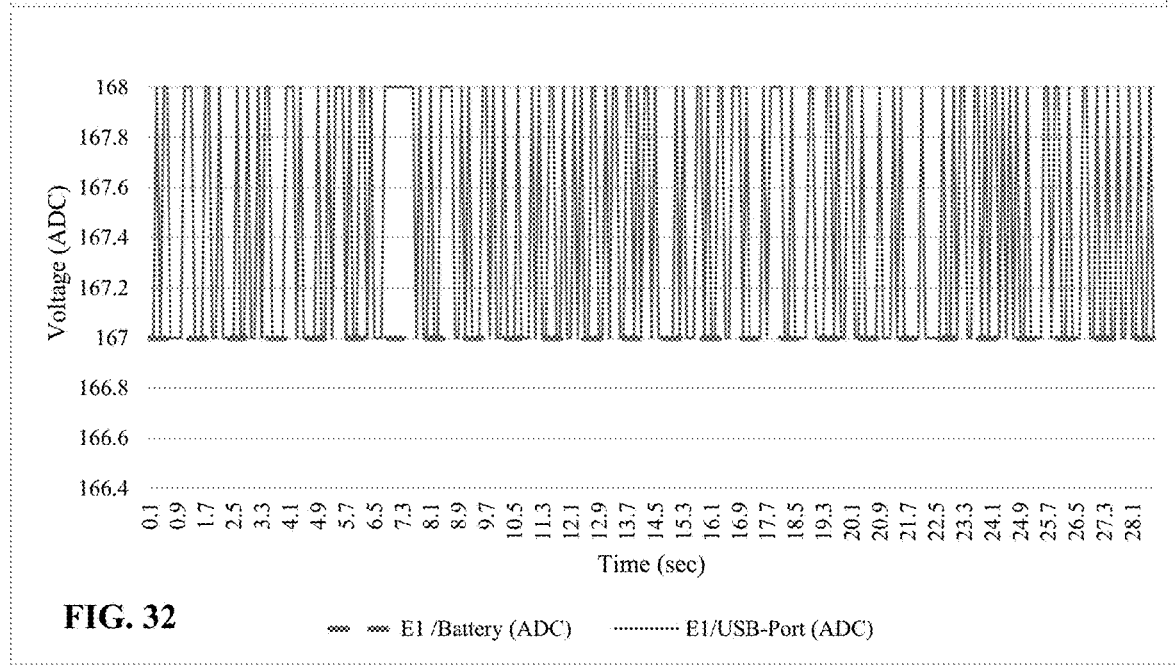
FIG. 32 is a Comparison between voltages measured by E1 in Battery-powered and USB-powered cases.

During the initial testing of the sensor, two main sources were used to power the circuit. First, the control circuit was powered by a USB-port on a laptop. The USB-port was used to power the Arduino module, and to retrieve the measured voltages from the IVIPR121 modules. The USB-port provides the Arduino with 5 VDC, and the Arduino provides 3.3 VDC to the IVIPR121 controllers through the 3.3V embedded voltage regulator. During operation, the laptop was connected to the power adapter, plugged into the AC power lines (220 VAC). The second source used to power the sensor is an independent Lead Acid battery of 12 VDC. To assess the effect of the two power sources on the voltages measured by the capacitive stripes, the sensor was placed at a fixed position, and a set of voltages measured by all electrodes were recorded. The sensor was set at a fixed position (surrounded by air), and a sample of 250 measures was recorded. The voltages measured by the first twelve electrodes are analyzed and presented in Table 37. Also, a graph showing voltages measured by the first electrode E1 in the two cases is shown in FIG. 32.

TABLE 37

Voltage (ADC) - Battery vs. USB-port Power Sources

| | Electrode | Mean | Standard Deviation | Max | Min | Range |
|---|---|---|---|---|---|---|
| Battery Powered | E1 | 167.00 | 0.00 | 167 | 167 | 0 |
| | E2 | 157.00 | 0.00 | 157 | 157 | 0 |
| | E3 | 156.00 | 0.00 | 156 | 156 | 0 |
| | E4 | 159.00 | 0.00 | 159 | 159 | 0 |
| | E5 | 158.07 | 0.26 | 159 | 158 | 1 |
| | E6 | 161.00 | 0.00 | 161 | 161 | 0 |
| | E7 | 160.00 | 000 | 160 | 160 | 0 |
| | E8 | 166.00 | 0.00 | 166 | 166 | 0 |
| | E9 | 159.00 | 0.00 | 159 | 159 | 0 |
| | E10 | 158.00 | 0.00 | 158 | 158 | 0 |
| | E11 | 149.00 | 0.00 | 149 | 149 | 0 |
| | E12 | 153.00 | 0.00 | 153 | 153 | 0 |
| USB-port Powered | E1 | 167.43 | 0.50 | 168 | 167 | 1 |
| | E2 | 157.02 | 0.15 | 158 | 157 | 1 |
| | E3 | 156.00 | 0.06 | 157 | 156 | 1 |
| | E4 | 159.04 | 0.19 | 160 | 159 | 1 |
| | E5 | 158.58 | 0.49 | 159 | 158 | 1 |
| | E6 | 161.00 | 0.06 | 162 | 161 | 1 |
| | E7 | 159.50 | 0.50 | 160 | 159 | 1 |
| | E8 | 162.05 | 0.22 | 163 | 162 | 1 |
| | E9 | 159.00 | 0.00 | 159 | 159 | 0 |
| | E10 | 158.00 | 0.06 | 159 | 158 | 1 |
| | E11 | 148.70 | 0.46 | 149 | 148 | 1 |
| | E12 | 153.00 | 0.06 | 154 | 153 | 1 |

This experiment showed that using the USB-port as a power source, introduced additional noise to the measured voltage signals. This can be inferred from the increased standard deviation values shown in Table 38, and the high frequency oscillations introduced to the E1 voltage signal shown in FIG. 32. Based on the experimental results, it was concluded that connecting the device to an AC power sources is not recommended, to avoid inserting additional noise to the sensor measurement.

Capacitive Sensor Tuning Experiments

Figure 33:
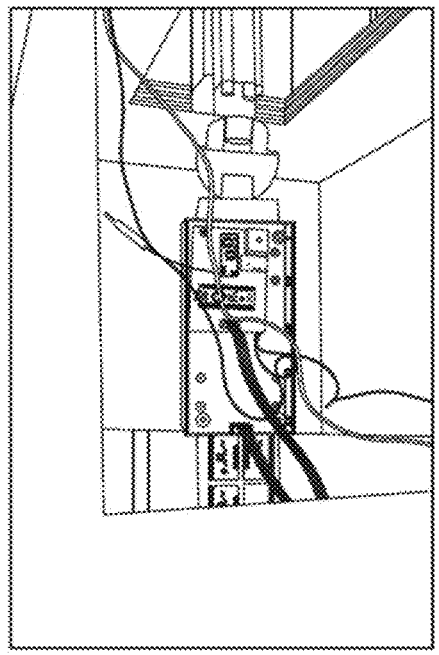
FIG. 33 is a front view of the Experimental Installation for the Capacitive Sensor Tuning Experiments.

As described before, the MPR121 controllers are used to measure the capacitance of each electrode in the sensing unit. Since the MPR121 modules use a DC charge technique to measure the capacitance, the current charge and the charge duration parameters need to be configured before operation. Based on this, tuning experiments were performed to find the best combination of the charge current and duration to be used in the final sensor design. The main aim of the tuning process is to select the combination (current/time) that maximizes the sensor sensitivity in terms of differentiation between air and oil. The voltage measurements used in the tuning experiments are taken at the output of the second filter of the MPR121 controller. The third filter output of the MPR121 controller is ignored in this project because it compares the raw voltage measurements with the baseline values used mainly for capacitive touch applications. The charge current may take a value between 1µA and 63µA, and the charge duration is set to value between 0.5µsec and 32 µsec. During the experiments in which tuning was performed, the sensor was fixed on the indoor tank and immersed in a liquid that contains a layer of heavy oil (Fuel) with 20 mm thickness (see FIG. 33).

Current Tuning Experiments

Figure 34:
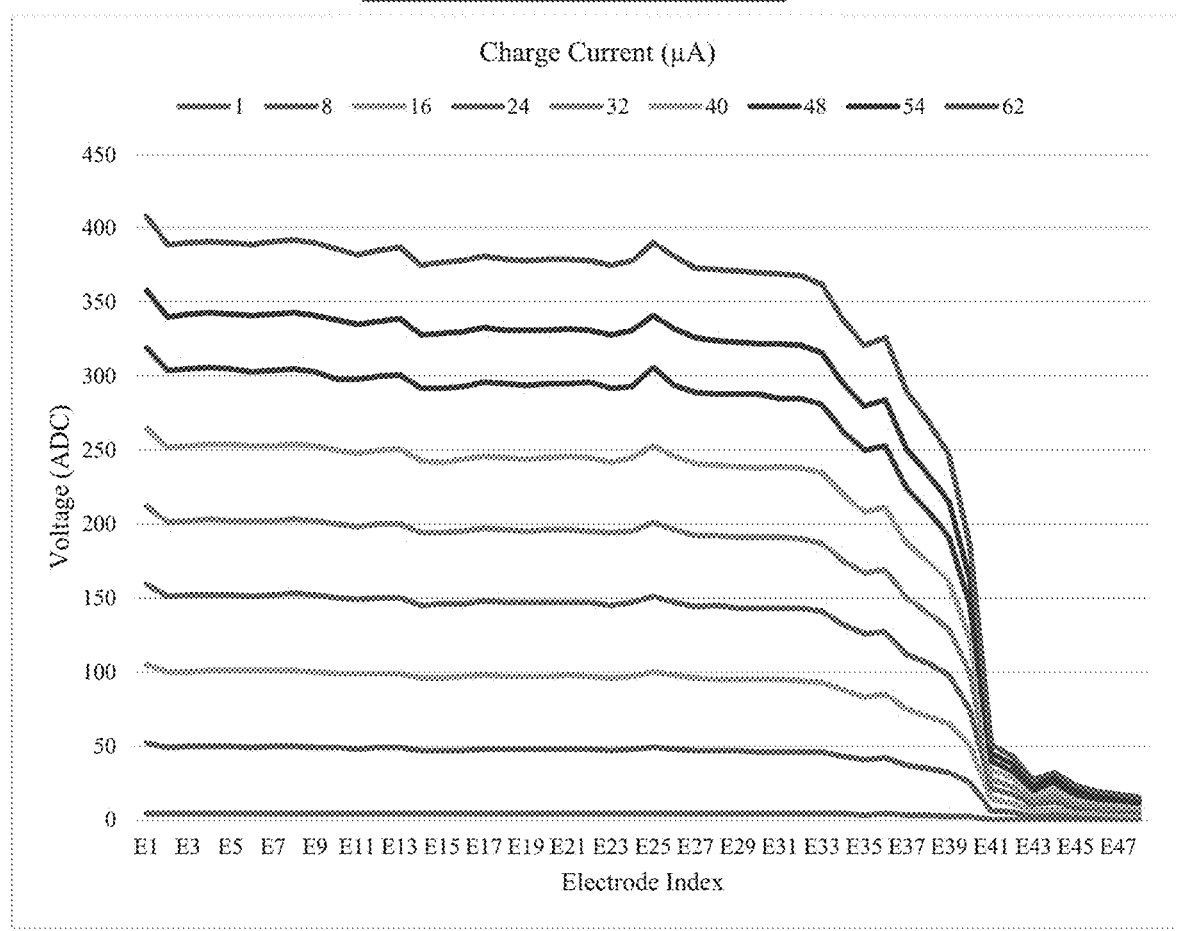
FIG. 34 is a graph of the current tuning—Graph (Voltage (ADC) vs. Current (µA)).

Current tuning was performed by setting the charge duration time to a fixed value of 0.5µsec and changing the charging current amount from 1 µA to 63 µA by an increment of 1 µA. The experimental results are shown in Table 38 and the corresponding graph is shown in FIG. 34. The electrodes were distributed into three different groups (Air/Oil/Water) as follows: E1 to E25: Air; E26: Air/Oil; E27 to E33: Oil; E34 to E40: Water, covered by a thin layer of oil (fouling effect); and E41 to 48: Water.

TABLE 38

Current tuning experiment
(Voltage (ADC) vs. Current (1-62 µA))

| Elec-trode | Current (µA) | | | | | | | | |
|---|---|---|---|---|---|---|---|---|---|
| | 1 | 8 | 16 | 24 | 32 | 40 | 48 | 54 | 62 |
| E1 | 4 | 52 | 105 | 159 | 212 | 265 | 319 | 358 | 408 | Voltage
| E2 | 4 | 49 | 100 | 151 | 201 | 252 | 304 | 340 | 389 | (ADC)
| E3 | 4 | 50 | 100 | 152 | 202 | 253 | 305 | 342 | 390 |
| E4 | 4 | 50 | 101 | 152 | 203 | 254 | 306 | 343 | 391 |
| E5 | 4 | 50 | 101 | 152 | 202 | 254 | 305 | 342 | 390 |
| E6 | 4 | 49 | 101 | 151 | 202 | 253 | 303 | 341 | 389 |
| E7 | 4 | 50 | 101 | 152 | 202 | 253 | 304 | 342 | 391 |
| E8 | 4 | 50 | 101 | 153 | 203 | 254 | 305 | 343 | 392 |
| E9 | 4 | 49 | 100 | 152 | 202 | 253 | 303 | 341 | 390 |
| E10 | 4 | 49 | 99 | 150 | 200 | 250 | 298 | 338 | 386 |
| E11 | 4 | 48 | 99 | 149 | 198 | 248 | 298 | 335 | 382 |
| E12 | 4 | 49 | 99 | 150 | 200 | 250 | 300 | 337 | 385 |
| E13 | 4 | 49 | 99 | 150 | 200 | 251 | 301 | 339 | 387 |
| E14 | 4 | 47 | 96 | 145 | 194 | 243 | 292 | 328 | 375 |
| E15 | 4 | 47 | 96 | 146 | 194 | 242 | 292 | 329 | 377 |
| E16 | 4 | 47 | 97 | 146 | 195 | 244 | 293 | 330 | 378 |
| E17 | 4 | 48 | 98 | 148 | 197 | 246 | 296 | 333 | 381 |
| E18 | 4 | 48 | 97 | 147 | 196 | 245 | 295 | 331 | 379 |
| E19 | 4 | 48 | 97 | 147 | 195 | 244 | 294 | 331 | 378 |
| E20 | 4 | 48 | 97 | 147 | 196 | 245 | 295 | 331 | 379 |
| E21 | 4 | 48 | 98 | 147 | 196 | 246 | 295 | 332 | 379 |
| E22 | 4 | 48 | 97 | 147 | 195 | 245 | 296 | 331 | 378 |
| E23 | 4 | 47 | 96 | 145 | 194 | 242 | 292 | 328 | 375 |
| E24 | 4 | 48 | 97 | 147 | 195 | 245 | 293 | 331 | 378 |
| E25 | 4 | 49 | 100 | 151 | 201 | 253 | 306 | 341 | 390 |
| E26 | 4 | 48 | 98 | 147 | 196 | 246 | 294 | 332 | 381 |
| E27 | 4 | 47 | 96 | 144 | 192 | 241 | 289 | 326 | 373 |
| E28 | 4 | 47 | 95 | 145 | 192 | 240 | 288 | 324 | 372 |
| E29 | 4 | 47 | 95 | 143 | 191 | 239 | 288 | 323 | 371 |
| E30 | 4 | 46 | 95 | 143 | 191 | 238 | 288 | 322 | 370 |
| E31 | 4 | 46 | 95 | 143 | 191 | 239 | 285 | 322 | 369 |
| E32 | 4 | 46 | 94 | 143 | 190 | 238 | 285 | 321 | 368 |
| E33 | 4 | 46 | 93 | 141 | 187 | 235 | 281 | 316 | 362 |
| E34 | 4 | 43 | 88 | 132 | 175 | 220 | 263 | 295 | 338 |
| E35 | 3 | 41 | 83 | 126 | 167 | 208 | 250 | 280 | 321 |
| E36 | 4 | 42 | 85 | 127 | 169 | 211 | 253 | 284 | 326 |
| E37 | 3 | 37 | 75 | 112 | 150 | 187 | 224 | 251 | 290 |
| E38 | 3 | 35 | 70 | 106 | 140 | 175 | 209 | 234 | 270 |
| E39 | 2 | 32 | 65 | 98 | 129 | 161 | 191 | 215 | 247 |
| E40 | 2 | 25 | 50 | 74 | 99 | 122 | 145 | 162 | 185 |
| E41 | 0 | 6 | 14 | 21 | 27 | 34 | 40 | 45 | 51 |
| E42 | 0 | 5 | 11 | 17 | 22 | 28 | 33 | 38 | 43 |
| E43 | 0 | 2 | 6 | 10 | 13 | 17 | 20 | 23 | 27 |
| E44 | 0 | 3 | 7 | 12 | 16 | 20 | 25 | 28 | 32 |
| E45 | 0 | 2 | 5 | 8 | 11 | 14 | 17 | 20 | 23 |
| E46 | 0 | 1 | 4 | 7 | 9 | 12 | 14 | 16 | 19 |
| E47 | 0 | 1 | 3 | 6 | 8 | 10 | 13 | 14 | 17 |
| E48 | 0 | 1 | 3 | 5 | 7 | 9 | 11 | 13 | 15 |

Based on the tuning results, it was observed that the difference between the air and oil electrodes increase with the current in a directly proportional manner. Theoretically, this result is expected since the capacitance is directly related to the product of duration and current. However, to avoid the saturation of the 10-bit ADC contained in the MPR121, the suitable time duration parameter need to be assigned considering additional tuning experiments.

Time Tuning Experiments

Figure 35:
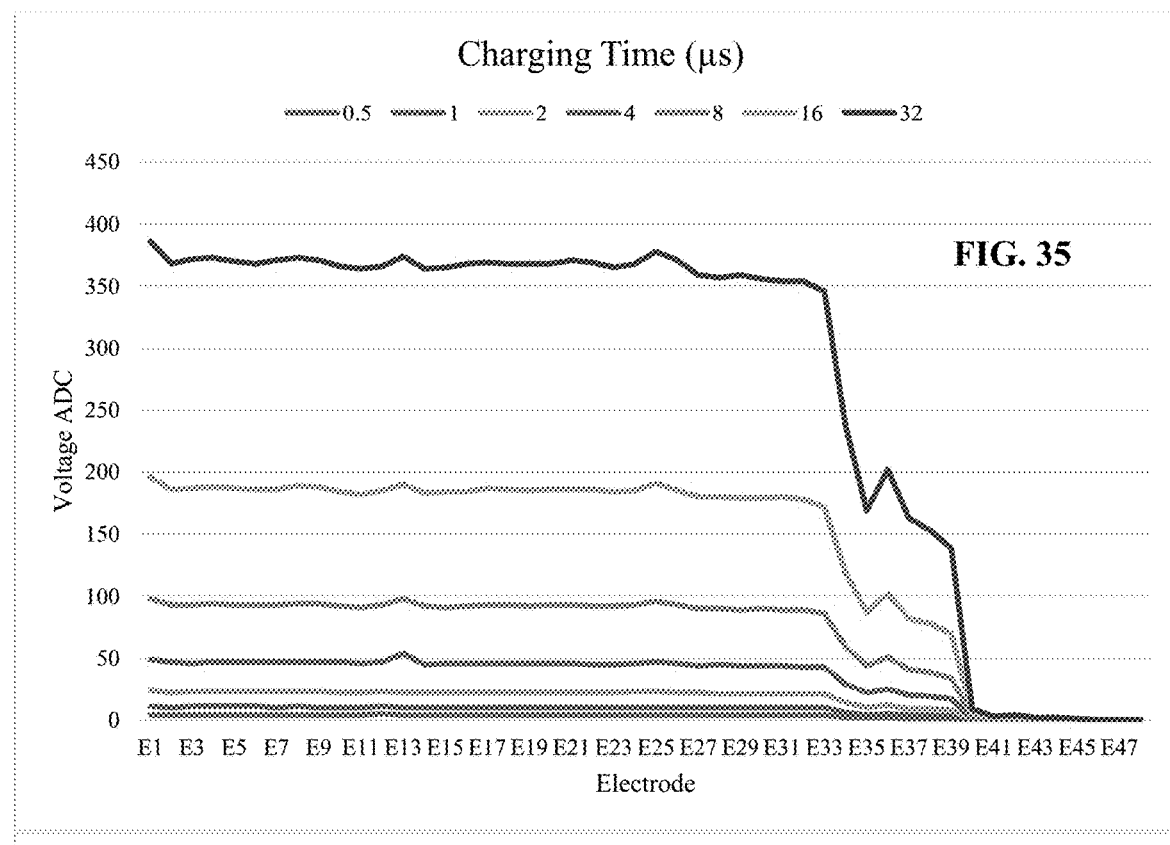
FIG. 35 is a graph Time tuning—Graph (Voltage (ADC) vs. Time (0.5-32 µs)).

In contrast to the current tuning experiments, in the time tuning experiments the current amount was set to a fixed value of 1 μA and charging duration time was changed gradually from 0.5 μsec to 32μsec. To do this, the CDT register included in the MPR121 controller was set with different values in order to set the needed charge time values (see Table 39). The state of the sensor electrodes is similar to the one presented in current tuning experiment section above. The experimental results are shown in Table 40 and the corresponding graph is shown in FIG. 35.

TABLE 39

Hex values representing different charge time configurations

| Charge Time (μs) | Hex Value |
|---|---|
| 0.5 | 0x20 |
| 1 | 0x40 |
| 2 | 0x60 |
| 4 | 0x80 |
| 8 | 0xA0 |
| 16 | 0xC0 |
| 32 | 0xE0 |

TABLE 40

Time tuning experiment (Voltage (ADC) vs. Time (0.5-32 μs))

| Electrode | Time (μs) | | | | | | |
|---|---|---|---|---|---|---|---|
| | 0.5 | 1 | 2 | 4 | 8 | 16 | 32 |
| E1 | 4 | 11 | 24 | 49 | 98 | 196 | 386 |
| E2 | 4 | 10 | 22 | 47 | 93 | 186 | 368 |
| E3 | 4 | 11 | 23 | 46 | 93 | 187 | 372 |
| E4 | 4 | 11 | 23 | 47 | 94 | 188 | 373 |
| E5 | 4 | 11 | 23 | 47 | 93 | 187 | 370 |
| E6 | 4 | 11 | 23 | 47 | 93 | 186 | 368 |
| E7 | 4 | 10 | 23 | 47 | 93 | 186 | 371 |
| E8 | 4 | 11 | 23 | 47 | 94 | 189 | 373 |
| E9 | 4 | 10 | 23 | 47 | 94 | 188 | 371 |
| E10 | 4 | 10 | 22 | 47 | 92 | 184 | 366 |
| E11 | 4 | 10 | 22 | 46 | 91 | 182 | 364 |
| E12 | 5 | 11 | 23 | 47 | 93 | 185 | 366 |
| E13 | 4 | 10 | 22 | 54 | 98 | 190 | 374 |
| E14 | 4 | 10 | 22 | 45 | 92 | 183 | 364 |
| E15 | 4 | 10 | 22 | 46 | 91 | 184 | 365 |
| E16 | 4 | 10 | 22 | 46 | 92 | 184 | 368 |
| E17 | 4 | 10 | 22 | 46 | 93 | 187 | 369 |
| E18 | 4 | 10 | 22 | 46 | 93 | 186 | 368 |
| E19 | 4 | 10 | 22 | 46 | 92 | 185 | 368 |
| E20 | 4 | 10 | 22 | 46 | 93 | 186 | 368 |
| E21 | 4 | 10 | 22 | 46 | 93 | 186 | 371 |
| E22 | 4 | 10 | 22 | 45 | 92 | 186 | 369 |
| E23 | 4 | 10 | 22 | 45 | 92 | 184 | 365 |
| E24 | 4 | 10 | 23 | 46 | 93 | 185 | 368 |
| E25 | 4 | 10 | 23 | 47 | 96 | 191 | 378 |
| E26 | 4 | 10 | 22 | 46 | 93 | 185 | 371 |
| E27 | 4 | 10 | 22 | 44 | 90 | 180 | 359 |
| E28 | 4 | 10 | 21 | 45 | 90 | 180 | 357 |
| E29 | 4 | 10 | 21 | 44 | 89 | 179 | 359 |
| E30 | 4 | 10 | 21 | 44 | 90 | 179 | 356 |
| E31 | 4 | 10 | 21 | 44 | 89 | 180 | 354 |
| E32 | 4 | 10 | 21 | 43 | 89 | 178 | 354 |
| E33 | 4 | 10 | 21 | 43 | 86 | 172 | 346 |
| E34 | 2 | 6 | 14 | 29 | 59 | 119 | 237 |
| E35 | 2 | 4 | 10 | 22 | 44 | 87 | 169 |
| E36 | 2 | 5 | 12 | 25 | 51 | 102 | 202 |
| E37 | 1 | 4 | 9 | 20 | 41 | 82 | 163 |
| E38 | 1 | 4 | 9 | 19 | 39 | 78 | 153 |
| E39 | 1 | 3 | 8 | 17 | 34 | 70 | 139 |
| E40 | 0 | 0 | 1 | 2 | 3 | 5 | 9 |
| E41 | 0 | 0 | 0 | 0 | 1 | 2 | 3 |
| E42 | 0 | 0 | 0 | 0 | 1 | 2 | 4 |
| E43 | 0 | 0 | 0 | 0 | 0 | 1 | 2 |
| E44 | 0 | 0 | 0 | 0 | 0 | 1 | 2 |
| E45 | 0 | 0 | 0 | 0 | 0 | 0 | 1 |
| E46 | 0 | 0 | 0 | 0 | 0 | 0 | 0 |
| E47 | 0 | 0 | 0 | 0 | 0 | 0 | 0 |
| E48 | 0 | 0 | 0 | 0 | 0 | 0 | 0 |

The experimental results revealed an increase in the measured voltage in a directly proportional manner with time.

Combined Tuning Experiments

Figure 36:
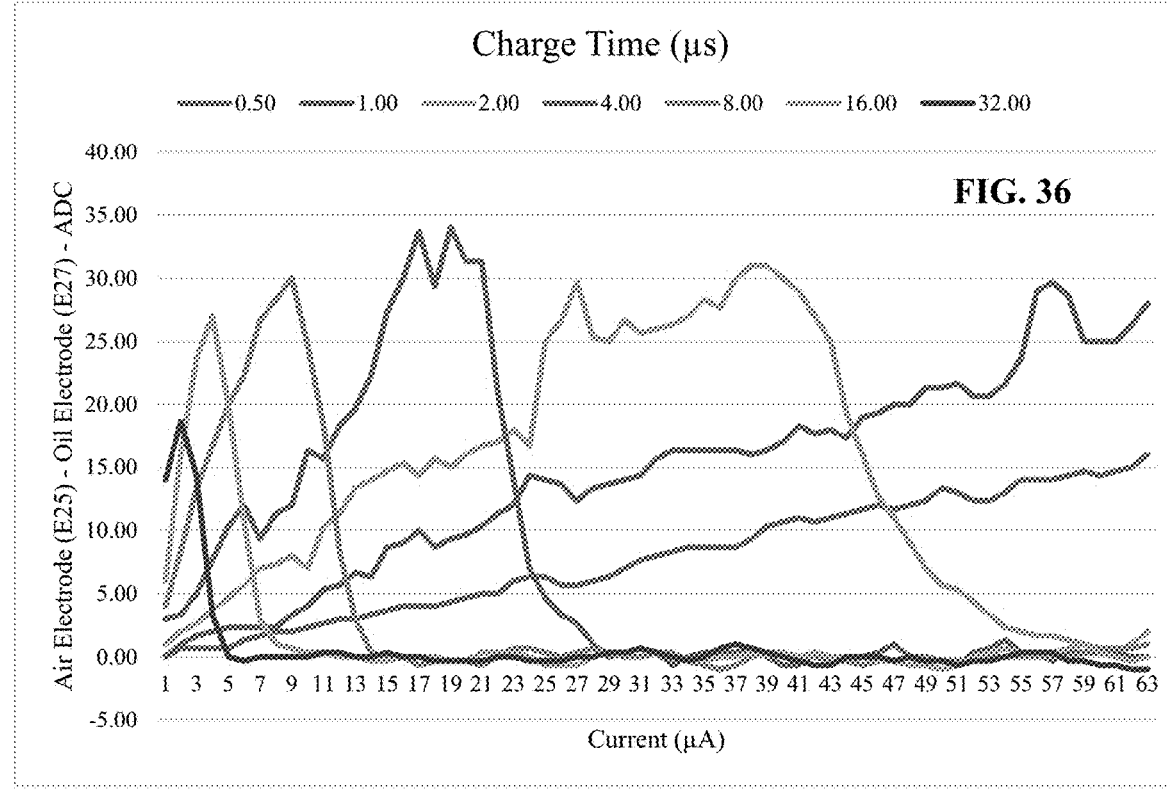
FIG. 36 is a graph Combined Tuning Graph (delta vs time and current).

Based on the results of current and time tuning experiments, and to select the best combination of current and time in terms of sensitivity, two electrodes were selected as references from air and oil mediums. The absolute difference between the voltages measured by each of the two electrodes (E25-E27) was used as the sensitivity factor to be monitored while testing all possible combinations. The difference between the two electrodes (delta) is calculated for all possible combinations and shown in Table 41 and the corresponding graph is shown in FIG. 36.

TABLE 41

Combined tuning-Numerical results

| Current (μA) | Time (μsec) | | | | | | |
|---|---|---|---|---|---|---|---|
| | 0.5 | 1 | 2 | 4 | 8 | 16 | 32 |
| 1 | 0.00 | 0.00 | 1.00 | 3.00 | 4.00 | 6.00 | 14.00 |
| 2 | 0.67 | 1.00 | 2.00 | 3.33 | 8.33 | 16.00 | 18.67 |
| 3 | 0.67 | 1.67 | 2.67 | 5.00 | 13.33 | 23.67 | 14.33 |
| 4 | 0.67 | 2.00 | 3.67 | 7.67 | 16.67 | 27.00 | 3.33 |
| 5 | 0.67 | 2.33 | 4.67 | 10.33 | 20.00 | 20.00 | 0.00 |
| 6 | 1.33 | 2.33 | 5.67 | 12.00 | 22.33 | 10.67 | −0.33 |
| 7 | 1.67 | 2.33 | 7.00 | 9.33 | 26.67 | 3.00 | 0.00 |
| 8 | 2.00 | 2.33 | 7.33 | 11.33 | 28.33 | 1.00 | 0.00 |
| 9 | 2.00 | 3.33 | 8.00 | 12.00 | 30.00 | 0.67 | 0.00 |
| 10 | 2.33 | 4.00 | 7.00 | 16.33 | 24.67 | 0.33 | 0.00 |
| 11 | 2.67 | 5.33 | 10.33 | 15.67 | 18.33 | 0.33 | 0.33 |
| 12 | 3.00 | 5.67 | 11.33 | 18.33 | 8.33 | 0.00 | 0.33 |
| 13 | 3.00 | 6.67 | 13.33 | 19.67 | 3.00 | 0.00 | 0.00 |
| 14 | 3.33 | 6.33 | 14.00 | 22.33 | 0.33 | −0.33 | 0.00 |
| 15 | 3.67 | 8.67 | 14.67 | 27.33 | 0.00 | −0.33 | 0.33 |
| 16 | 4.00 | 9.00 | 15.33 | 30.00 | 0.00 | 0.00 | 0.00 |
| 17 | 4.00 | 10.00 | 14.33 | 33.67 | −0.67 | 0.00 | 0.00 |
| 18 | 4.00 | 8.67 | 15.67 | 29.33 | −0.33 | 0.00 | −0.33 |
| 19 | 4.33 | 9.33 | 15.00 | 34.00 | −0.33 | −0.33 | −0.33 |
| 20 | 4.67 | 9.67 | 16.00 | 31.33 | −0.33 | −0.33 | −0.33 |
| 21 | 5.00 | 10.33 | 16.67 | 31.33 | −0.67 | 0.33 | −0.33 |
| 22 | 5.00 | 11.33 | 17.00 | 21.00 | 0.00 | 0.33 | 0.00 |
| 23 | 6.00 | 12.00 | 18.00 | 14.00 | 0.67 | 0.33 | 0.00 |
| 24 | 6.33 | 14.33 | 16.67 | 7.00 | 0.67 | 0.00 | −0.33 |
| 25 | 6.33 | 14.00 | 25.00 | 4.67 | 0.33 | −0.67 | −0.33 |
| 26 | 5.67 | 13.67 | 26.67 | 3.33 | 0.00 | −0.67 | −0.33 |
| 27 | 5.67 | 12.33 | 29.67 | 2.67 | 0.33 | −0.67 | 0.00 |
| 28 | 6.00 | 13.33 | 25.33 | 1.00 | 0.67 | 0.00 | 0.00 |
| 29 | 6.33 | 13.67 | 25.00 | 0.00 | 0.33 | 0.33 | 0.33 |
| 30 | 7.00 | 14.00 | 26.67 | 0.33 | 0.00 | 0.33 | 0.33 |
| 31 | 7.67 | 14.33 | 25.67 | 0.67 | 0.00 | 0.67 | 0.67 |
| 32 | 8.00 | 15.67 | 26.00 | 0.33 | 0.33 | 0.33 | 0.33 |

TABLE 41-continued

Combined tuning-Numerical results

| Current | Time (μsec) | | | | | | |
|---|---|---|---|---|---|---|---|
| (μA) | 0.5 | 1 | 2 | 4 | 8 | 16 | 32 |
| 33 | 8.33 | 16.33 | 26.33 | −0.67 | 0.33 | 0.00 | 0.00 |
| 34 | 8.67 | 16.33 | 27.00 | 0.00 | −0.33 | −0.33 | −0.33 |
| 35 | 8.67 | 16.33 | 28.33 | 0.33 | −0.67 | −0.33 | 0.00 |
| 36 | 8.67 | 16.33 | 27.67 | 0.33 | −1.00 | 0.00 | 0.67 |
| 37 | 8.67 | 16.33 | 30.00 | 0.33 | −0.67 | 0.00 | 1.00 |
| 38 | 9.33 | 16.00 | 31.00 | 0.67 | 0.00 | 0.33 | 0.67 |
| 39 | 10.33 | 16.33 | 31.00 | 0.00 | 0.33 | 0.00 | 0.33 |
| 40 | 10.67 | 17.00 | 30.00 | −0.67 | 0.33 | 0.33 | 0.00 |
| 41 | 11.00 | 18.33 | 29.00 | −0.67 | 0.00 | 0.00 | −0.33 |
| 42 | 10.67 | 17.67 | 27.00 | 0.33 | 0.00 | 0.33 | −0.67 |
| 43 | 11.00 | 18.00 | 25.00 | 0.00 | −0.33 | 0.00 | −0.67 |
| 44 | 11.33 | 17.33 | 19.33 | −0.33 | −0.33 | 0.00 | 0.00 |
| 45 | 11.67 | 19.00 | 16.00 | 0.00 | −0.67 | 0.00 | 0.00 |
| 46 | 12.00 | 19.33 | 12.67 | 0.33 | −0.33 | −0.33 | 0.00 |
| 47 | 11.67 | 20.00 | 11.00 | 1.00 | −0.33 | −0.33 | −0.33 |
| 48 | 12.00 | 20.00 | 9.00 | 0.00 | 0.00 | −0.67 | 0.00 |
| 49 | 12.33 | 21.33 | 7.00 | −0.67 | 0.00 | −0.67 | −0.33 |
| 50 | 13.33 | 21.33 | 5.67 | −1.00 | −0.33 | −1.00 | −0.33 |
| 51 | 13.00 | 21.67 | 5.33 | −0.67 | −0.33 | −0.67 | −0.67 |
| 52 | 12.33 | 20.67 | 4.33 | 0.33 | −0.33 | 0.00 | −0.33 |
| 53 | 12.33 | 20.67 | 3.33 | 0.67 | 0.00 | 0.33 | −0.33 |
| 54 | 13.00 | 21.67 | 2.33 | 1.33 | 0.00 | 0.67 | 0.00 |
| 55 | 14.00 | 23.67 | 2.00 | 0.33 | 0.00 | 0.33 | 0.33 |
| 56 | 14.00 | 29.00 | 1.67 | 0.33 | 0.00 | 0.33 | 0.33 |
| 57 | 14.00 | 29.67 | 1.67 | −0.33 | 0.00 | 0.33 | 0.33 |
| 58 | 14.33 | 28.67 | 1.33 | 0.33 | 0.00 | 0.67 | −0.33 |
| 59 | 14.67 | 25.00 | 1.00 | 0.33 | 0.33 | 1.00 | −0.33 |
| 60 | 14.33 | 25.00 | 0.67 | 0.33 | 0.67 | 0.33 | −0.67 |
| 61 | 14.67 | 25.00 | 0.33 | 0.33 | 0.67 | 0.00 | −0.67 |
| 62 | 15.00 | 26.33 | 1.00 | 0.00 | 0.67 | −0.33 | −1.00 |
| 63 | 16.00 | 28.00 | 2.00 | 0.00 | 1.00 | 0.00 | −1.00 |

Based on the experimental results for the tuning, the combination of 2 μsec charge duration time and 32 μA of charge current amount was selected since it admitted the maximum difference factor between oil and air while attaining an acceptable power consumption and relatively high sampling rate before reaching the saturation level.

Ohmsett Testing

Extensive testing as Ohmsett was carried out. The testing included: 1—Capacitive sensor indoor testing in a tank (Static, vertical and horizontal motion); 2—Capacitive sensor outdoor testing in the large tank (dragged by the bridge with no waves, mounted on the skimmer free floating and dragged with and without waves).

The properties of the oil-types used in the experiments as provided by Ohmsett, are shown in Table 43.

TABLE 43

Pre-Test Lab Analysis (Ohmsett)
Pre-Test Lab Analysis (T664)

| Test Oil | S.G. @20 C. | Viscosity @20 C. | I.F.T. | S.T. | BS & W | Date |
|---|---|---|---|---|---|---|
| Diesel | 0.842 g/mL | 8 cP | 13.8 dynes/cm | 30.1 dynes/cm | 0% | Nov. 1, 2017 |
| Hydrocal 300 (New) | 0.909 g/mL | 220 cP | 22.6 dynes/cm | 33.5 dynes/cm | 0.8% | Nov. 1, 2017 |
| Hoops (Weathered) | 0.896 g/mL | 55 cP | 15.8 dynes/cm | 33.3 dynes/cm | 1.4% | Nov. 1, 2017 |
| Calsol 8240 | 0.931 g/mL | 2653 cP | 31.0 dynes/cm | 36.4 dynes/cm | 0.2% | Nov. 1, 2017 |
| Hoops (fresh) | 0.865 g/ml | 28 cP | 16.9 dynes/cm | 31.5 dynes/cm | 0% | Nov. 1, 2017 |

| Description | S.G. @20 C. | Salinity | I.F.T. | S.T. | Average Temperature | Date |
|---|---|---|---|---|---|---|
| Test Basin Water | 1.019 g/ml | 28.3 ppt | 35.9 dynes/cm | 65.4 dynes/cm | See tests | Dec. 4, 2017 |

This example presents the detailed results of all the experiments with the analysis.

Dipping Tests (sensor #1—Capacitive Sensor)

Figure 37:
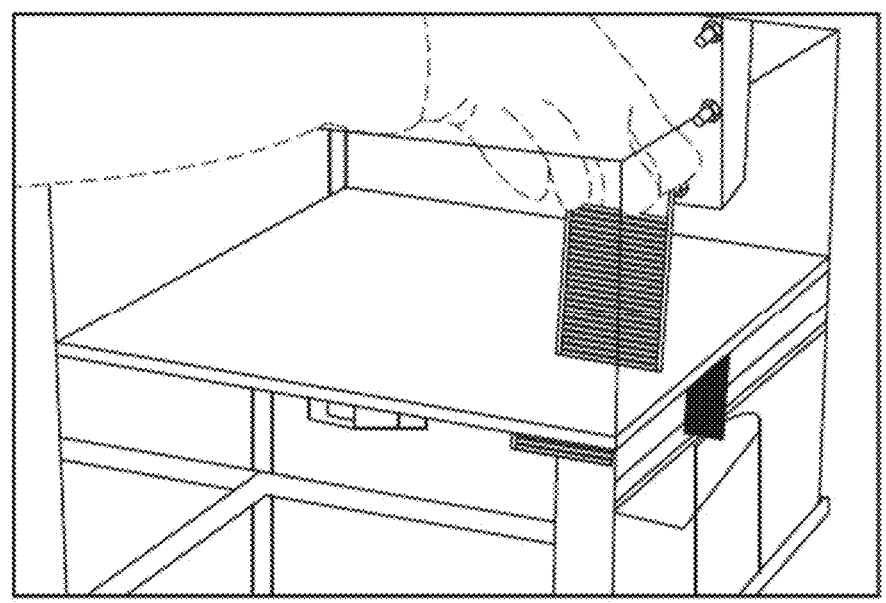
FIG. 37 is a photograph of the Experimental setup for dipping tests (Ohmsett).

Dipping tests were designed to guarantee a relatively accurate slick thicknesses of different values, in which the sensor could be tested using four different test oils. These tests were performed in the Ohmsett high-bay area using small clear glass tanks (12.875"×12.875") with clear sides, where known oil thicknesses were created on approximately 6 inches (152.4 mm) of saltwater. Starting with the oil with the lowest viscosity, thicknesses were increased, as per a test matrix, by dispensing the appropriate volume using graduated cylinders. The oils were dispensed in order of increasing viscosity. The sensor was deployed manually for each condition by the onsite AUB engineers and was displaced in a regular pattern upon entry into the test slick. The sensor was first held steady to obtain an initial static case reading, followed by a dynamic case for a duration of about one minute of reciprocating vertical motion, and then followed by about one minute of lateral motion in the direction parallel to the oil slick. The experimental setup used in performing the dipping tests (static and dynamic cases) is shown in FIG. 37.

This process was repeated in a relatively consistent manner for each test condition while data was recorded by AUB engineers via wireless communication to a nearby laptop. The series of tests included four oil types: diesel, Hoops Crude oil (weathered), Hydrocal 300 and Calsol 8240. Starting with the thinnest slick, each oil was dispensed to create eight different slick thicknesses ranging from 0.125 to 3 inches (3.175 to 76.2 mm). The sensor was removed from the tank when oil was being added but the sensor was not cleaned or modified in any way between tests. The tank was completely emptied and cleaned between the tests using different oil types.

Ohmsett Observations/Notes: A miniscus effect above and below the oil slick was observed along the tank wall perimeter potentially skewing thickness. When dispensing more viscous oils (Hydrocal 300 and Calsol 8240) residual oil remained on the graduated cylinder walls. As a result, the residual had a cumulative effect on the total volume dispensed and may have skewed the thicknesses to less than targeted.

The method used to perform the dipping tests is summarized by the following points: Prepare slick(s) in small tank (over salt water); Manually place sensor into slick at random height without visual or other alignment to the oil slick, and then obtain readings; and Remove sensor, increase thickness—repeat.

Figure 38:
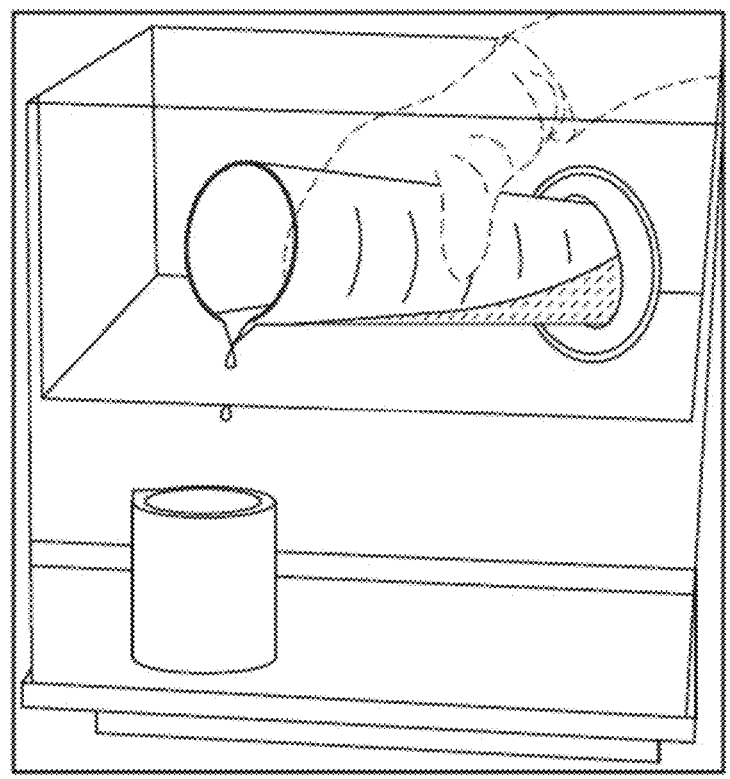
FIG. 38 is a photograph of Adding controlled amount of oil—Graduated Cylinders.

For all of the dipping tests performed, the volume amounts added (FIG. 38) to obtain the required thicknesses are summarized in Table 44.

TABLE 44

Dipping tests - Target thicknesses and Volumes

| Target Thickness (mm) | Total Volume (ml) | Volume to Add (ml) |
|---|---|---|
| 1 | 339.6 | 339.6 |
| 2 | 679.2 | 339.6 |
| 3 | 1,358.4 | 679.2 |
| 4 | 2,037 | 679.2 |
| 5 | 2,716.9 | 679.2 |
| 6 | 4,075.3 | 1,358.4 |
| 7 | 5433.8 | 1,358.4 |
| 8 | 8,150.7 | 2,716.9 |

Dipping Tests (1-8)—Diesel

Tests numbered from 1 to 8 used diesel oil with a thickness ranging from 0.125 inches (3.18 mm) to 3inches (76.20 mm). Water and oil temperature were recorded ranging between 69° F. and 71° F. The experimental results showing the measured thicknesses versus the actual thicknesses are shown in Table 45 for the static case and in Table 46 for the dynamic case. The results were obtained based on the "Highest Point Algorithm" developed for light-oil types (ex. Diesel—Hoops).

TABLE 45

Capacitive Sensor Dipping Tests (1-8) - Diesel/Static

| Test Type | Case | Oil Type |
|---|---|---|
| Dipping | Static | Diesel |

| Test Number | Actual Thickness (mm) | Average Measured Thickness (mm) | Standard Deviation | Sample Site | Average Error (mm) |
|---|---|---|---|---|---|
| 1 | 3.18 | 6 | 0 | 19 | 2.83 |
| 2 | 6.35 | 6.01 | 0.01 | 22 | 0.34 |
| 3 | 12.70 | 13.9 | 1.71 | 30 | 1.2 |
| 4 | 19.05 | 19.88 | 1.65 | 28 | 0.83 |
| 5 | 25.40 | 25.66 | 1.9 | 27 | 0.26 |
| 6 | 38.10 | 36.24 | 2.41 | 20 | 1.86 |
| 7 | 50.80 | 49.95 | 0.88 | 18 | 0.85 |
| 8 | 76.20 | 70.41 | 7.82 | 21 | 5.79 |
| | | | | AVG | 1.745 |

TABLE 46

Capacitive Sensor Dipping Tests (1-8) - Diesel/Dynamic

| Test Type | Case | Oil Type |
|---|---|---|
| Dipping | Dynamic | Diesel |

| Test Number | Actual Thickness (mm) | Average Measured Thickness (mm) | Standard Deviation | Sample Site | Average Error (mm) |
|---|---|---|---|---|---|
| 1 | 3.18 | 10.88 | 6.98 | 35 | 7,7 |
| 2 | 6.35 | 6.01 | 0.01 | 22 | 0.34 |
| 3 | 12.70 | 13.35 | 0.97 | 29 | 0.65 |
| 4 | 19.05 | 18.66 | 1.5 | 27 | 0.39 |
| 5 | 25.40 | 25.61 | 1.8 | 22 | 0.21 |
| 6 | 38.10 | 29.63 | 5.72 | 29 | 8.47 |
| 7 | 50.80 | 36.88 | 11.78 | 32 | 13.92 |
| 8 | 76.20 | 76.85 | 1.38 | 24 | 0.65 |
| | | | | AVG | 4.04 |

Figure 39:
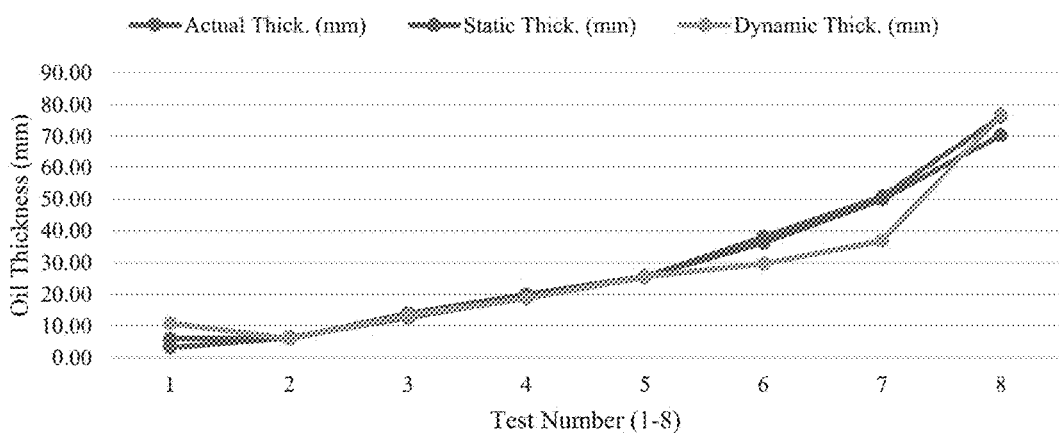
FIG. 39 is a graph of the Dipping Tests (1-8)/Diesel (Static & Dynamic Curves).

As shown in FIG. 39 and Table 45, the absolute error of the measured thicknesses in the static case didn't exceed the resolution of the sensor (3 mm) in all the performed tests (1-8) except in the last test (8) where the average measured thickness is around 70.41 mm and the actual was estimated as 76.2 mm. It is important to note here that in this case, the absolute error (5.79 mm) didn't exceed the error caused by misclassification of two strips (6 mm) out of forty-eight strips contained in the sensor PCB. Also, it is important to note that ⅝ static tests showed an extremely high accuracy with an average absolute error less than 1 mm.

In the dynamic case, it is noted that as shown in Table 46 and FIG. 39, ⅝ of the dynamic tests showed an extremely high accuracy, with an average absolute error less than 1mm. However, as expected, and because of the increased dynamic motion of the sensor (vertical and horizontal movement), the number of misclassified strips increased in some cases causing an increase in the absolute error in comparison to the static case.

Based on the experimental results, it can be concluded that despite the fact that the sensor passed most of the static and dynamic tests with an acceptable accuracy, the misclassification of few number of electrodes in the dynamic tests was leading to a sudden increase in the absolute error because of the relatively high width of the sensor electrodes (3 mm) and due to some remaining fouling effect. To solve this problem, it is recommended to decrease the electrodes width to increase the sensor resolution and to lower the impact of misclassified electrodes on the measured thickness.

Dipping Tests (9-16)—Hoops (weathered)

Figure 40:
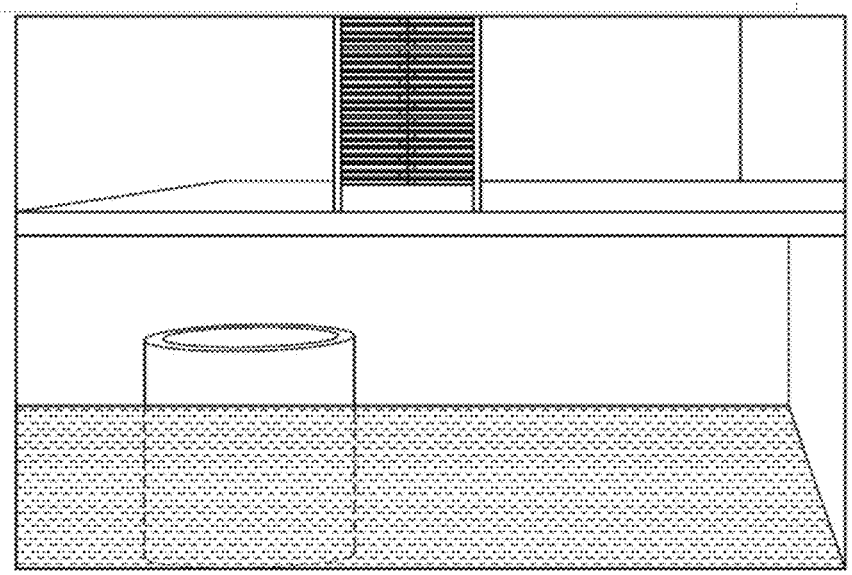
FIG. 40 is a photograph of Coating of the sensor body under slick—Hoops (weathered).
Figure 41:
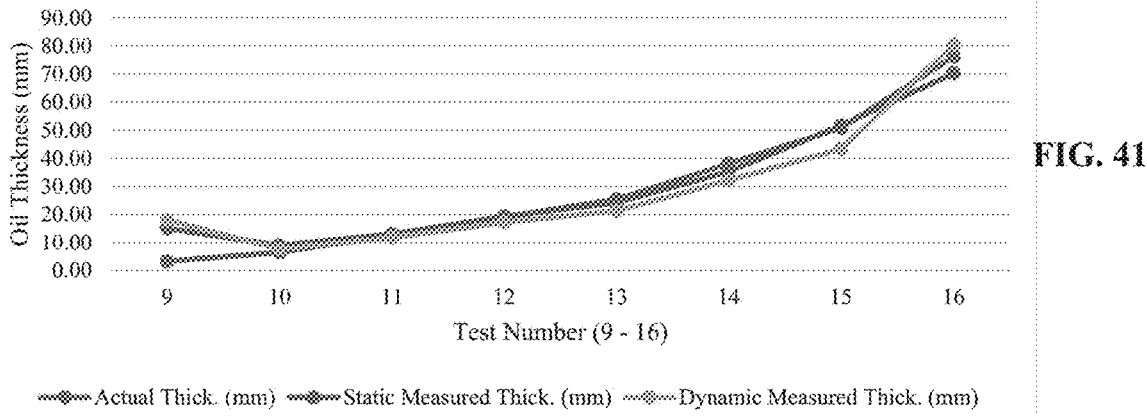
FIG. 41 is a graph showing the Dipping Tests (9-16)/Hoops (weathered) (Static & Dynamic Curves).

Tests numbered from 9 to 16 used Hoops (weathered) Oil with a thickness ranging from 0.125 inches (3.18 mm) to 3 inches (76.20 mm). Water and oil temperature were recorded around 70° F. (69° F.-71.5° F.). Some comments recorded during performing these tests are: Observed oil coating on sensor below slick (FIG. 40); and Observed meniscus effect on oil containers (skew actual thickness).

The experimental results showing the measured thicknesses vs. the actual thicknesses are shown in Table 47 for the static case and in Table 48 for the dynamic case. The results were obtained based on the "Highest Point Algorithm" developed for light-oil types (ex. Diesel—Hoops).

TABLE 47

Capacitive Sensor Dipping Tests (9-16) - Hoops (weathered)/Static

| Test Type | Case | Oil Type |
|---|---|---|
| Dipping | Static | Hoops (weathered) |

| Test Number | Actual Thickness (mm) | Average Measured Thickness (mm) | Standard Deviation | Sample Site | Average Error (mm) |
|---|---|---|---|---|---|
| 9 | 3.175 | 15.05 | 14.72 | 32 | 11.88 |
| 10 | 6.350 | 8.92 | 3.25 | 19 | 2.57 |
| 11 | 12.700 | 12.99 | 1.03 | 21 | 0.29 |
| 12 | 19.050 | 19.26 | 0.78 | 22 | 0.21 |
| 13 | 25.400 | 24.26 | 2.92 | 18 | 1.14 |
| 14 | 38.100 | 35.27 | 4.65 | 22 | 2.83 |
| 15 | 50.800 | 51.66 | 2.52 | 24 | 0.86 |
| 16 | 76.200 | 70.28 | 7.79 | 26 | 5.92 |
| | | | | AVG | 3.21 |

TABLE 48

Capacitive Sensor Dipping Tests (9-16) -Hoops (weathered)/Dynamic

| Test Type | Case | Oil Type | | |
|---|---|---|---|---|
| Dipping | Dynamic | Hoops (weathered) | | |

| Test Number | Actual Thickness (mm) | Average Measured Thickness (mm) | Standard Deviation | Sample Site | Average Error (mm) |
|---|---|---|---|---|---|
| 9 | 3.175 | 18.06 | 4.81 | 26 | 14.88 |
| 10 | 6.350 | 7.61 | 1.07 | 26 | 1.26 |
| 11 | 12.700 | 11.74 | 1 | 22 | 0.96 |
| 12 | 19.050 | 17.24 | 2.22 | 28 | 1.81 |
| 13 | 25.400 | 21.3 | 2.93 | 23 | 4.1 |
| 14 | 38.100 | 32.14 | 2.86 | 24 | 5.96 |
| 15 | 50.800 | 43.32 | 5.78 | 26 | 7.48 |
| 16 | 76.200 | 80.43 | 6.98 | 24 | 4.23 |
| | | | | | 5.08 |

For the static tests, as shown in Table 47, three tests (11, 12, and 15) showed an extremely high accuracy with an absolute error less than 1 mm. The remaining tests showed an acceptable accuracy with an error around one to two electrodes out of forty-eight total electrodes producing an absolute error ranging from around 1 to 5 mm. It is noted that the larger error occurred at the first test (Test No. 9) where the actual thickness is around 3.18 mm. To interpret the cause of the error, we plot the set of measurements acquired while performing the first test (Test No. 9) with respect to time (FIG. 42).

Figure 42:
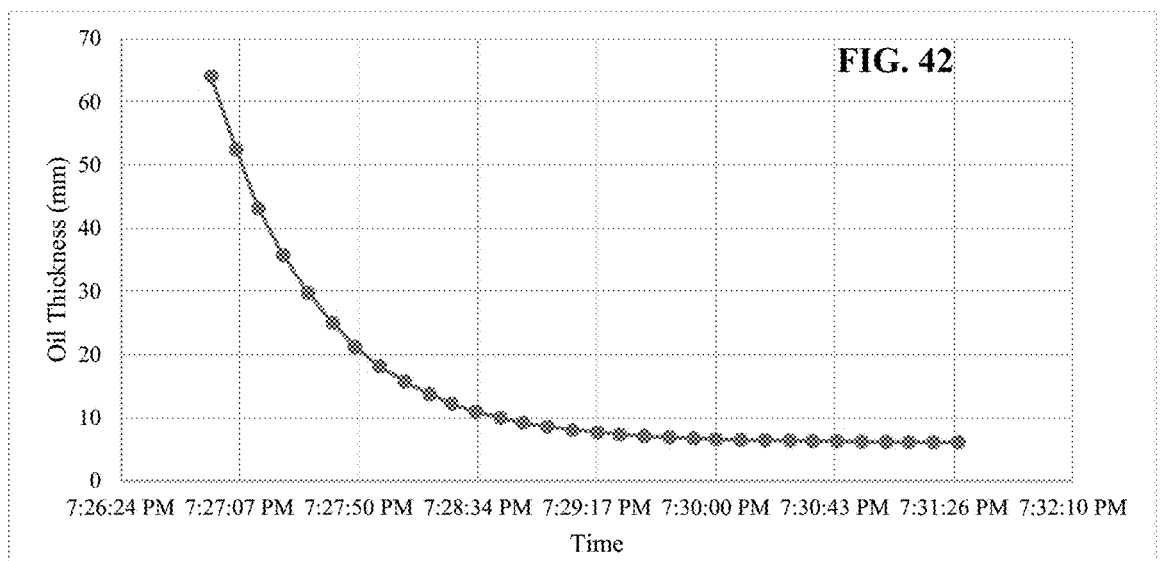
FIG. 42 is a graph showing the Test 9 (Static)—Hoops (weathered) (3.175 mm).

The curve plot shown in FIG. 42 describes the reason for having a relatively large thickness measurement average (15.05 mm) while the actual thickness is around 3.175 mm. As the sensor is immersed in the liquid for the first time, most of the electrodes are covered with a layer of oil due to the fouling process. Because of the fouling effect, initial readings of the sensor were relatively large (63 mm-52 mm-43 mm). Also, the use of a relatively-slow moving average rate contributes to decreasing the change of the sensor measurements. However, it is obvious that the sensor reaches a steady state at around (7:28:35 PM) where all of the remaining measurements are less than 10 mm and become almost stable at 6 mm. It is worth noting that in static cases the fouling of stripes that have went through oil and into water can be detrimental since the sensor is not moving to "wash" it off In a normal operational case the user could be instructed to move the sensor around to reduce this effect; however, in all our tests this was not done in order not to bias the results. It also important to note that based on the sensor resolution which is around 3 mm (single electrode width (2 mm)+vertical gap (1 mm)), this result is considered acceptable. This problem may be addressed by increasing the sensor resolution and speeding up the measurement change rate in addition to coating the sensor.

For the dynamic case, as shown in Table 48, and FIG. 39, the error slightly increased due to sensor movement and fouling. However, with an absolute error equal to less than one electrode (3 mm) in three tests (10, 11, and 12) and less than two electrodes (6 mm) in another three tests (13, 14, and 16), the result is considered acceptable. It is noted that the larger error occurred at the first test (19), and that during performing these test, significant fouling of the sensor below the slick was recorded. Regarding the first test where the sensor is completely immersed for the first time through the thin oil layer, the fouling effect was very high. Also, as reported by the testers, the actual thickness is slightly skewed by the effect of meniscus effect noted on oil containers.

While most results were extremely satisfying, it was observed that the effect of fouling was maximized while dealing with thin oil layers (test 9). Accordingly, mitigating the fouling issue will be considered in this measurement device. This can be done by several approaches related to hardware design and algorithm improvements. For example, the anti-fouling mechanical structure, including horizontal pins may be further developed by enhancing the pins manufacturing, adding high-frequency vibrators, and testing hydrophobic chemical coatings.

Dipping Tests (18-25)—Hydrocal 300

Tests numbered from 18 to 25 used Hydrocal 300 oil with a thickness ranging from 0.125 inches (3.18 mm) to 3 inches (76.20 mm). Water and oil temperature were recorded around 70° F. (69° F. -71° F.). A note was reported while performing the first test (Test No. 18) describing that it was difficult to uniformly cover the surface area with oil at this thickness (0.125 inches). Measurement results are obtained by the "Corrected Lowest Point Algorithm" used for heavy oils. The experimental results showing the measured thicknesses vs. the actual thicknesses are shown in Table 47 for the static case and in Table 48 for the dynamic case.

TABLE 49

Capacitive Sensor Dipping Tests (17-25) - Hydrocal 300/Static

| Test Type | Case | Oil Type | | |
|---|---|---|---|---|
| Dipping | Static | Hydrocal 300 | | |

| Test Number | Actual Thickness (mm) | Average Measured Thickness (mm) | Standard Deviation | Sample Site | Average Error (mm) |
|---|---|---|---|---|---|
| 17, 18 | 3.175 | 12.09 | 4..09 | 21 | 8.91 |
| 19 | 6.350 | 6.76 | 0.67 | 19 | 0.41 |
| 20 | 12.700 | 13.35 | 1.53 | 16 | 0.65 |
| 21 | 19.050 | 18.97 | 1.94 | 19 | 0.08 |
| 22 | 25.400 | 27.78 | 1.9 | 21 | 2.38 |
| 23 | 38.100 | 36.43 | 2.57 | 19 | 1.67 |
| 24 | 50.800 | 47.48 | 4..39 | 22 | 3.32 |
| 25 | 76.200 | 72.36 | 3.51 | 24 | 3.84 |
| | | | | AVG | 2.65 |

TABLE 50

Capacitive Sensor Dipping Tests (17-25) - Hydrocal 300/Dynamic

| Test Type | Case | Oil Type | | |
|---|---|---|---|---|
| Dipping | Dynamic | Hydrocal 300 | | |

| Test Number | Actual Thickness (mm) | Average Measured Thickness (mm) | Standard Deviation | Sample Site | Average Error (mm) |
|---|---|---|---|---|---|
| 17, 18 | 3.175 | 5.97 | 2.31 | 26 | 2.8 |
| 19 | 6.350 | 12.01 | 5.3 | 27 | 5.66 |
| 20 | 12.700 | 9.13 | 4.41 | 22 | 3.57 |
| 21 | 19.050 | 15.3 | 3.44 | 19 | 3.75 |
| 22 | 25.400 | 29.67 | 4,43 | 19 | 4.27 |
| 23 | 38.100 | 36.85 | 3.56 | 24 | 1.25 |
| 24 | 50. 800 | 52.03 | 3.15 | 25 | 1.23 |
| 25 | 76.200 | 80.08 | 1.87 | 24 | 3.88 |
| | | | | AVG | 3.30 |

Figure 43:
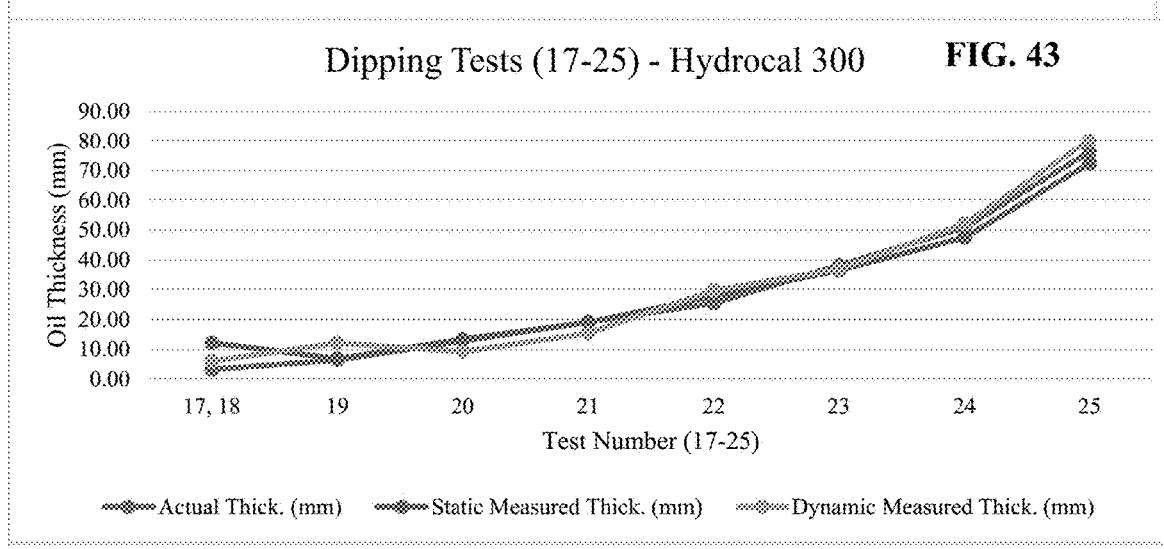
FIG. 43 is a graph showing the Dipping Tests (17-25)/Hydrocal (Static & Dynamic Curves).

The results of the Hydrocal 300 static experiments shown in Table 49, showed an acceptable accuracy, since all of the tests except for the first one had an absolute error of less than or around 3 mm, representing a misclassification of a single electrode. As described before, in this case also, the first test with the smallest oil thickness had the largest error. In the dynamic tests, the "Corrected Lowest Point Algorithm" was proven to produce good results since, as shown in Table 50, all of the dynamic tests showed an average absolute error ranging from around 1mm to a maximum of 5.4 mm, representing the misclassification of fewer than two electrodes out of forty-eight. The measurement results of the static and dynamic tests with respect to the actual thicknesses are shown in FIG. 43.

Dipping Tests (26-33)—Calsol 8240

Tests numbered from 18 to 25 used Calsol 8240 oil with a thickness ranging from 0.125 inches (3.18 mm) to 3 inches (76.20 mm). Water and oil temperature were recorded ranging between 69° F. and 70.5° F. Measurements are obtained by the "Corrected Lowest-Point Algorithm" used for heavy oils.

TABLE 51

Capacitive Sensor Dipping Tests (26-33) - Calsol 8240/Static

| Test Type | Case | Oil Type | | | |
|---|---|---|---|---|---|
| Dipping | Static | Calsol 8240 | | | |
| Test Number | Actual Thickness (mm) | Average Measured Thickness (mm) | Standard Deviation | Sample Site | Average Error (mm) |
| 26 | 3.175 | 8.998 | 4.415 | 35 | 5.823 |
| 27 | 6.350 | 10.022 | 0.878 | 26 | 3.672 |
| 28 | 12.700 | 10.637 | 3.277 | 20 | 2.063 |
| 29 | 19.050 | 26.582 | 2.419 | 28 | 7.532 |
| 30 | 25.400 | 30.8 | 0.767 | 23 | 5.4 |
| 31 | 38.100 | 37.143 | 2.014 | 18 | 0.956 |
| 32 | 50.800 | 47.728 | 4.633 | 19 | 3.072 |
| 33 | 76.200 | 73.015 | 4.447 | 21 | 3.185 |
| | | | | | 3.96 |

TABLE 52

Capacitive Sensor Dipping Tests (26-33) - Calsol 8240/Dynamic

| Test Type | Case | Oil Type | | | |
|---|---|---|---|---|---|
| Dipping | Dynamic | Calsol 8240 | | | |
| Test Number | Actual Thickness (mm) | Average Measured Thickness (mm) | Standard Deviation | Sample Site | Average Error (mm) |
| 26 | 3.175 | 9.886 | 3.542 | 26 | 6.711 |
| 27 | 6.350 | 8.882 | 3.204 | 26 | 2.532 |
| 28 | 12.700 | 19.946 | 4.349 | 30 | 7.246 |
| 29 | 19.050 | 26.018 | 2.429 | 26 | 6.968 |
| 30 | 25.400 | 30.658 | 2.516 | 25 | 5.258 |
| 31 | 38.100 | 45.322 | 3.675 | 30 | 7.222 |
| 32 | 50.800 | 55.234 | 1.755 | 23 | 4.434 |
| 33 | 76.200 | 78.29 | 2.374 | 23 | 2.09 |
| | | | | | 5.30 |

Figure 44:
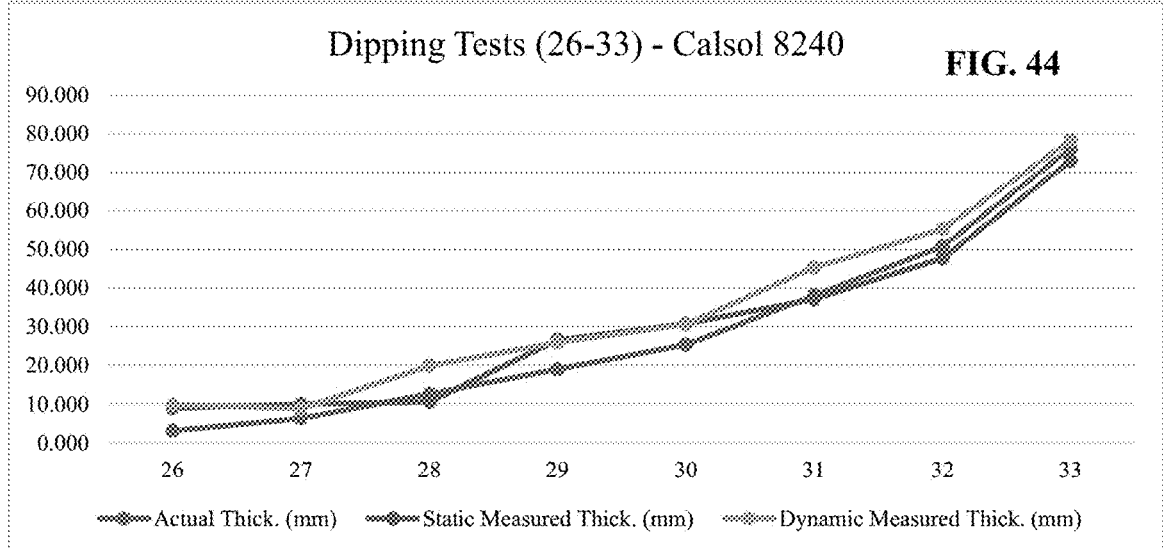
FIG. 44 is a graph showing the Dipping Tests (26-33)/Calsol (Static & Dynamic Curves).

Experimental results of testing Calsol 8240 oil in static and dynamic cases showed high accuracy against different thicknesses. For instance, the results of the static case tests shown in Table 51, showed an absolute error ranging from 0.956 mm (test 31) to 5.823 mm (test 26). Note that the maximum absolute error in this experiment did not exceed the misclassification of more than two electrodes out of forty-eight. For the dynamic case, despite that the error has slightly increased due to fouling and random sensor movement, the absolute error was also varying in a range between around 2 mm to around 7 mm, representing one or two misclassified electrodes only. As discussed before, increasing the sensor resolution by making the electrodes thinner and decreasing the vertical gap between them contributes to decreasing the effect of misclassification. To describe the behavior of all tested cases, FIG. 44 shows the measured thicknesses in the static case and the dynamic case with respect to the actual thicknesses.

Outdoor Bridge Mounted Tests (Capacitive Sensor)

Figure 45:
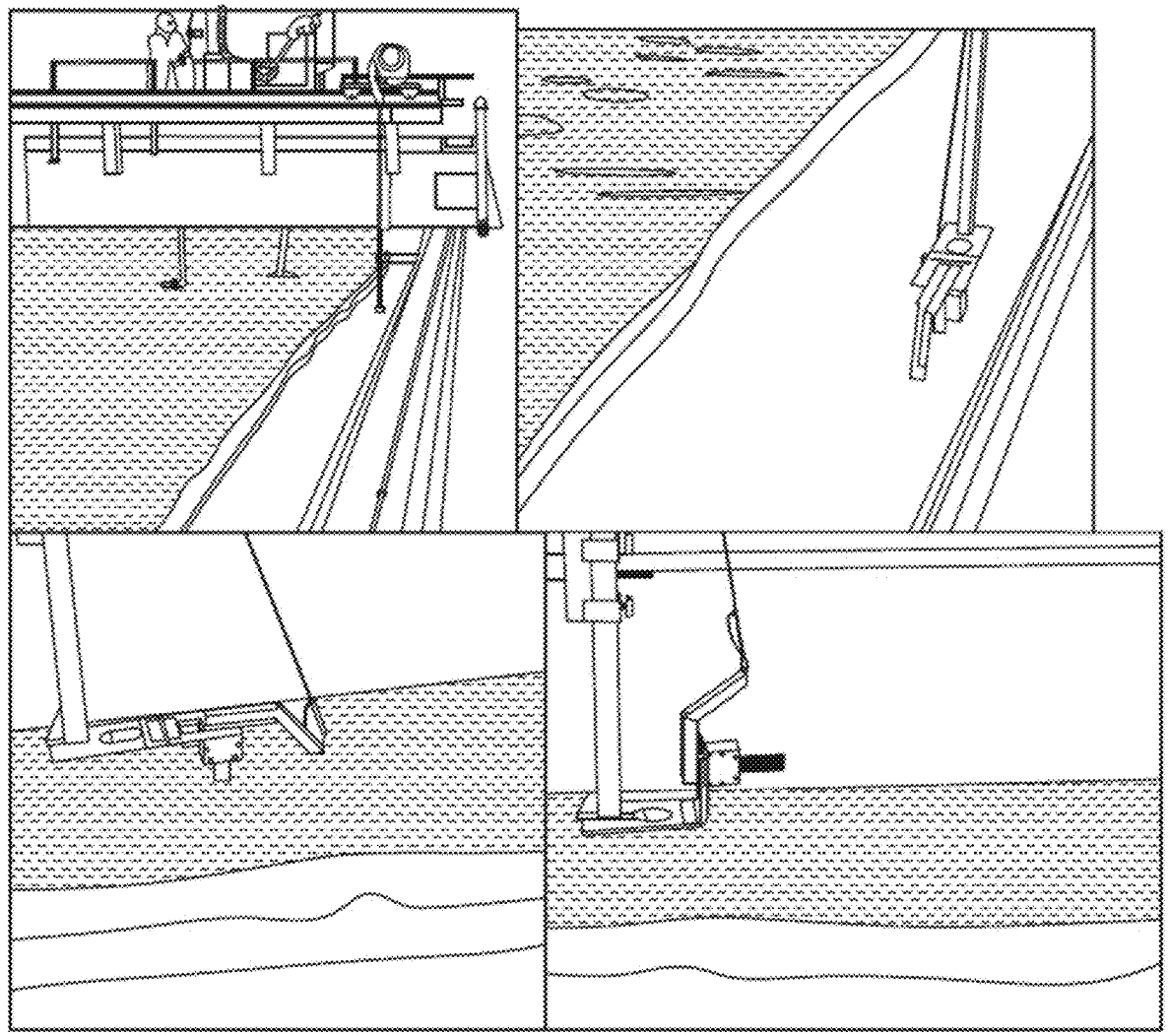
FIG. 45 is a photograph showing the Capacitive Sensor—Bridge-mounted Experimental setup.

This test was designed to obtain sensor data while advancing in surface slicks at a range of speeds that are typical when deployed onto spill response equipment or in fast water currents. The test setup was accomplished by preparing a channel along the test basin west wall, using boom attach brackets, end panels and a section of foam filled 24-inch boom (FIG. 45). The final channel dimensions were 34 inches wide by 58 ft-6 inches long. This nominal area was used to contain varying slick thicknesses as defined by a test matrix. The slick parameters for this series included thicknesses of 0.25. 0.5, 1.0 and 2.0 inches using test oils Hydrocal 300 (tests 34 to 61). Test oils were dispensed from totes positioned along the west deck and the volumes determined using physical depth soundings converted to gallons using the manufacturer conversion table. The sensor was attached to the fabricated mount (AUB) which provided the ability to manually rotate the sensor from the deployed position to a raised (above channel barrier elevation) position using a hinge and pull rope. This was monitored during tests by a technician and implemented if needed as a safety to avoid possible collision of the sensor into the barrier. The AUB mount and sensor was attached to an Ohmsett provided mount affixing the sensor to the main bridge providing for vertical adjustment. FIG. 45 shows the sensor mounting setup with the sensor raised, boom attached bracket and channel end panel.

Multiple passes were performed and sensor data collected while traveling both in the north and south directions at 0.5 and 1.0knots. Passes at 2.0knots and above were performed in the south direction only. A total of 28 Ohmsett data files were recorded when testing in Hydrocal 300 oil.

Figure 46:
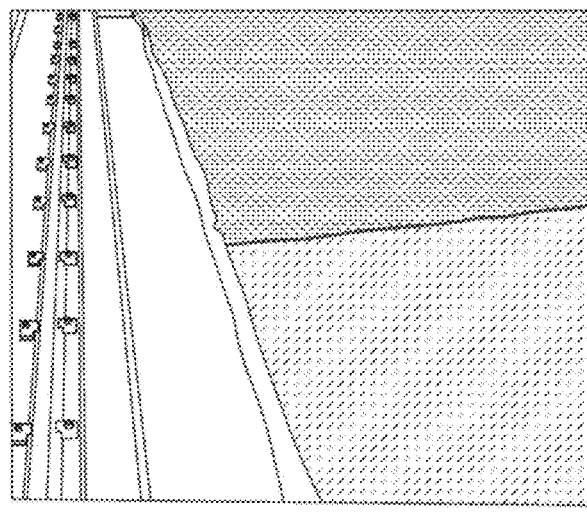
FIG. 46 is a photograph showing the Contained oil in the channel—Wind Effect.

Ohmsett Observations/Notes:

Wind effects apparently caused the contained slick to stack more towards the downward direction of the wind. When present, the wind was typically from the south direction FIG. 46.

The target slick thickness was skewed to a lesser thickness especially with 2-inch slicks due to the boom bellying outward, and thereby increasing the surface area. While advancing, leading edge of sensor appeared to create a bow wave possibly diverting oil away from the sensor contacts.

Dynamic Tests (34, 60)—Hydrocal 300

Hydrocal 300 dynamic tests were performed using four slick thicknesses, and four advance speeds. The test area is 34"×58.5' channel along test basin west wall. The method used in performing the dynamic tests is as follows:

Prepare defined slick thickness; with the sensor in oil-travel north at test speed, record measurements, stop; reverse direction, record measurements.

Raise sensor to exit test area, lower sensor into clear basin water, record measurements travel at test speed 30 feet, reverse direction, stop near test area, raise sensor to move into test area, repeat north and south passes and clear water passes 3X.

Figure 47:
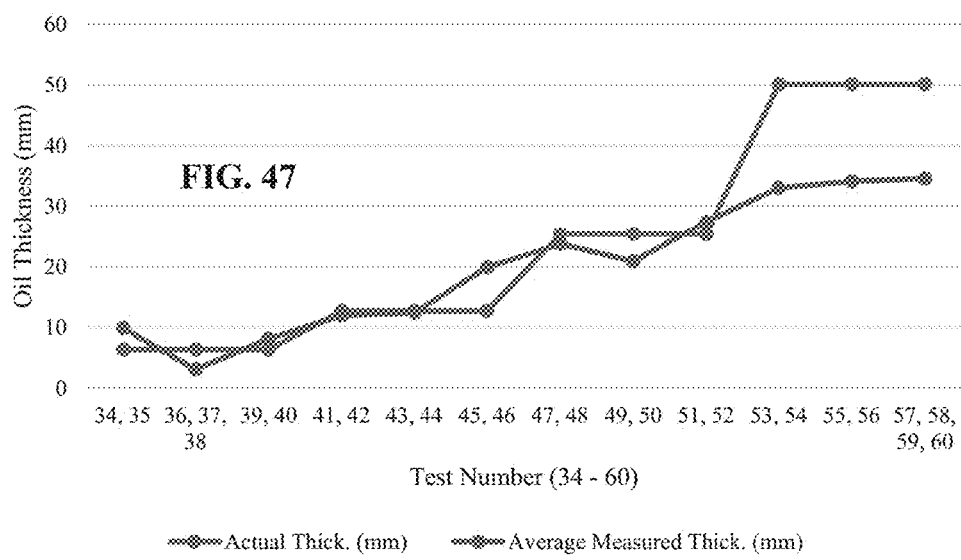
FIG. 47 is a graph showing the Dynamic Tests (34-35)—Hydrocal.

The ambient weather conditions recorded while performing these tests are shown in Table 52. The results of dynamic experiments are provided in Table 53. Measurements are obtained by the "Corrected Lowest-Point Algorithm" used for heavy oils. For each of the tests, the average of and the standard deviation of the recorded measured thicknesses is provided. FIG. 47 shows the plot of the average measured thickness with in comparison to actual (estimated) thicknesses.

TABLE 52

Ambient weather conditions - Tests (34-60)

| Test No. | Avg. Water Temp (° F.) | Avg. Wind Speed (mph) | Avg. Wind Direction (°) | Avg. Air Temp (° F.) |
|---|---|---|---|---|
| 34 | 48.63 | 10.26 | 103.36 | 50.95 |
| 35 | 48.78 | 10.49 | 102.33 | 51.16 |

TABLE 52-continued

Ambient weather conditions - Tests (34-60)

| Test No. | Avg. Water Temp (° F.) | Avg. Wind Speed (mph) | Avg. Wind Direction (°) | Avg. Air Temp (° F.) |
|---|---|---|---|---|
| 36 | 48.78 | 9.06 | 114.82 | 51.33 |
| 37 | 49.01 | 9.75 | 111.18 | 51.66 |
| 38 | 49.43 | 7.73 | 124.19 | 51.83 |
| 39 | 50.04 | 4.99 | 125.33 | 51.87 |
| 40 | 49.31 | 9.34 | 134.23 | 52.22 |
| 41 | 51.73 | 9.82 | 130.30 | 54.07 |
| 42 | 51.62 | 8.25 | 139.10 | 53.59 |
| 43 | 51.75 | 9.54 | 126.78 | 54.04 |
| 44 | 51.91 | 9.52 | 137.80 | 54.08 |
| 45 | 53.02 | 11.08 | 137.82 | 53.38 |
| 46 | 52.39 | 6.82 | 142.19 | 53.21 |
| 47 | 48.64 | 10.49 | 142.08 | 52.50 |
| 48 | 49.34 | 10.56 | 148.80 | 52.38 |
| 49 | 49.67 | 7.51 | 149.14 | 52.49 |
| 50 | 50.11 | 10.29 | 136.40 | 53.29 |
| 51 | 52.96 | 9.52 | 136.51 | 53.32 |
| 52 | 52.45 | 7.08 | 158.12 | 53.75 |
| 53 | 54.14 | 7.49 | 153.49 | 53.31 |
| 54 | 54.98 | 9.45 | 150.56 | 53.85 |
| 55 | 53.82 | 11.03 | 157.32 | 53.89 |
| 56 | 52.48 | 8.50 | 161.18 | 53.78 |
| 57 | 52.42 | 5.23 | 143.68 | 53.92 |
| 58 | 53.07 | 7.23 | 129.60 | 54.16 |
| 59 | 53.00 | 6.52 | 144.20 | 54.17 |
| 60 | 52.70 | 7.07 | 123.18 | 54.13 |

TABLE 53

Capacitive Sensor Dynamic Tests (34-60) - Hydrocal 300

| Test Number | Bridge/Sensor Speed (knots) | Actual Thick. (mm) | Average Measured Thick. (mm) | Standard Deviation | Sample Size | Average Error (mm) | Notes |
|---|---|---|---|---|---|---|---|
| 34, 35 | 0.50 | 6.35 | 9.88 | 2.45 | 86 | 3.527 | Preload: 26 gal, wind effects - slick think at south end |
| 36, 37, 38 | 1.00 | 6.35 | 3.10 | 0.15 | 32 | 3.253 | |
| 39, 40 | 2.00 | 6.35 | 8.10 | 3.60 | 27 | 1.749 | |
| 41, 42 | 0.50 | 12.70 | 11.97 | 4.26 | 38 | 0.727 | Preload: 52 gal |
| 43, 44 | 1.00 | 12.70 | 12.39 | 5.98 | 50 | 0.313 | |
| 45, 46 | 2.00 | 12.70 | 19.89 | 6.75 | 43 | 7.189 | |
| 47, 48 | 0.50 | 25.40 | 23.72 | 5.19 | 44 | 1.685 | Preload: 104 gal |
| 49, 50 | 1.00 | 25.40 | 20.86 | 4.90 | 29 | 4.537 | |
| 51, 52 | 2.00 | 25.40 | 27.43 | 3.48 | 42 | 2.029 | |
| 53, 54 | 0.50 | 50.08 | 33.06 | 4.71 | 24 | 17.020 | Preload: 208 gal - Thickness Measured 1.5 inch (38.1 mm) |
| 55, 56 | 1.00 | 50.08 | 34.10 | 2.83 | 29 | 15.984 | Thickness Measured 1.5 inch (38.1 mm) |
| 57, 58, 59, 60 | 2.00 | 50.08 | 34.60 | 2.61 | 22 | 15.482 | Thickness Measured 1.5 inch (38.1 mm) |

As shown in Table 53, and in FIG. 47, the average absolute error in all tests performed while dragging in different speeds ranging from a thickness of about 6.35 to about 25.04 mm ranges between 0.313 mm to 7.1 mm in the worst case. However, most of these tests showed an impressive accuracy of absolute error less than 6 mm, representing the misclassification of fewer than two electrodes out of forty-eight electrodes. Based on the different testing scenarios including different speeds and dragging conditions, this result is considered acceptable. It is obvious that for the last three tests numbered from 53 to 60 where the actual estimated thickness was recorded as 50.08 mm, the largest absolute error occurred. However, it is important to note that for this case, and based on the notes provided by Ohmsett, the target slick thickness was skewed to a lesser thickness, especially with 2-inch slicks, due to the boom bellying outward increasing the surface area. Also, Ohmsett staff noted that in this case, the actual thickness was measured by manual visual tools as 1.5 inches (38.1 mm). Based on this fact, and by taking the 38.1 mm as the actual thickness, we note that the actual absolute error in these tests was in the range of 4 to 5 mm since the measured thicknesses ranged from 33.06 to 34.60 mm.

Skimmer Mounted Tests in Waves (Capacitive Sensor)

The purpose of this test was to collect slick thickness data when mounted to a typical skimmer while experiencing wave conditions and traveling slowly into and against the waves. The test setup consisted of a boomed area along the test basin west wall measuring 10 ft.×34 ft. The sensor was rigidly mounted to a Desmi Termite skimmer frame and positioned between two of the floats, and in front of the skimming weir. The AUB and Ohmsett team provided mounts for vertical adjustment. Prior to testing the skimmer was placed into the test basin and the sensor adjusted such that the waterline was near the center of the measurement range.

Figure 48:
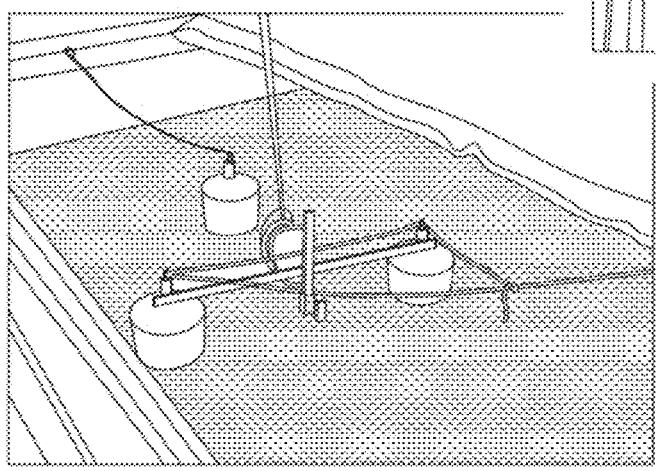
FIG. 48 is a photograph showing the Sensor #1 Mounted to Desmi Termite Skimmer.

FIG. 48 shows the sensor mounted on the skimmer in the test area. The skimmer was tethered with ropes; one rope routed to each of the main and auxiliary bridges. From these locations, technicians manually controlled the skimmer position and slowly towed the skimmer into the waves. As shown, the waves approached the skimmer from the right (south end of test basin). For these series of tests, Hydrocal test oil was provided at two slick thicknesses: 1 and 3 inches. Multiple wave conditions were generated and adjusted during tests to provide wave heights not exceeding the operational range of the sensor. A total of three Ohmsett data files were recorded (tests 90-92) in which surface profile data was captured. Surface profile data, (for wave analysis) was captured using a downward looking distance sensor (named banner west) located on the main bridge. Since the sensor was rigidly mounted to the skimmer, it was subject to the response of the skimmer in waves with respect to pitch, heave, and roll.

Skimmer-mounted Tests numbered from 90, 91, and 93 were performed using Hydrocal 300 oil, two thicknesses, and varied wave conditions. The method used to perform these tests is described as the following:

The Capacitive sensor was mounted to skimmer via bracket provided by the AUB team. Establish initial sensor depth with a skimmer installed in water. Main and auxiliary bridges positioned at opposite ends of the test area. The skimmer will be tethered—a control rope going to each bridge. Obtain stationary readings; begin wave condition, run test for approximately 15 minutes, manually maneuver skimmer in the area as directed. The wave properties used in the three tests are summarized in Table 55. Ambient weather conditions are shown in Table 54.

TABLE 54

Ambient weather conditions - Tests (90-92)

| Test No. | Avg. Water Temp (° F.) | Avg. Wind Speed (mph) | Avg. Wind Direction (°) | Avg. Air Temp (° F.) |
|---|---|---|---|---|
| 90 | 45.87 | 7.53 | 311.70 | 49.20 |
| 91 | 46.92 | 10.12 | 319.09 | 51.64 |
| 92 | 51.23 | 10.34 | 321.88 | 52.83 |

TABLE 55

Skimmer-mounted tests-Wave conditions

| Test | Wave Type | Wave Setting | H ⅓ (in.) | Mean Wave Height (in.) | Avg. Wave Period (s) | Average Wave Length (ft.) |
|---|---|---|---|---|---|---|
| 90 | Sine | 15 cpm, 3" | 3.412 | 2.776 | 4.194 | 61.026 |
|  |  | 25 cpm, 3" | 5.265 | 4.652 | 2.534 | 30.543 |
| 91 | Harbor chop | 45 cpm, 3" | 8.795 | 5.752 | n/a | n/a |
|  |  | 30 cpm, 3" | 4.467 | 3.588 | n/a | n/a |
| 92 |  | 15 cpm, 3" | 3.533 | 2.812 | n/a | n/a |
|  |  | 25 cpm, 3" | 2.683 | 1.896 | n/a | n/a |
|  |  | 25 cpm, 3" | 2.72 | 2.189 | n/a | n/a |
|  |  | 35 cpm, 3" | 5.094 | 3.426 | n/a | n/a |

Skimmer-Mounted Tests—Test No. 90

Description: Skimmer mounted, manual pull-in Wave, Oil Thickness: 1 inch (25.4 mm), Wave Condition: 9:00 am—1ST setting: 15 cpm, 3"; 2nd setting: 25 cpm, 3".

For the first test, three log files were recorded. The average measurement thickness calculated from each wave experiment, in addition to the starting and ending times are provided in Table 56.

TABLE 56

Results for Skimmer-mounted (Capacitive-Test 90)

| Wave No. | Start Time | End Time | Actual Thickness (mm) | Average Measured Thickness (mm) | Standard Deviation | Sample Size | Absolute Error (mm) |
|---|---|---|---|---|---|---|---|
| 1 | 9:00:14 | 9:10:50 | 25.4 | 43.30 | 19.24 | 60 | 17.90 |
| 2 | 9:13:51 | 9:30:57 | 25.4 | 35.58 | 10.91 | 75 | 10.18 |

The result of the sine test 90 shown in Table 56 revealed that the sensor's accuracy was impacted mostly by the start of the wave and then the absolute error of the measurement decreased with time even when the second wave was actuated. This is related to two main factors. First, the fouling effect of heavy oil caused by oil accumulation on the sensor body increases the measured thickness especially at starting phase of the wave, where a sudden transition from calm to wave conditions occurs. The second factor is related to smoothing rate used in the algorithm. Smoothing is controlled by the moving average attributes, and based on the current settings, the implemented moving average rate is relatively slow. Speeding up the change rate may contribute to enhancing the recovery process.

Skimmer-Mounted Tests—Test No. 91

Test No. 91, Harbor chop test. The Wave Condition: 10:00 am—15cpm, 3" (too aggressive, reduced cpm to 30)

TABLE 57

Results for Skimmer-mounted (Capacitive-Test 91)

| ID | Start Time | End Time | Actual Thick. (mm) | Avg. Meas. Thick. (mm) | Stand. Dev. | Sample Size | Absolute Error (mm) | Note |
|---|---|---|---|---|---|---|---|---|
| 1 | 09:58:28 | 10:03:33 | 25.4 | 25.837 | 5.53 | 14 | 0.437 | Calm |
| 2 | 10:11:22 | 10:16:56 | 25.4 | 3 | 0 | 32 | — | Sensor dunk into water (3 mm-invalid measure) |
| 3 | 10:31:22 | 10:43:30 | 38.1 | 34.56 | 12.84 | 69 | 3.54 | |

The results of the test 91 shown in Table 57, showed a very high accuracy at the beginning five minutes in calm conditions with an average absolute error of 0.437 mm. After the wave was created, based on the notes recorded by the Ohmsett staff, the sensor was dunking into the water. During this time, sensor recorded 3 mm for a set of measurements. Actually, the constant 3 mm measures are considered invalid since the sensor is located under the oil layer while dunking. After that, starting from 10:31:22, the sensor was producing valid measures. Based on the average of the valid measures taken in the third case, the average absolute error was also acceptable (3.54 mm). It is important to note here that the dunking problem Skimmer-Mounted Tests—Test No. 92

Test No. 92, Harbor chop test. The Wave Condition: 1) 10:55 am—wave started, 15cpm, 3"; 2) 11:08 am—increased to 25cpm, 3"; 3) 11:18 am—changed to 25cpm, 4.5"; 4) 11:21 am—changed to 35 cpm, 4.5"; 5) 11:25 am—wave stopped

TABLE 58

Results for Skimmer-mounted (Capacitive-Test 92)

| ID | Start Time | End Time | Actual Thick. (mm) | Avg. Meas. Thick. (mm) | Stand. Dev. | Sample Size | Absolute Error (mm) | Wave Condition |
|---|---|---|---|---|---|---|---|---|
| 1 | 10:51:00 | 11:03:16 | 38.10 | 46.16 | 7.58 | 69 | 8.07 | wave started, 15 cpm, 3" |
| 2 | 11:05:39 | 11:14:59 | 38.10 | 46.79 | 5.42 | 53 | 8.69 | increased to 25 cpm, 3" |
| 3 | 11:18:24 | 11:20:55 | 38.10 | 48.33 | 2.11 | 15 | 10.23 | changed to 25 cpm, 4.5" |
| 4 | 11:21:06 | 11:23:58 | 38.10 | 41.91 | 6.46 | 12 | 3.81 | changed to 35 cpm, 4.5" |
| 5 | 11:26:24 | 11:37:21 | 38.10 | 41.22 | 5.39 | 60 | 3.22 | stopped |

The experimental results shown in Table 58 shows that the average absolute error of the measured values in the first two cases were similar (8 mm). However, the error increased to around 10 mm when the amplitude of the wave was increased to 4.5" in the third case. However, in the last two cases, the average error was highly reduced with the stopping of waves. It is important to note here, that despite the fact the sensor accuracy was affected by the presented wave conditions, the absolute average error in terms of the sensor resolution was considered acceptable (10 mm=3 strips). Again, it can be concluded that fouling effect must be further mitigated by future enhancements.

Alternative Design of Electrodes for Sensing Under Fouling Conditions

As mentioned before, the performance of the coplanar sensor may be affected when dealing with highly viscous liquids under dynamic conditions. In such situations, in what is known as fouling, liquid accumulates on the sensor body causing errors in the measured capacitance. In this embodiment, the sensor electrodes can considerably reduce the effect of fouling on sensor measurements. The proposed embodiment comprises a multi-row parallel-plate structure.

The proposed embodiment comprises a set of needle-like pins as a structure that can penetrate the oil-fouling layer and focus the electric field towards the target area along the z-axis. As described in previously, single pins are disposed on the center of the coplanar electrodes of the initial sensor embodiment, solving the oil-fouling problem in water. However, in this embodiment, the coplanar electrodes are completely replaced by an array of pins that work as a parallel-plate capacitor. The first set of pins that are attached to each row, are used for excitation and measurement, and act as the first conductive plate of the capacitor. The second set of pins mounted next to the sensing pins are connected to the electrical ground and act as the second plate of the parallel-plate capacitor. The non-conductive material (i.e., oil) filling the gap between the sensing pins and the grounded pins act as the dielectric. In the case of conductive liquids, such as the sea water, the sensing and grounded pins are shorted out, resulting in a substantial change in the measured voltage.

Figure 49:
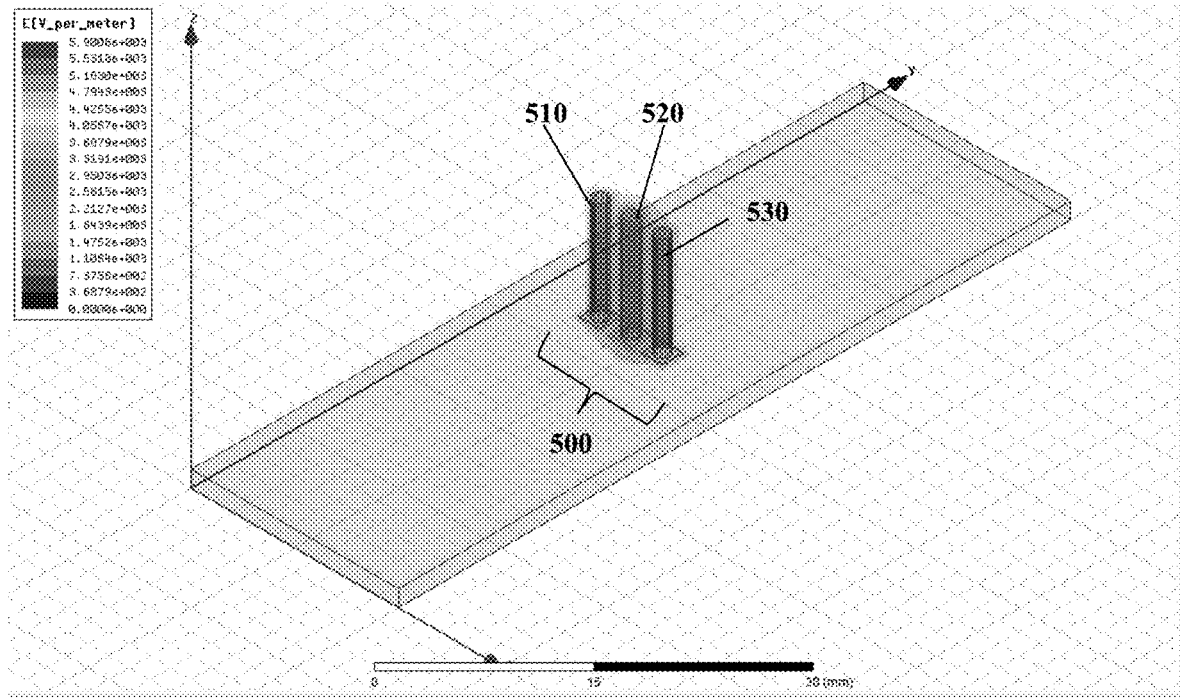
FIG. 49 is a schematic graph of the single sensing cell according to one embodiment based on pins.
Figure 50:
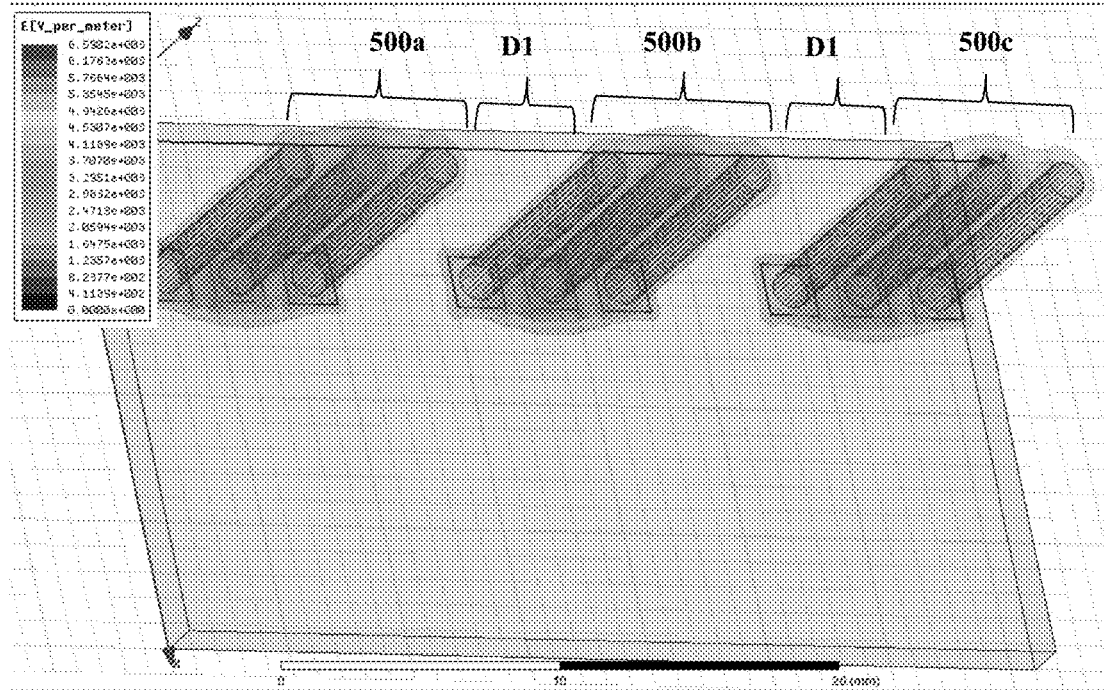
FIG. 50 is a schematic graph of the separated sensing cells according to one embodiment based on pins.
Figure 51:
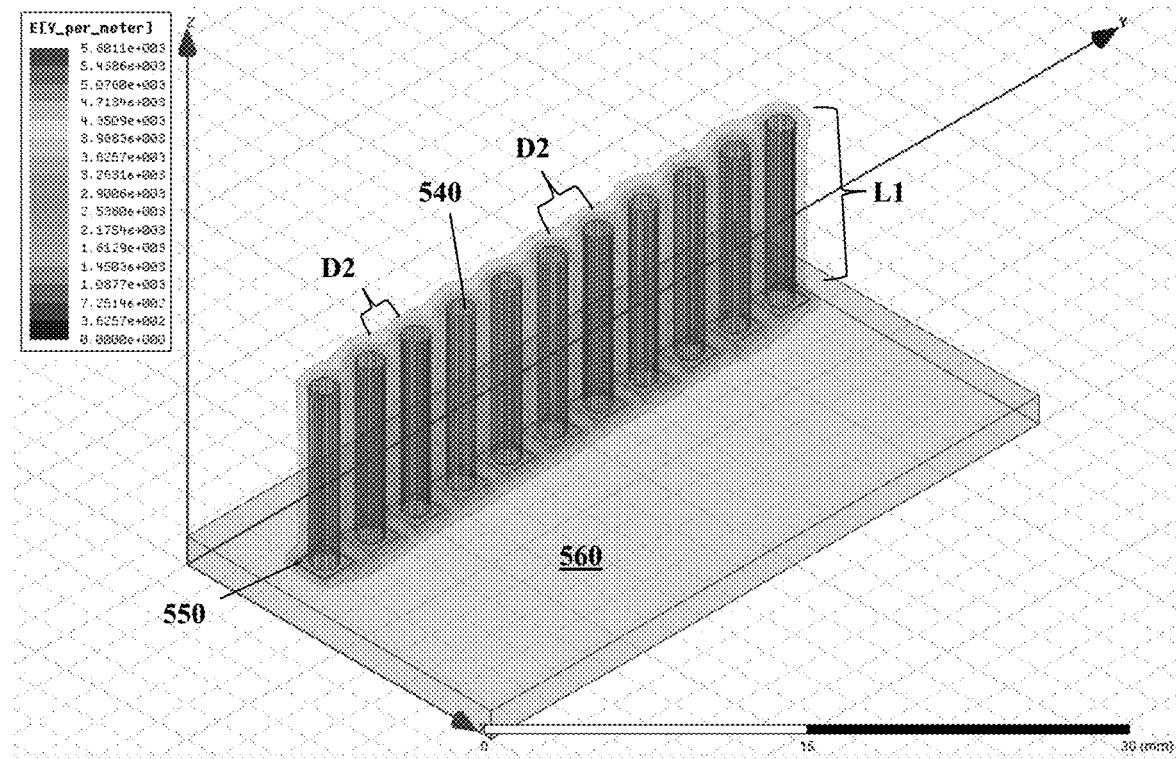
FIG. 51 is a schematic showing Adjacent sensing cells according to one embodiment based on pins.

In one embodiment, the pins are mounted next to each other or in separated cells along the same row. The effectiveness of the embodiment was evaluated in a 3D model and evaluated through a set of finite element simulations, using the Maxwell package included in the ANSYS 19.0 software. In one embodiment, FIG. 49 shows an example of using a single sensing cell 500 composed of three pins 510, 520, 530. The center pin 520 is used for excitation and measurement, and the adjacent pins 510 and 530 are connected to zero-potential for guarding purposes. FIG. 50 shows three separated sensing cells 500*a*, 500*b*, 500*c* distributed along the same row with a separation distance D1 about 5 mm, and FIG. 51 shows an embodiment of using a set of adjacent sensing cells, composed of 11 pins 540 separated equally with a distance D1 of about 2.54 mm. The separation distance D1 depends on the acceptable width of the sensor, based on the application requirements. The separation distance D1 doesn't affect the measurement principle since the cells are almost isolated from each other. However, the separation distance D1 can vary between about 2 mm to about 15 mm. The pins 540 are made of copper and have a length L1 about 10 mm and a radius of about 1 mm. The radius and length of the pins depends on the allowed sensing area. In one high-resolution measurement embodiment, the radius can vary from about 0.5 to about 2 mm as well as the pins are separated from each other with a relatively small distance. The increase in the distance D1 separating the pins leads to weaker signal strength. In this embodiment, length of the pins can vary from about 2 to about 20 mm. The increase of the radius or the length of the pins causes an increase in the base capacitance and requires consideration in the design of the measurement instrumentation. Each pin is connected at its base with a squared-sheet of copper 550 of about 2 mm length and a thickness of about 0.05 mm. The PCB board 560 holding the pins is composed of FR4 epoxy material with a dielectric constant of about 4.4 and a thickness of about 1.6 mm, according to one embodiment. The region of the simulation was filled with air.

In a first simulation, no material was added to the top surface of the PCB, which aims to plot the basic magnitude distribution of the electric field. As shown in FIG. 51, the pins were numbered from 1 to 11 starting from the left side. The excitation of pins 2, 4, 6, 8, and 10 was set to 2V. The excitation of pins 1, 3, 5, 7, 9, and 11 was set to 0V. Based on this distribution, five sensing cells are included in the sensing row, since each sensing pin has two grounded pins on its right and left sides. The simulation result representing the magnitude of the electric field is shown in FIG. 49, FIG. 50, and FIG. 51.

The result of the first simulation showed that an electric field existed in the empty regions between the sensing pins and terminated on the end sides of the sensing row. The electric field termination is due to the effect of guarding imposed by grounded pins. In addition, the electric field was distributed along the body of the pins (along the z-axis), which is highly desired to solve the oil fouling problem.

Figure 52:
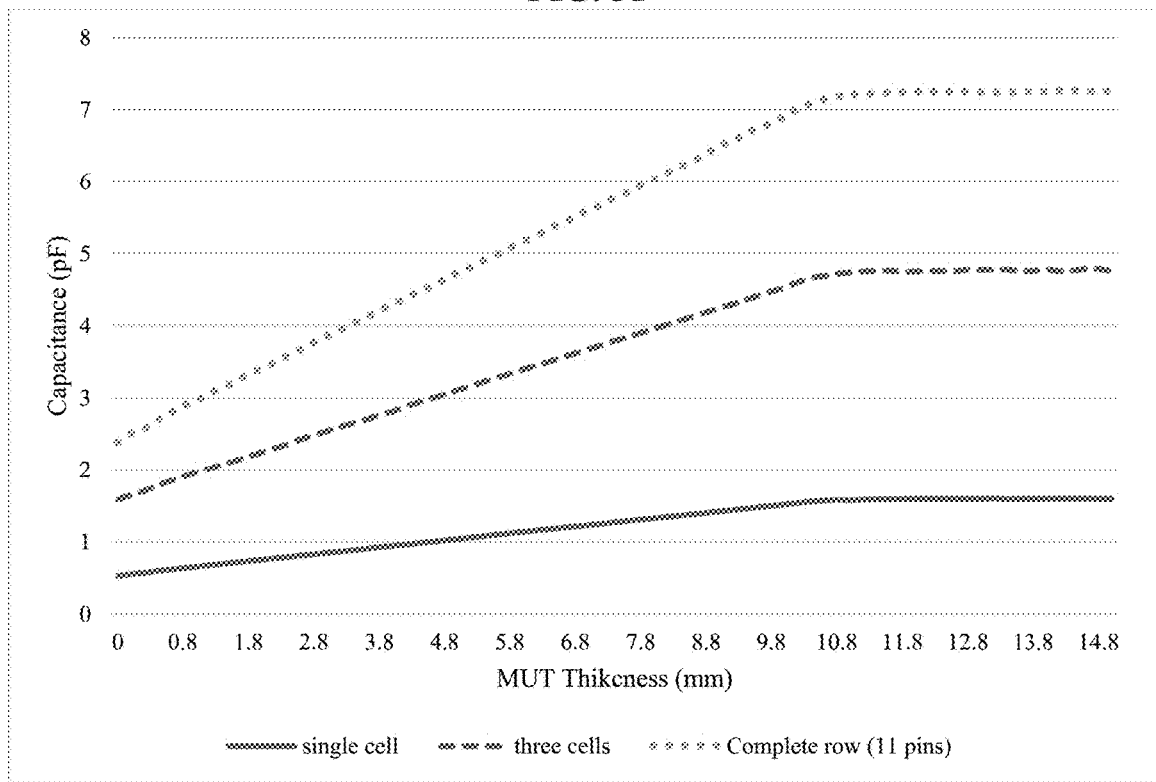
FIG. 52 is a graph showing the measured capacitance (pF) vs. material thickness (mm)—Comparison of results obtained from three pins-based designs (single cell, three cells, and complete row with 11 pins).

The second simulation was a thickness-sweep simulation, which aimed to assess the effect of different material thicknesses on the sensing design embodiment. In this simulation, the material used is made of silicon dioxide with a relative permittivity of about 4. The thickness of the material placed at the top surface of the PCB was changed gradually from about 0 mm to about 15 mm, with increments of about 0.2 mm. The capacitances measured relative to the material thicknesses, in comparison to the results of the thickness-sweep simulation applied to single-cell and three-cells designs are shown in FIG. 52.

The results of the thickness-sweep simulation showed a linear relationship between the measured capacitance and the thickness of the material. In addition, the sensitivity of the sensor increased in the design embodiment, which is deduced from the slopes of the curves shown in FIG. 52.

Figures 53, 54:
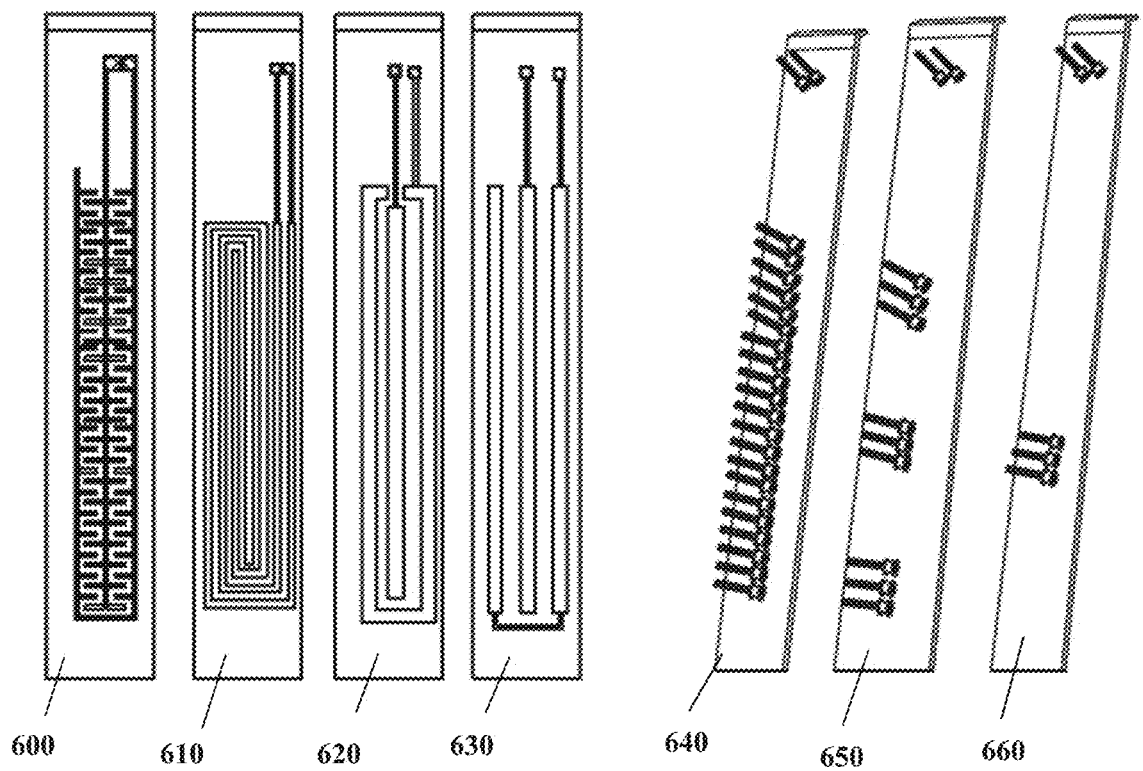
FIG. 53 is a front view of alternative embodiments of the PCB prototypes—Coplanar- and pins-based designs.
FIG. 54: is a graph of the experimental evaluation—Measured capacitance vs. simulation.

Experimental Evaluation of the Pins-Based Designs in Comparison to Coplanar-Based Designs In order to validate the analysis made via simulations, several embodiments were implemented and tested. FIG. 53 shows the implemented PCB embodiments 600-660, including a set of coplanar-based designs (interleaved 600, spiral 610, concentric 620, and parallel 630), and three pins-based designs, 10 cell pin-based embodiment 640, 3 cell pin-based embodiment 650, and one cell pin-based embodiment 660.

The embodiments were tested according to the following criteria. First, to record the base capacitance, a LCR meter instrument (BK Precision 875B) was used to measure the capacitance of the embodiments in air. The measurements were performed indoors with an ambient temperature of around about 25° C. Then, the maximum capacitance was measured for each embodiment 600-660, while being totally immersed in oil. The experiments were performed using a gear lubrication oil (SAE 140). A cylindrical liquid container having a diameter of about 8 cm and a height of about 9 cm was used in the experiments. The capacitance measured in air and oil, as well as the absolute differences (A.D.), are summarized in FIG. 54.

The results of the measurements showed that for all embodiments 600-660, the maximum capacitances (oil) were smaller than the maximum capacitances recorded in simulations. This is because the dielectric constant of the oil ($\approx 2$) is smaller than the dielectric constant of the material used in the simulations (silicon dioxide). The measured base capacitances of the coplanar-based concentric and parallel designs matched the capacitances recorded in simulations. In addition, the two designs encountered an identical capacitance change ($\approx 1pF$) after being immersed in oil. This result shows a good agreement with simulations where the two models showed an almost identical change due to the presence of the material under test.

The measurements demonstrated that the interleaved design provided the largest sensitivity in comparison to other coplanar-based designs. It is important to note that the dynamic range of the interleaved design was twice the dynamic range of the parallel and concentric designs in both simulations and measurements. The spiral design (not used in simulations) showed a similar sensitivity to the interleaved design. However, the interleaved design is preferred because of its smaller area.

For the pins-based designs, the measurements showed that their average base capacitance is smaller than the co-planar designs. For example, the 3 cells pin-based embodiment 650 has a sensitivity greater than that of the coplanar-based parallel and concentric designs, with a smaller base capacitance. In addition, the measurements showed that the sensitivity of the pins-based sensors increased when more cells were added.

The 10 cell pin-based 640 embodiment possessed the maximum sensitivity with an intermediate base capacitance. Therefore, this result demonstrates the effectiveness of the pin-based embodiments in enhancing the ability of the sensor to differentiate between different dielectric materials, and at the same time to mitigate the oil-fouling problem by penetrating the accumulated oil layer on the sensor body.

As used in this application, the terms "component" and "system" are intended to refer to a computer-related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution, & a component can be localized on one computer and/or distributed between two or more computers.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation may also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which may used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Software includes applications and algorithms. Software may be implemented in a smart phone, tablet, or personal computer, in the cloud, on a wearable device, or other computing or processing device. Software may include logs, journals, tables, games, recordings, communications, SMS messages, Web sites, charts, interactive tools, social networks, VOIP (Voice Over Internet Protocol), e-mails, and videos.

In some embodiments, some or all of the functions or process(es) described herein and performed by a computer program that is formed from computer readable program code and that is embodied in a computer readable medium. The phrase "computer readable program code" includes any type of computer code, including source code, object code, executable code, firmware, software, etc. The phrase "computer readable medium" includes any type of medium capable of being accessed by a computer, such as read only memory (ROM), random access memory (RAM), a hard disk drive, a compact disc (CD), a digital video disc (DVD), or any other type of memory.

All publications and patent applications mentioned in this specification are herein incorporated by reference to the same extent as if each individual publication or patent application was specifically and individually indicated to be incorporated by reference.

[1] Texas Advanced Optoelectronic Solutions Inc., "TSL230R-LF, TSL230AR-LF, TSL230BR-LF Programmable Light-to-frequency Converters," TAOS079A, October 2006.

[2] RLX COMPONENTS s.r.o. Electronic Components Distributor, "Light to Frequency Board (MIKROELEKTRONIKA)," [Online]. Available: http://rlx.sk/en/measurement-boards/448-light-to-frequency-board-mikroelektronika.html. [Accessed: February 2017].

[3] Mikroelektronika, "Light to Frequency Additional Board—User Manual," 2017.

[4] Electronics Katranji Trading (EKT), "412 CH GPS SKM53 MODULE," [Online]. Available: http://www.ekt2.com/products/productdetails/412 CH_GP_S_SKM53_MODULE. [Accessed: February 2017].

[5] Electronics Katranji Trading (EKT), "412 Arduino NANO 3.0 328 CH340," [Online]. Available: http://www.ekt2.com/products/productdetails/412_ARDUINO_NANO_3.0_323_CH340. [Accessed: February 2017].

[6] Electronics Katranji Trading (EKT), "412 Arduino WIRELESS TRANSCEIVER 2.4 Ghz," [Online]. Available: http://www.ek2.com/products/productdetails/412_ARDUINO_WIRELESS_TRANSCEIVER_2.4 Ghz. [Accessed: February 2017].

[7] Electronics Katranji Trading (EKT), "8 D37 MALE PCB," [Online]. Available: http ://ekt2.com/products/productdetails/8 D37_MALE_PCB. [Accessed: February 2017].

[8] Electronics Katranji Trading (EKT), "8 D37 FEM PCB," [Online]. Available:
http ://ekt2.com/products/productdetails/8 D37_FEM_PCB. [Accessed: February 2017].

[9] Nano Protech, "Super Electrical Insulation Nano Protech," [Online]. Available: http://www.nanoprotech.mk/home-page/super-electrical-insulation/. [Accessed: February 2017].

[10] Freescale Semiconductor, "Proximity Capacitive Touch Sensor Controller MPR121," Technical Data Sheet, 2013.

[13] "Ultra Ever Dry|Slovenija". Ultraeverdry.si. N.p., 2017. Web. 29 Mar. 2017.

[14] "Ultratech|Ultra-Ever Dry|Ultratech International". Spillcontainment.com. N.p., 2017. Web. 29 Mar. 2017.

[15] Hartigan, J. A. et al. "Algorithm AS 136: A K-Means Clustering Algorithm." Journal of the Royal Statistical Society. Series C (Applied Statistics) 28, no. 1 (1979): 100-08. doi:10.2307/2346830.

F. N. Toth, et al., "A planar capacitive precision gauge for liquid-level and leakage detection," IEEE Trans. Instrum. Meas., vol. 46, no. 2, pp. 644-646, 1997.

S. C. Bera, et al. "A low-cost noncontact capacitance-type level transducer for a conducting liquid," IEEE Trans. Instrum. Meas., vol. 55, no. 3, pp. 778-786, 2006.

B. Kumar, et al., "A Review on Capacitive-Type Sensor for Measurement of Height of Liquid Level," Meas. Control, vol. 47, no. 7, pp. 219-224, 2014.

H. Canbolat, "A novel level measurement technique using three capacitive sensors for liquids," IEEE Trans. Instrum. Meas., vol. 58, no. 10, pp. 3762-3768, 2009.

While the invention has been described in connection with various embodiments, it will be understood that the invention is capable of further modifications. This application is intended to cover any variations, uses or adaptations of the invention following, in general, the principles of the invention, and including such departures from the present disclosure as, within the known and customary practice within the art to which the invention pertains.

What is claimed is:

1. A floating liquid thickness measurement device based on a self-capacitance sensing array, comprising:
    a sensor capable of measuring the thickness of a fluid floating between at least two mediums;
    wherein the sensor is a capacitive array with at least two conductive plates placed adjacent to each other with an empty space there between;
    at least two dielectric materials that include a different dielectric constant are facing the conductive plates;
    by measuring the change in capacitance on each of the conductive plates independently, an air-oil interface and a water-oil interface is identified; and
    the thickness of the floating fluid is calculated based on the identified air-oil interface and the water-oil interface and dimensions of the sensor based on the self-capacitance sensing array and by only a single electrode that acts as both an excitation electrode and a measurement electrode.

2. The measurement device of claim 1, further comprising using the floating liquid thickness measurement device during a skimming operation in an open ocean or as hand-held device.

3. The measurement device of claim 1, further comprising an opportunistic measurement algorithm using the sensor in dynamic environments, with waves, motion/dragging, different types of oils, salt/fresh water, different environmental conditions consisting essentially of lighting, temperature, and humidity.

4. The measurement device of claim 1, wherein the measurement device provides oil thickness estimate by relying on an array of capacitive strips and relies on relative readings of a material rather than absolute readings, thereby making the sensor readings insensitive to types of oils, environmental conditions, and/or manufacturing imperfections.

5. The measurement device of claim 1, wherein the sensor design comprises a thin knife like design as to minimize fouling effects on the measurements and to improve hydrodynamic performance.

6. The measurement device of claim 1, wherein the sensor design comprises an array of pins that penetrates the oil fouling layer and act as parallel-plate capacitors including a first set of sensing pins that are attached to each row and the first set of pins are used for excitation and measurement, and are the first conductive plate of the capacitor; a second set of grounded pins mounted next to the sensing pins are connected to the electrical ground and act as the second plate of the parallel-plate capacitor, wherein the non-conductive material filling the gap between the sensing pins and the grounded pins act as the dielectric.

* * * * *